(12) United States Patent
Otsuka et al.

(10) Patent No.: US 7,113,002 B2
(45) Date of Patent: Sep. 26, 2006

(54) TRANSMISSION CABLE STRUCTURE FOR GHZ FREQUENCY BAND SIGNALS AND CONNECTOR USED FOR TRANSMISSION OF GHZ FREQUENCY BAND SIGNALS

(75) Inventors: Kanji Otsuka, Tokyo (JP); Tamotsu Usami, Tokyo (JP); Chihiro Ueda, Tokyo (JP); Yutaka Akiyama, Tokyo (JP); Osamu Koyasu, Chiba (JP)

(73) Assignee: Fujikura Ltd., Tokyo (JP)

( * ) Notice: Subject to any disclaimer, the term of this patent is extended or adjusted under 35 U.S.C. 154(b) by 117 days.

(21) Appl. No.: 10/845,503

(22) Filed: May 14, 2004

(65) Prior Publication Data
US 2004/0227580 A1    Nov. 18, 2004

(30) Foreign Application Priority Data

May 15, 2003  (JP)  ............................. 2003-137854
Jul. 11, 2003  (JP)  ............................. 2003-196062

(51) Int. Cl.
*H03K 19/175* (2006.01)

(52) U.S. Cl. .................. 326/86; 326/101; 174/74 R; 333/4; 333/5; 333/33

(58) Field of Classification Search .................. 326/30, 326/101; 333/4, 5, 33; 174/74 R
See application file for complete search history.

(56) References Cited

U.S. PATENT DOCUMENTS

| | | | | |
|---|---|---|---|---|
| 6,208,161 B1 * | 3/2001 | Suda | ............................. | 326/30 |
| 6,522,173 B1 * | 2/2003 | Otsuka | ........................ | 326/101 |
| 6,787,694 B1 * | 9/2004 | Vexler et al. | .................. | 174/27 |
| 6,788,113 B1 * | 9/2004 | Watanabe et al. | ............. | 327/66 |
| 6,885,221 B1 * | 4/2005 | Watanabe et al. | ............. | 327/23 |
| 6,886,065 B1 * | 4/2005 | Sides et al. | ................. | 710/305 |

FOREIGN PATENT DOCUMENTS

| | | | |
|---|---|---|---|
| JP | 54-104719 | A | 8/1979 |
| JP | 61-103902 | U | 7/1986 |
| JP | 64-013842 | A | 1/1989 |
| JP | 01-161943 | A | 6/1989 |
| JP | 01-251902 | A | 10/1989 |
| JP | 07-030548 | A | 1/1995 |
| JP | 07-106027 | A | 4/1995 |
| JP | 09-083203 | A | 3/1997 |
| JP | 10-145112 | A | 5/1998 |
| JP | 11-282592 | A | 10/1999 |
| JP | 11-284126 | A | 10/1999 |
| JP | 2000-013452 | A | 1/2000 |
| JP | 2000-048651 | A | 2/2000 |
| JP | 2000-174505 | A | 6/2000 |
| JP | 2001-067947 | A | 3/2001 |

(Continued)

*Primary Examiner*—Vibol Tan
(74) *Attorney, Agent, or Firm*—Sughrue Mion, PLLC

(57) ABSTRACT

A differential signal transmission cable structure for transmitting differential signals having GHz frequency band in the present invention is provided with a differential signal transmission pair cable 30 connecting a driver circuit 23a and a receiver circuit 23b, for transmitting differential signals having GHz frequency band, and a power supply ground transmission pair cable 31 connecting ground and a first power supply 26a connected to the driver circuit and ground and a second power supply 26b connected to the receiver circuit. Further characteristic impedance of the differential signal transmission pair cable is matched to that of the driver circuit and the receiver circuit, thereby enabling TEM waves of differential signals having GHz frequency band transmission mode to be maintained when the differential signals are transmitted.

20 Claims, 49 Drawing Sheets

FOREIGN PATENT DOCUMENTS

| | | |
|---|---|---|
| JP | 2001-068907 A | 3/2001 |
| JP | 2001-211211 A | 9/2001 |
| JP | 2002-026272 A | 1/2002 |
| JP | 2002-175859 A | 6/2002 |
| JP | 2002-261843 A | 9/2002 |
| JP | 2003-078078 A | 3/2003 |
| JP | 2003-188609 A | 7/2003 |
| JP | 2003-224462 A | 8/2003 |
| JP | 2004-012357 A | 1/2004 |

* cited by examiner

FIG.7

| PULSE FREQUENCY [MHz] | SINE WAVE OF HARMONIC WAVE [GHz] | v=1×10⁸[m/s] (1/4)λ CABLE LENGTH [m] | v=1.5×10⁸[m/s] (1/4)λ CABLE LENGTH [m] | v=2×10⁸[m/s] (1/4)λ CABLE LENGTH [m] |
|---|---|---|---|---|
| 5 | 0.05 | 0.5 | 0.75 | 1 |
| 10 | 0.1 | 0.25 | 0.375 | 0.5 |
| 50 | 0.5 | 0.05 | 0.075 | 0.1 |
| 80 | 0.8 | 0.03125 | 0.0375 | 0.0625 |
| 100 | 1 | 0.025 | 0.0375 | 0.05 |
| 300 | 3 | 0.008325 | 0.012485 | 0.01665 |
| 500 | 5 | 0.005 | 0.0075 | 0.01 |
| 1000 (1GHz) | 10 | 0.0025 | 0.00375 | 0.005 |
| 10000 (10GHz) | 100 | 0.00025 | 0.000375 | 0.0005 |
| 100GHz | 1000 | 25 μm | 37.5 μm | 50 μm |

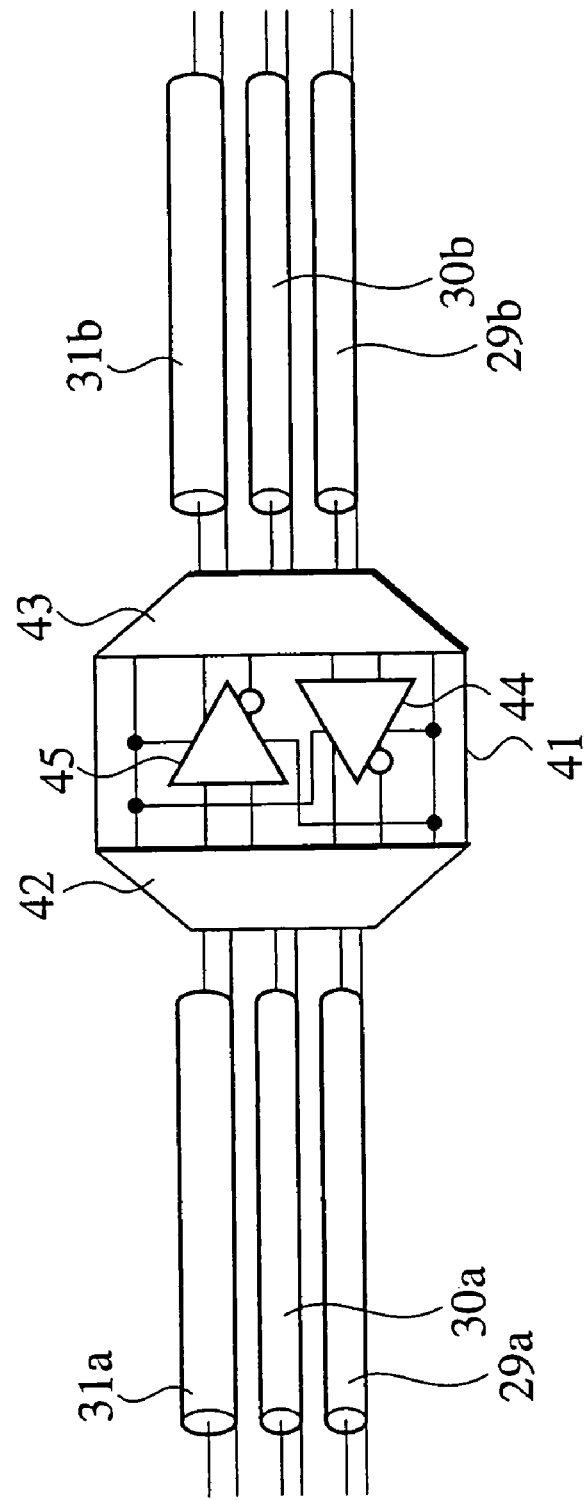

THICKNESS OF OUTER COVERING = 0.3mm

DIAMETER=0.5mm

RELATIVE PERMITTIVITY=2.16

THICKNESS OF OUTER COVERING =0.5mm

A TYPE

B TYPE

C TYPE

D TYPE

E TYPE

A TYPE

DIRECTION OF ELECTRIC FIELD

B TYPE

DIRECTION OF ELECTRIC FIELD

SUBSTANTIAL CROSSTALK

C TYPE

D TYPE

E TYPE

FIG.25A
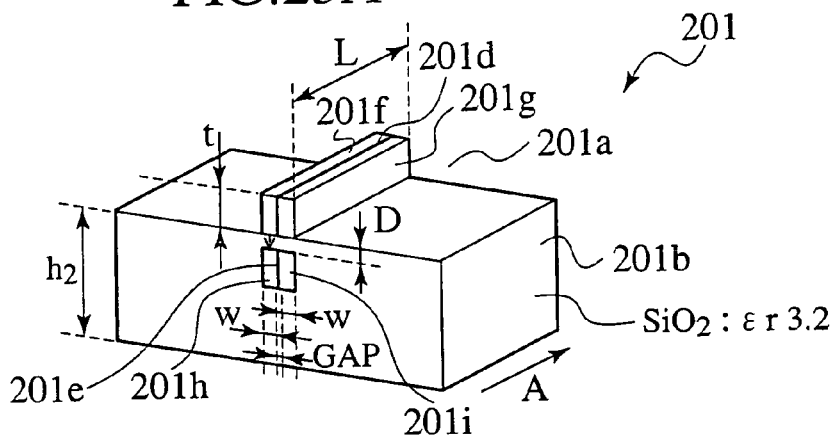
FIG.25B
FIG.25C
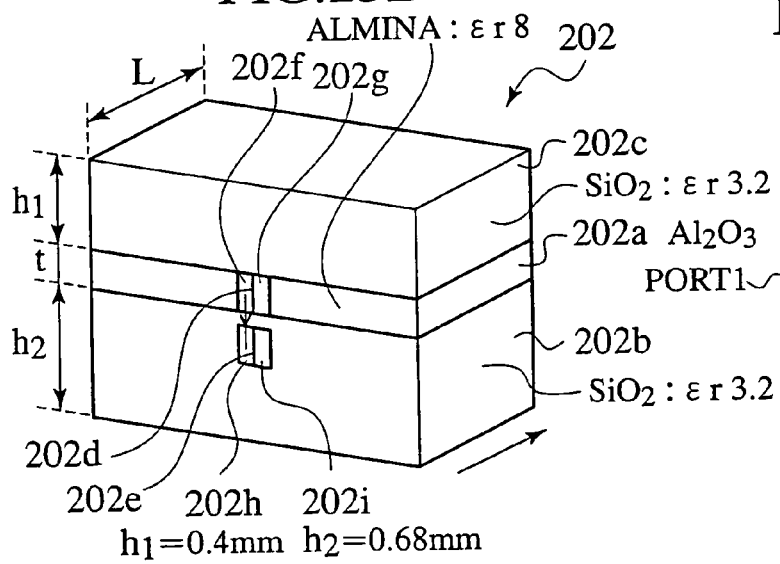
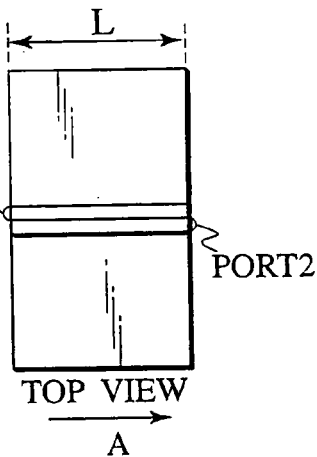
$h_1 = 0.4mm$  $h_2 = 0.68mm$
FIG.25D
| SCALE RATIO | 1 | 1/100 | 1/1000 |
|---|---|---|---|
| L | 1mm | 10 μm | 1 μm |
| w | 0.08mm | 0.8 μm | 80nm |
| GAP | 0.01mm | 0.1 μm | 10nm |
| t | 0.2mm | 2 μm | 0.2 μm |
| D | 0.08mm | 0.8 μm | 80nm |

BEST GAP=0.002mm

BEST GAP=0.002mm

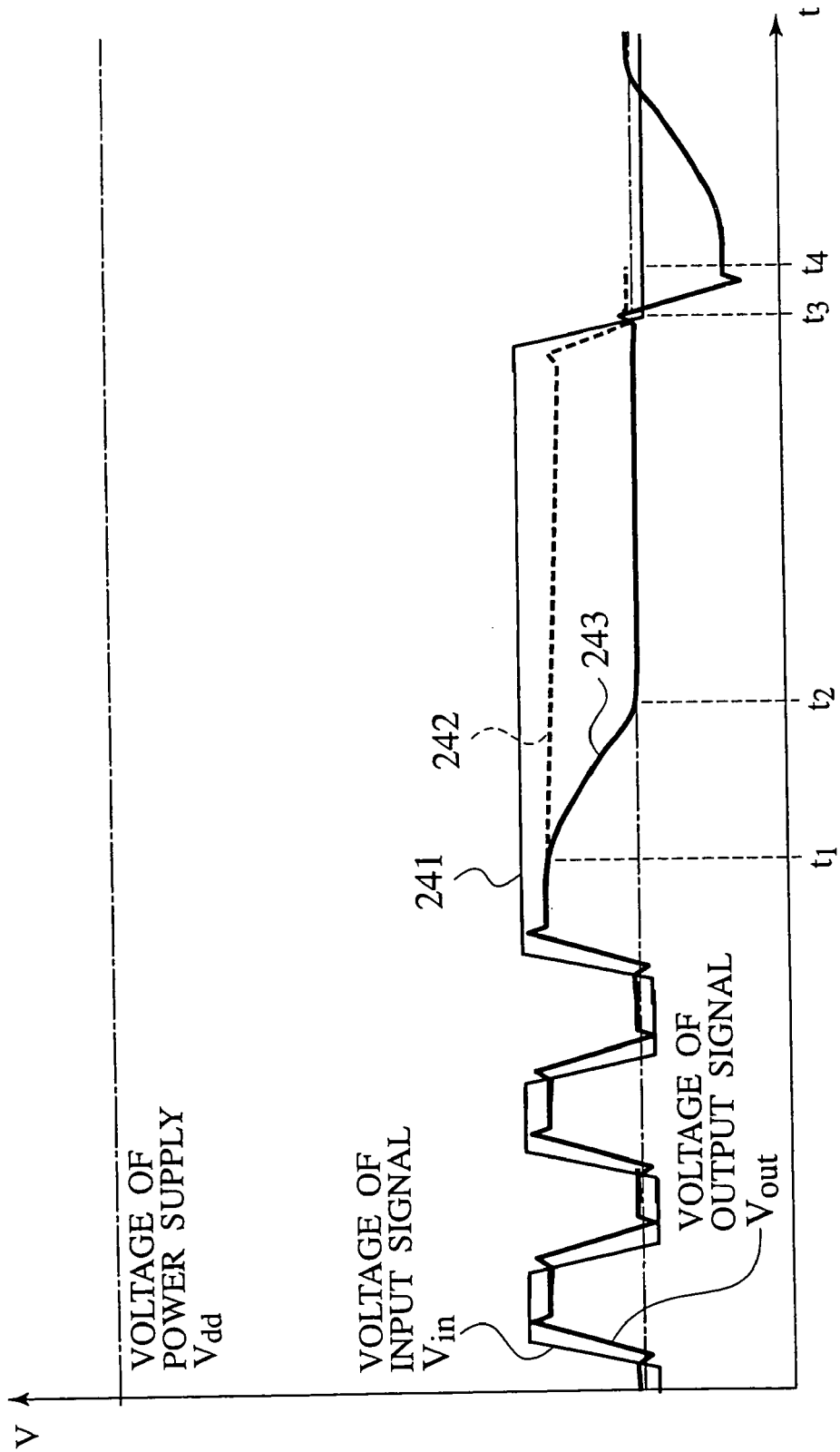

0.1µF

10pF 0.1µF
TIME8=0

100pF 0.1 μF
tan δ = 0.015
σ = 5.8×10⁷S

LENGTH=100mm

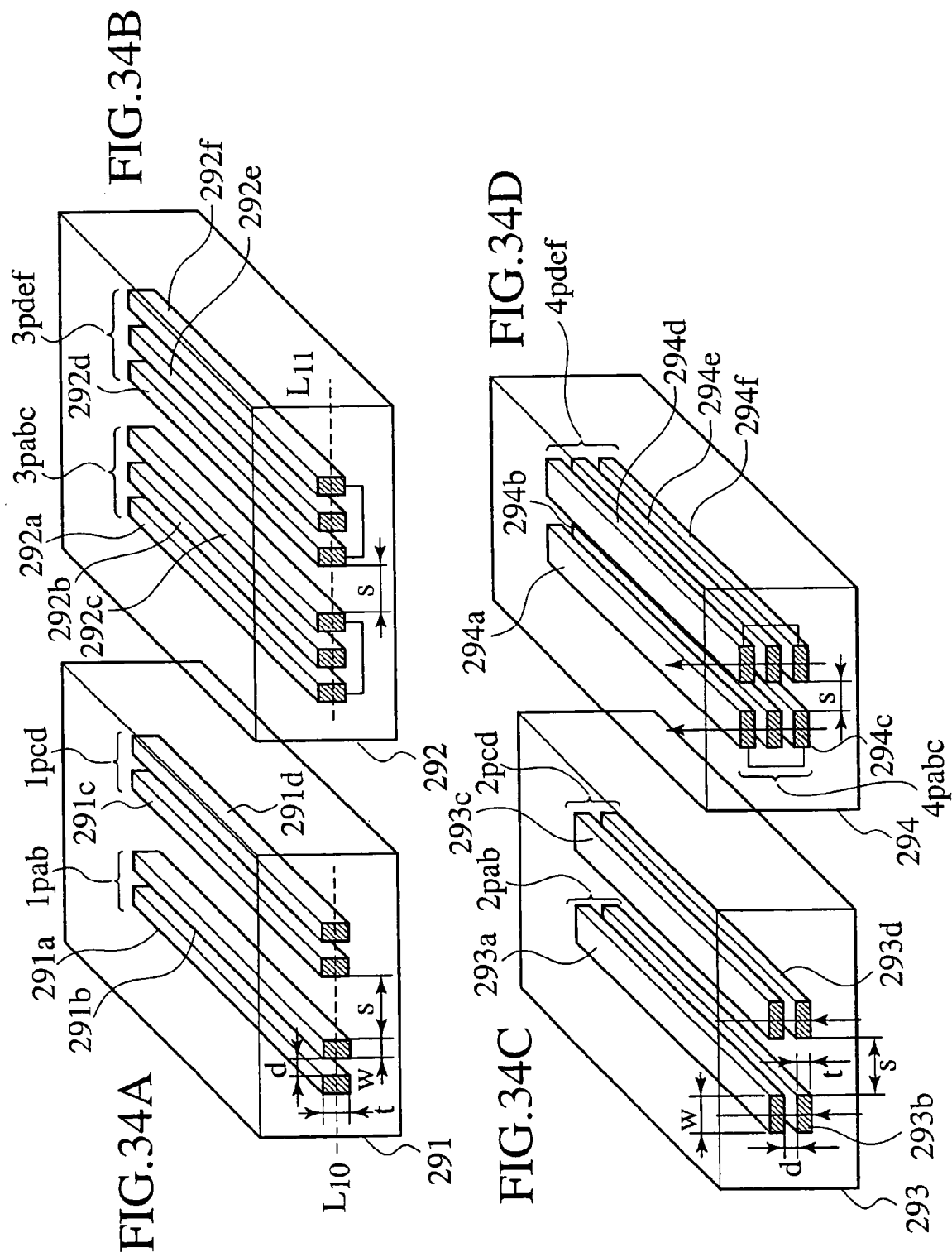

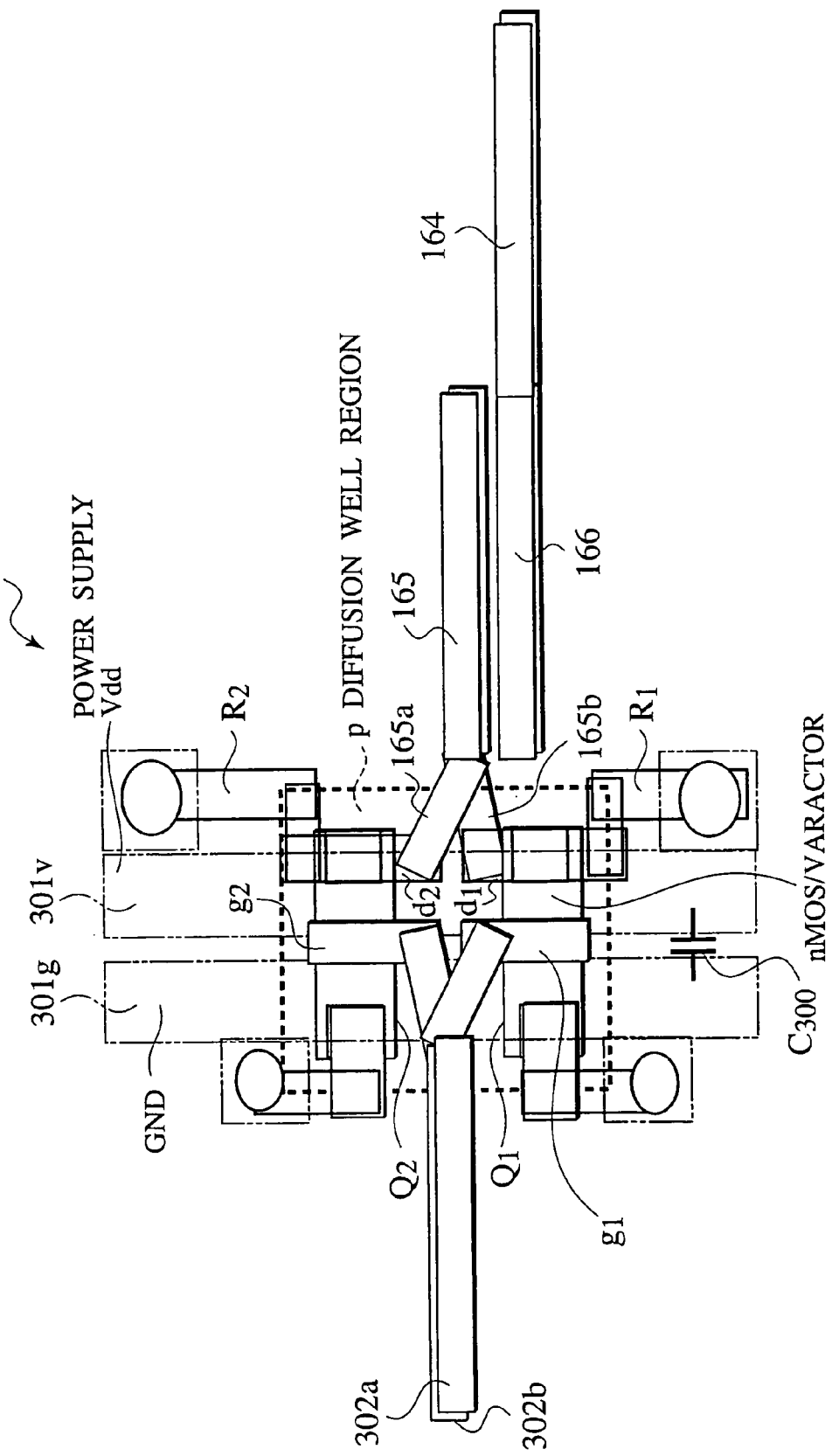

FIG.38

|  | R=0.25mm | R=0.3mm | R=0.35mm |
|---|---|---|---|
| r=0.025mm |  |  |  |
| r=0.05mm | 5 | 6 | 7 |
| r=0.075mm | 3.33 | 4 | 4.67 |
| r=0.1mm | 2.5 | 3 | 3.5 |
| r=0.15mm | 1.67 | 2 | 2.33 |
| r=0.2mm |  | 1.5 | 1.75 |

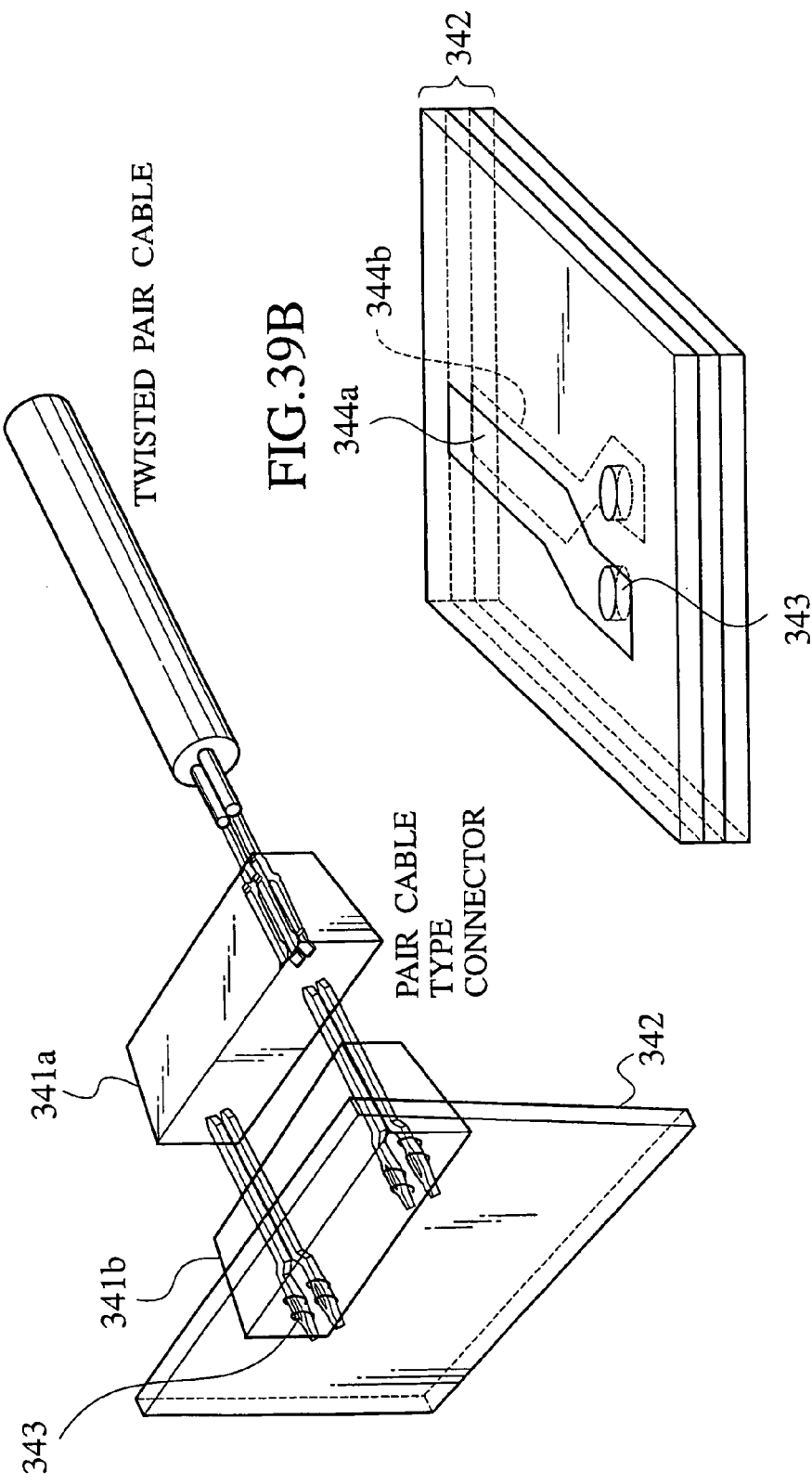

351a

351b $S_{11}$ : 3GHz/-19dB  $S_{21}$ : 10GHz/-0.5dB
6GHz/-14dB         16GHz/-1.0dB
10GHz/-11dB        20GHz/-2.5dB

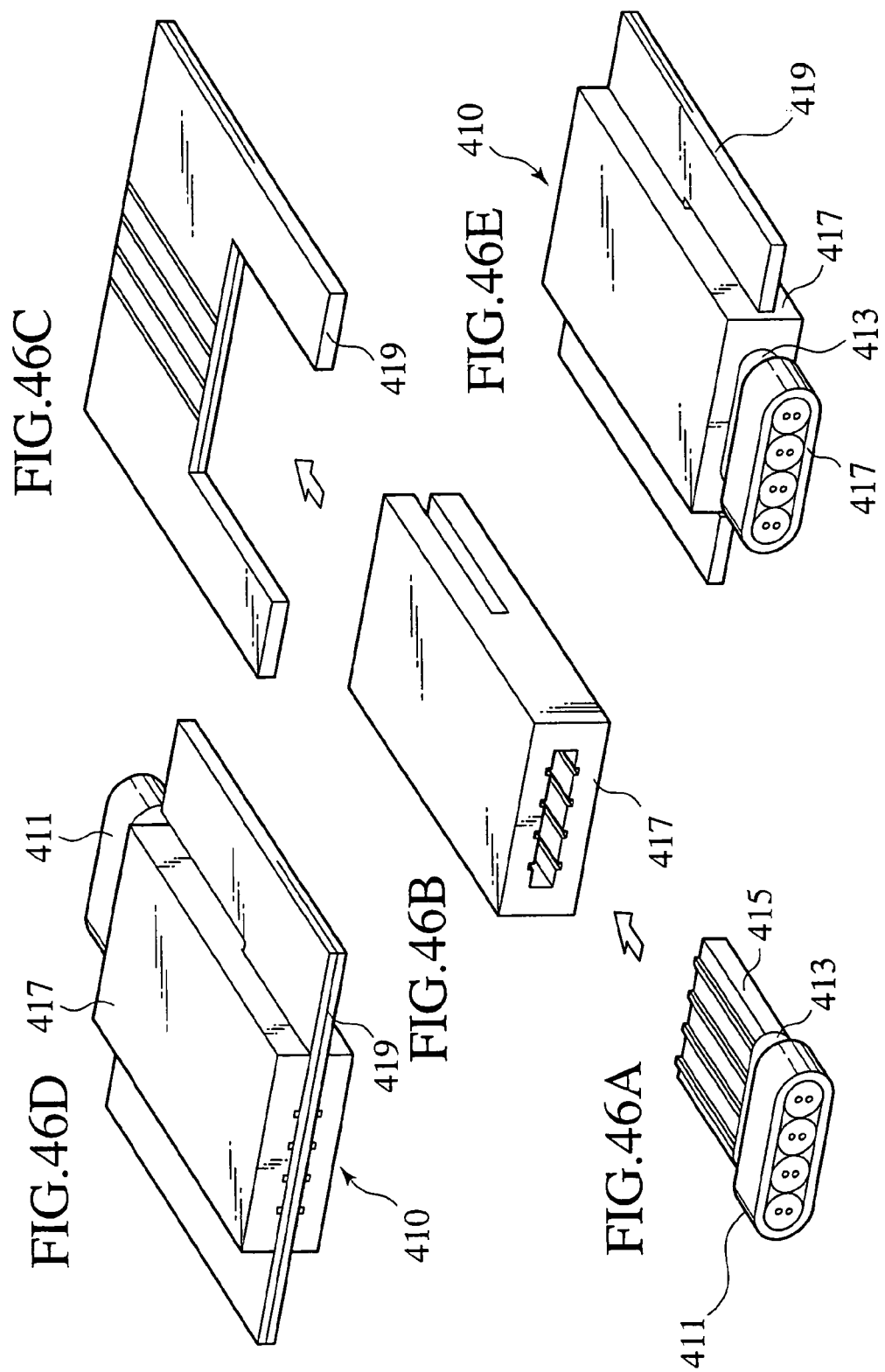

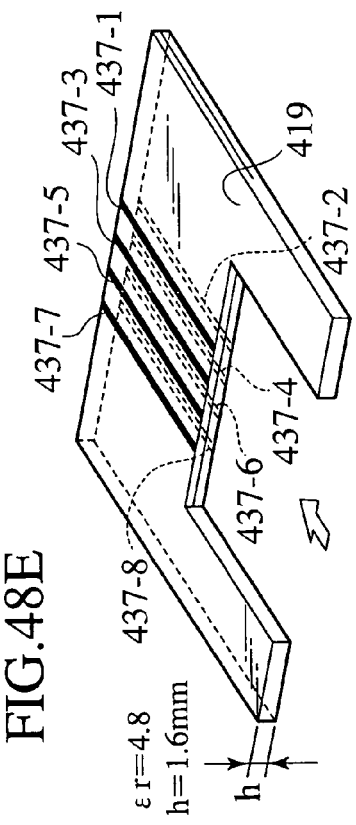
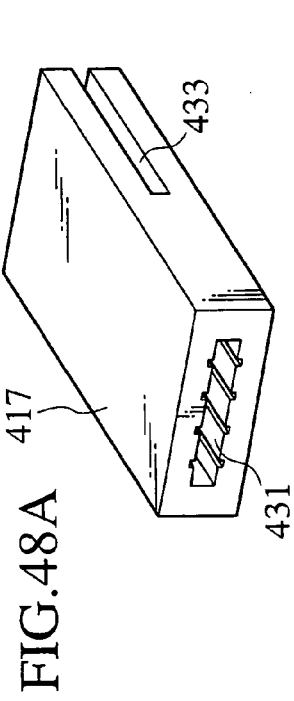
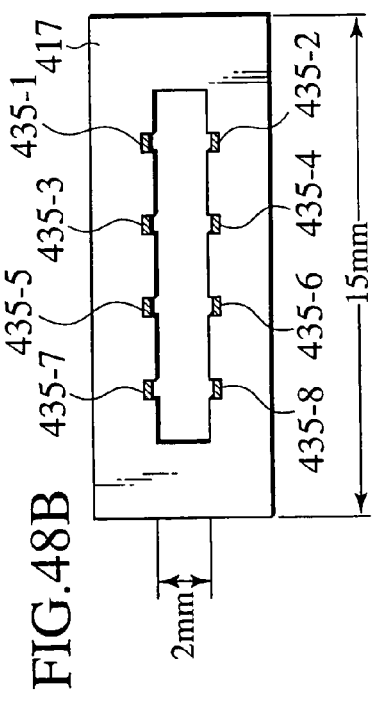
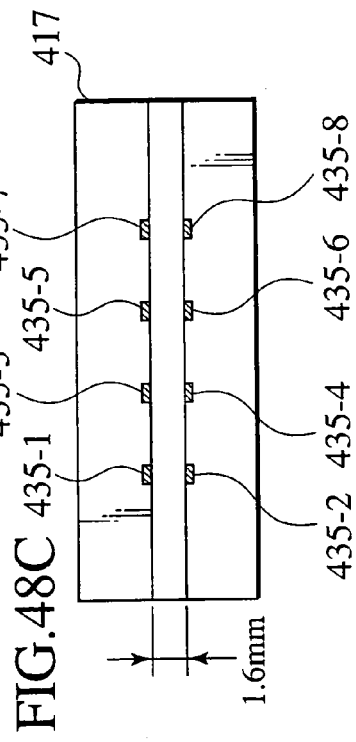
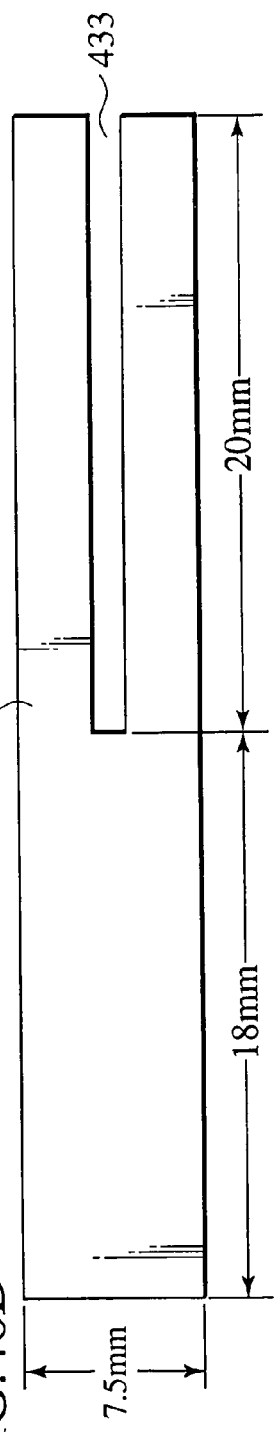
FIG.48E
FIG.48C
FIG.48A
FIG.48B
FIG.48D

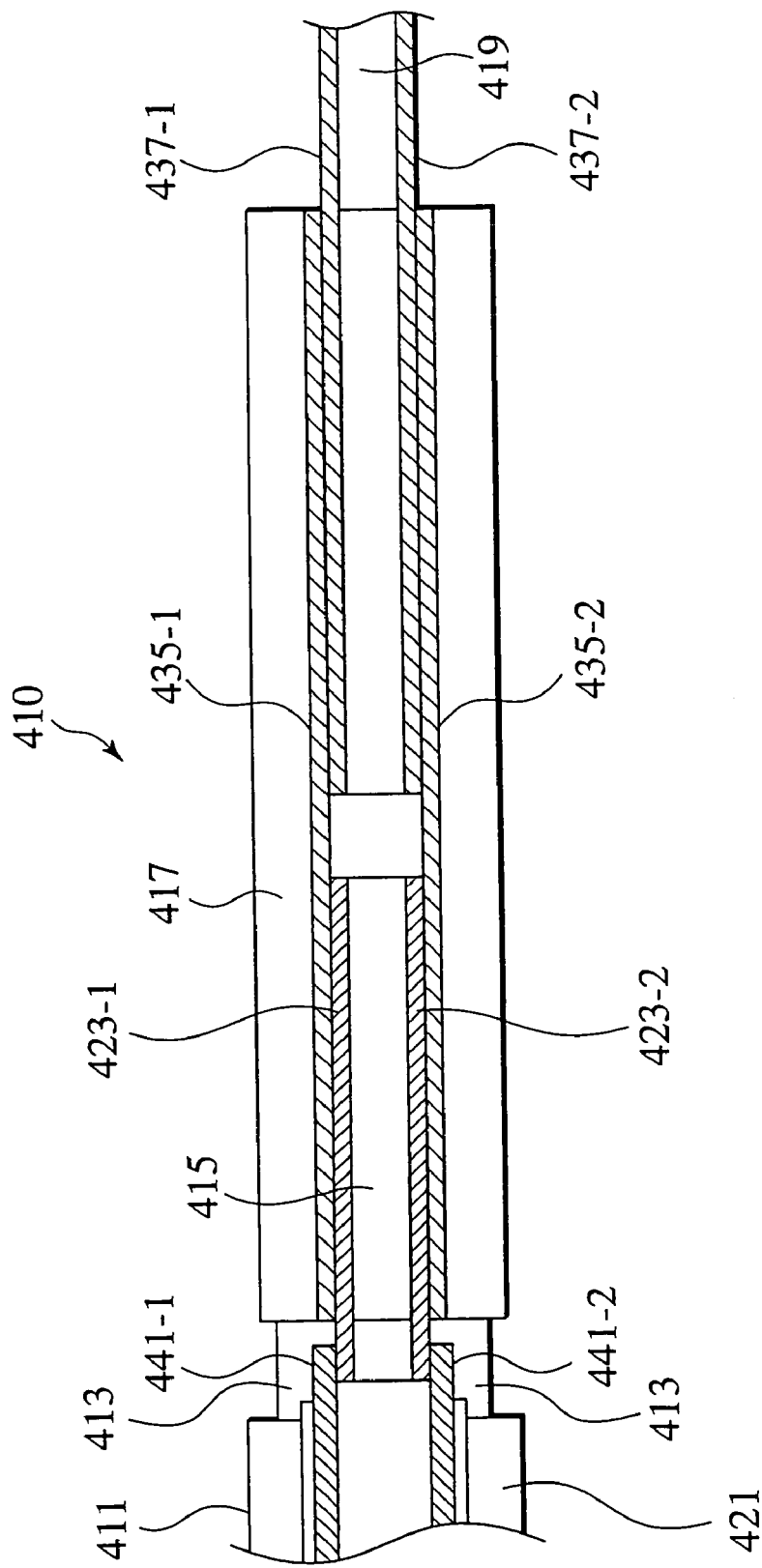

TRANSMISSION CABLE STRUCTURE FOR GHZ FREQUENCY BAND SIGNALS AND CONNECTOR USED FOR TRANSMISSION OF GHZ FREQUENCY BAND SIGNALS

This application is based on and claims priority under 35 U.S.C. §119 with respect to Japanese Patent Application No. 2003-137854 filed on May 15, 2003 and Japanese Patent Application No. 2003-196062 filed on Jul. 11, 2003, the entire content of which is incorporated herein by reference.

BACKGROUND OF THE INVENTION

The present invention relates to a transmission cable structure for transmission of GHz frequency band signals and a connector used for transmission of GHz frequency band signals and more specifically to a connector used for transmission of GHz frequency band signals and a transmission cable structure for transmission of GHz frequency band signals that enables TEM waves to be transmitted between functional circuit blocks without attenuation.

Recently, a variety of problems have arisen concerning long distance communications between functional circuit blocks in line with demands for high-speed communications, such that high-speed communications of 10 Gbps or 100 Gbps on LAN cables using metal wiring is required.

For example, the length of a transmission cable in a system having a pulse clock is limited because a signal, for example a pulse signal having a pulse waveform, transmitting along a transmission cable, deteriorates in accordance with the length of the cable joining the functional circuit blocks.

Generally, applying metal cable for use in high-speed transmissions above 10 Gbps is difficult because the effective distance for transmission of a signal in a metal cable is up to 100 meters, so at this point in time only fiber-optic cable can be used.

In an ideal transmission cable there is no attenuation in the amplitude of an electromagnetic wave, which is a physical object corresponding to a transmission signal like a pulse signal, and no disorder in the waveform of an electromagnetic wave. In other words the electromagnetic wave would be perfectly accommodated by the transmission cable. However, in reality, an electromagnetic wave in a transmission cable suffers resistance loss due to the skin effect of the transmission cable and dielectric loss due to dielectric loss tangent between ground and substrate material. These losses cause attenuation in the amplitude of a transmission signal and distortion of the waveform, what is known as line loss due to RC delay of a transmission cable.

Because resistance loss causes energy dissipation of an electromagnetic wave, this makes the amplitude of a transmission signal smaller but there is no effect of blunting the waveform of the signal. Further, if a transmission cable has the same structure in its entirety, there is actually zero skew of the waveform of a transmission signal. On the other hand, because dielectric loss has frequency characteristics this causes distortion in the waveform of a transmission signal. If, however, the transmission signal is of the same structure in its entirety, this waveform distortion can be forecast, thereby enabling some degree of control.

A number of technologies for transmission cables that enable electromagnetic waves to be efficiently confined therein have been disclosed. For example, one such transmission cable structure is a pair cable structure in which two wires (insulated conductors) are arranged parallel to each other. However, when a plurality of such pair cables are arranged, cross talk arises between pair cables in close proximity.

Moreover, generally, electromagnetic waves are reflected at a connecting point (a mismatching point of impedance) of functional circuit blocks and transmission cables. When there are a plurality of such points of discontinuity, multiple reflections of electromagnetic waves occur at the points of discontinuity. If this leads to resonance of the electromagnetic waves within the transmission cable, the waveform of the transmission signal becomes an extremely complex state in which it is not possible to predict the waveform of it.

The following four methods for preventing such reflection are well-known: (1) inserting damping resistance at the terminal of a driver circuit; (2) making the on resistance of a driver circuit the same as the characteristic impedance of the transmission cable; (3) in a bi-directional bus structure, making the on resistance of driver circuits on both sides the same as that of the on resistance of transmission cables (additionally, including a structure in which damping resistance is inserted in both sides); and (4) attaching terminating resistance matched to the characteristic impedance of the transmission cables, at the terminal of the receiver side of a receiver circuit (this is the ideal method, however, at present, this method is avoided because on current always flows).

As shown in FIG. 1, a conventional driver-receiver circuit (having a driver circuit and a receiver circuit) comprises a single signal line 1003 connecting an output terminal of a driver circuit 1001 and the input terminal of a receiver terminal 1002 as well as a ground line 1004 connecting the ground terminals of those circuits. Although only a single signal line is used here, a transmission cable comprising two lines is required to effectively confine electromagnetic waves. In the case shown in FIG. 1 the ground line or power supply line (not shown in the drawing) fulfills the role of the second line. In this case, however, noise from the ground or power supply and common mode noise enters the transmission cable.

In contrast to this arrangement, to avoid the affect of this common mode noise, in recent years differential circuits have been used substantially in the field of high-speed communications. For example, as shown in FIG. 2, the output terminal of CML type differential circuit 1011 and the input terminal of CML type differential circuit 1012 are mutually connected by transmission cables 1013 and 1014. Further, as shown in FIG. 3, the output terminal of LVDS type differential circuit 1021 and the input terminal of LVDS type differential circuit 1022 are mutually connected by transmission cables 1023 and 1024.

FIG. 4A provides a cross-sectional view of the structure of pair cable 1031 used for a conventional transmission cable and FIG. 4B provides a cross-sectional view of the structure of flat cable 1032 having four pair cables $k_{12}$ (comprising wires $k_1$ and $k_2$), $k_{34}$ (comprising wires $k_3$ and $k_4$), $k_{56}$ (comprising wires $k_5$ and $k_6$) and $k_{78}$ (comprising wires $k_7$ and $k_8$) arranged adjacently and flatly. The pair cable 1031 is covered with insulating material having relative permittivity of 1.96.

FIG. 5 provides a cross-sectional view of the structure of ground 1042 and pair cables 1041a and 1041b that connect to a conventional differential circuit. This pair cable has a transmission cable structure in which ground 1042 is referenced to match the standard voltage levels between the differential circuits. That is, FIG. 5 shows a conventional differential transmission cable referencing ground (Japanese Patent Publication No. 2002-261843).

Further, among communication cables of conventional technology, the most high-speed wiring cable is TIA/EIA CAT 6 cable having a 1 Gbps transmission speed using an RJ-45 as a connector.

SUMMARY OF THE INVENTION

The transmission cables 1013 and 1014 shown in FIG. 2 or transmission cables 1023 and 1024 shown in FIG. 3 have a pair cable structure comprised of two cables, for suppressing leak of electromagnetic waves from the transmission cables to the outside. Moreover, these structures reference ground in order to achieve matching of standard voltage levels between functional circuit blocks. Thus, this lead to the issue that terminating resistance R 100 and R 101 or R 111 must be laid due to considerations of the coupling coefficients.

Another issue affecting conventional differential circuits are that skew due to fluctuation of characteristics of transistors is inherent in differential signals. Therefore, in the on-off transition of switching substantial spike current occurs due to that skew, causing an issue known as the EMI problem. Another issue affecting conventional differential circuits is that they require usage of double the number of transistors.

FIG. 4A shows the results of a simulation of electrical field strength distribution for pair cable 1031. The direction of the arrows shows the direction of the electrical field (electric flux lines), the size of the arrows indicating the strength of the electric field (the density of the electric flux line). The pair cable 1031 is formed of insulated conductors having a diameter of 0.5 mm, each being covered with insulating material having a relative permittivity of 1.96. The wires are arranged flat with a gap therebetween of 0.775 mm. The radius of a wire is half the distance of the gap. The characteristic impedance $Z_0$ of the pair cable 1031 is 99.872 Ω. As seen from FIG. 4A, electric flux lines leak out substantially from the pair cable 1031 to the atmosphere. Accordingly, the coupling between wires comprising the pair cable weakens and thus the electric flux lines leaking out are apt to create cross talk in other pair cables. Further, FIG. 4C is a graph showing the results of simulation of the S-parameters for the four pair cables $k_{12}$, $k_{34}$, $k_{56}$ and $k_{78}$ of FIG. 4B. Here, $S_{21}$, $S_{41}$, $S_{61}$, and $S_{81}$ represent the respective S-parameters for pair cable $k_{12}$ itself, and between pair cable $k_{12}$ and $k_{34}$, pair cable $k_{12}$ and $k_{56}$ and pair cable $k_{12}$ and $k_{78}$. Thus, it is evident that cross talk arises easily in flat cable 1032 inviting transmission loss.

However, for the 10G BASE-T, which is being investigated by the IEEE as a standard model of frequency band, exceeds 1 GHz, the existing CAT 6 cable carrying 250 MHz frequency band cannot be applied. Further, RJ-45 is used for connectors, however, reflection of electromagnetic waves arises at mismatching points of impedance because the characteristic impedance of the connecter parts is not uniform, causing a worsening of the S/N ratio and decreasing the frequency band of the transmitted signal.

With the foregoing in view, it is an object of the present invention to provide a transmission cable structure for GHz frequency band signals and a connector used for transmission of GHz frequency band signals that enable transmission of TEM waves without causing attenuation by matching the characteristic impedance between transmission cables when performing GHz frequency band signal transmission.

According to a first aspect of the present invention, a differential signal transmission cable structure for transmitting differential signals having GHz frequency band, is comprised of: a differential signal transmission pair cable connecting a driver circuit and a receiver circuit, that transmits the differential signals having GHz frequency band while matching characteristic impedances of the driver circuit and the receiver circuit, and a power supply ground transmission cable connecting a first power supply and ground connected to the driver circuit and a second power supply and ground connected to the receiver circuit, that matches characteristic impedances of the first power supply and ground and the second power supply and ground, wherein, as matching characteristic impedances of the power supply ground transmission cable and the differential signal transmission cable, TEM waves of the differential signals having GHz frequency band is maintained when the differential signal transmission cable transmits the transmission signals having GHz frequency band.

According to a second aspect of the present invention, a differential signal transmission cable structure for transmitting differential signals having GHz frequency band, is comprised of: a differential signal transmission cable connecting a driver circuit and a receiver circuit, and a directionality coupler for transmitting differential signals having GHz frequency band, further comprising first parallel electrodes disposed at the end of the driver circuit, comprising long shaped flat plates, and second parallel electrodes, disposed at the end of the differential signal transmission pair cable, comprising long shaped flat plates arranged in proximity to the first parallel electrodes.

According to a third aspect of the present invention, a differential signal transmission cable structure for transmitting differential signals having GHz frequency band, is comprised of: a differential signal transmission cable connecting a driver circuit and a receiver circuit, and a capacitance coupler for transmitting differential signals having GHz frequency band, further comprising first parallel electrodes disposed at the end of the driver circuit, comprising long shaped flat plates, and second parallel electrodes, disposed at the end of the differential signal transmission pair cable, comprising long shaped flat plates arranged in proximity to the first parallel electrodes.

According to a fourth aspect of the present invention, a differential signal transmission cable structure for transmitting differential signals having GHz frequency band, is comprised of: a first stacked pair cable connected to a pair of gate terminals of a pair of transistor elements comprising a differential circuit, a coplanar cable connected to a pair of drain terminals of the pair of transistor elements, for inputting power supply via resistance, and a second stacked pair cable connected to the pair of drain terminals of said pair of transistor elements, for outputting external differential signals.

According to a fifth aspect of the present invention, a connector for connecting differential signal transmission cable, for transmitting differential signals having GHz frequency band, having at least one pair of cables and a wiring pattern disposed on a mounting board, is comprised of: a plug in which is laid a first pair line connecting to the one pair of the cables so as to be overlapped in a longitudinal direction thereto in upper and lower layers of a long shaped insulating material, a jack having a long shaped cavity approximately matching the external form of the plug, a first fitting portion in which is disposed a second pair line that connects at one end of the cavity to the first pair line of the plug so as to be overlapped in a longitudinal direction thereto, and a second fitting portion in which the second pair line is disposed up to the other end of the cavity, and a mounting board whereon is disposed a third pair line that engages with the second fitting portion of the jack and connects to the second pair line of the jack so as to be overlapped in a longitudinal direction thereto.

BRIEF DESCRIPTION OF THE DRAWINGS

FIG. 7 shows the minimum values for length of a transmission cable of the present invention according to different transmission speeds of electromagnetic waves in transmission cables.

FIG. 9 shows the structure of a relay circuit and differential signal transmission pair cable and the structure of a power supply ground transmission pair cable.

FIG. 13A illustrating the case where covering of a thickness of 0.3 mm is used and FIG. 13B the case where covering of 0.5 mm is used.

FIG. 19A illustrating the case of A type and FIG. 19B illustrating the case of B type.

FIG. 20A illustrating the case of C type, FIG. 20B illustrating the case of D type and FIG. 20C illustrating the case of E type.

FIG. 25A shows the structure of a first directionality coupler, FIG. 25B shows the structure of a second directionality coupler, FIG. 25C is a plan view of the couplers shown in FIG. 25A and FIG. 25B, and FIG. 25D is a table recording the dimensions of the couplers shown in FIG. 25A and FIG. 25B.

FIG. 29 shows a waveform of an output signal of a load envisioned as applying to the second directionality coupler 202.

FIG. 34A shows a pair coplanar cable, FIG. 34B shows a guard coplanar cable.

FIG. 34C shows a stacked pair cable, and FIG. 34D shows a guard stacked pair cable.

FIG. 35 shows the structure of the driver circuit 161 shown in FIG. 21A.

FIG. 38 is a table showing the relationship (ratio of R/r) of the radius of the anti beer hole R and the radius of beer hole r.

FIG. 39A shows the structure of connector installed on substrate and FIG. 39B shows the structure of wiring within the substrate shown in FIG. 39A.

FIG. 46A shows a perspective view of plug 415 connected to LAN cable 411, FIG. 46B shows a perspective view of jack 417, FIG. 46C shows a perspective view of mounting board 419, FIG. 46D shows a perspective view, from the viewpoint of the mounting board, of LAN cable connector 410 fitting plug 415 with jack 417 and mounting board 419 and FIG. 46E shows a perspective view, from the viewpoint of the LAN cable, of LAN cable connector 410 fitting plug 415 with jack 417 and mounting board 419.

FIG. 47A providing a side view, FIG. 47B providing a view from the end face of the plug, FIG. 47C providing a side view, and FIG. 47D providing a perspective view.

FIG. 48A is a perspective view of substrate fitting part 433 and plug fitting part 431 disposed in jack 417, FIG. 48B is a side view showing jack 417 from the viewpoint of the plug fitting part 431, FIG. 48C is a rear view of jack 417 from the viewpoint of the fitting part 433, FIG. 48D is a side view of jack 417, and FIG. 48E is a perspective view of mounting board 419.

FIG. 49 provides a cross-sectional view depicting the combination and engagement of each of the parts LAN cable 411, plug 415 and jack 417 shown in FIG. 46 each disposed on mounting board 419 in the direction shown by the respective arrows.

DETAILED DESCRIPTION OF THE PREFERRED EMBODIMENTS

The preferred embodiments according to the present invention will now be described with reference to the drawings.

<Theoretical Background of the Invention>

When theoretically studying transmission cables, whether to form a model using concentrated constant circuits or distributed constant circuits depends on the relationship of the length L of a transmission cable and the wavelength λ of the transmission signal transmitted in the cable. For the present invention the critical value for the length of a transmission cable is obtained from $$L_{critical} = \frac{\lambda}{40} = \frac{c_0}{40 f_{clock} \sqrt{\mu_r \varepsilon_r}}, \quad (1)$$

where λ represents the wavelength of a fundamental harmonic wave (sine wave) where Fourier series expansion is applied to a transmission signal (pulse signal) having a pulse waveform, $C_0$ is the speed of the electromagnetic wave in a vacuum, $\mu_r$ the relative permittivity of insulating material encompassing the transmission cable, and $f_{clock}$ represents the frequency of maximum clock pulse flowing in the transmission cable.

Figure 6:
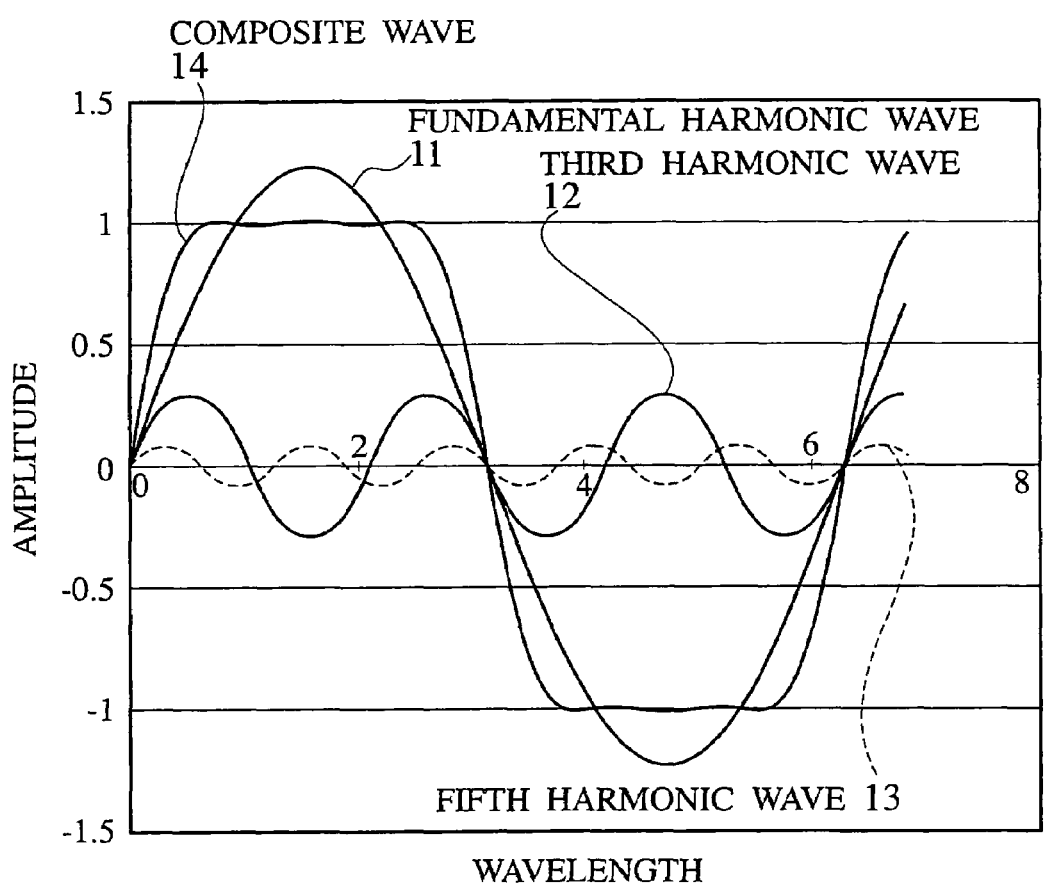
FIG. 6 shows waveforms of modes of Fourier series when a pulse waveform of duty 50% undergoes Fourier series expansion.

The meaning of the coefficient 1/40 in expression (1) will now be described with reference to FIG. 6 showing the modes of Fourier series when a pulse signal of duty 50% is expanded to the Fourier series.

As shown in FIG. 6, a pulse signal of duty 50% includes odd number mode of higher harmonic waves in Fourier series. Here, each higher harmonic wave is expressed by a sine wave. If a third harmonic wave 12 and a fifth harmonic wave 13 are added to fundamental harmonic wave 11 the result is a composite wave 14 reasonably close to the original pulse wave form. Further, adding seventh, ninth and eleventh harmonic waves results in a virtually perfect restoration of the original transmission signal pulse waveform.

Thus, the accuracy of recovery of a pulse signal depends on the order of higher harmonic waves adding to the fundamental harmonic wave, and at the very least waves up to a harmonic wave having a frequency of one digit higher order than the frequency of the original pulse signal must be considered. For example, in the case of a pulse signal with a frequency of 1 GHz, a harmonic wave up to 10 GHz must be considered. Here, the minimum resonance frequency is (¼) λ.

Thus, in the case that a transmission cable transmits a pulse signal having 1 GHz, the cable can be handled as a concentrated constant circuit when the length of the transmission cable is less than ¼ of the wavelength of higher harmonic wave having 10 GHz frequency, that is, when the transmission cable has a length below 1/40. On the other hand, using a distributed constant circuit is appropriate for the transmission cable having lengths exceeding that length. In other words, if the length of a transmission cable is below $L_{critical}$ (=λ/40) shown in expression (1), theoretically a concentrated constant circuit should be used and a distributed constant circuit should be used for lengths above that.

The present invention relates to transmission cables having a length above $L_{critical}$ and a transmission system operating between functional circuit blocks having driver and receiver circuits for such transmission cables. More specifically, the present invention is for a frequency band where the frequency of a clock pulse signal is from several GHz to tens of GHz (in other words, for electromagnetic waves from milli waves to microwaves).

FIG. 7 shows the minimum values ($L_{critical}$) of a transmission cable of the present invention according to different electromagnetic waves transmitted in transmission cables. In this figure, $v=C_0/(\mu_r \in_r)^{1/2}$, $C_0$ is the speed of the electromagnetic wave in a vacuum, $\mu_r$ is the relative permeability of insulating material encompassing a transmission cable, and $\in_r$ is relative permittivity of insulating material encompassing the transmission cable.

Actually, confining electromagnetic waves effectively within transmission cables, in other words, suppressing reduction of the amplitude of a pulse signal transmitted inside a transmission cable, requires that the transmission cable be constructed of two wires. This kind of transmission cable is referred to as a pair cable.

Pair cables (transmission cable) having a length exceeding the critical value $L_{critical}$ above can be considered as a distributed constant circuit having resistance R, inductance L, intercable capacitance C and intercable conductance (leakage resistance) G, per unit length of the transmission cable. Generally, impedance $Z_0$ of this distributed constant circuit is shown by $$Z_0 = \sqrt{\frac{R + j\omega L}{G + j\omega C}} \cong \sqrt{\frac{L}{C}} \left[1 + \frac{1}{j\omega}\left(\frac{R}{2L} - \frac{G}{2C}\right)\right]. \quad (2)$$

Here, the impedance $Z_0$ is defined as the ratio V/I of electric current I and voltage V per unit length of the transmission cable, and can be considered intuitively as expressing the resistance of a circuit.

When a pulse signal having a GHz frequency band transmits (that is, electromagnetic waves propagate) in a transmission cable described by such a distributed constant circuit, one of the main causes for disorder of the waveform of the pulse signal is the occurrence of reflected waves. Generally, a property of pulse signals (electromagnetic waves) is that they are reflected at mismatching points of disparate (e.g. a connecting point of a transmission cable and a functional block). These reflected waves overlap with the original forward moving waves of the pulse signal causing the waves of the original pulse signal inside the transmission cable to become disordered, and thereby may not accurately convey information between functional circuit blocks. In order to avoid this kind of problem, at mismatching points of disparate, impedance Z of the functional circuit block needs to become the same value as the impedance $Z_0$ of the transmission cable as shown by expression (2), (in other words this is known as impedance matching: $Z=Z_0$). When the frequency of a transmission signal reaches high frequency with GHz frequency band, impedance jωL due to inductance L, becomes extremely larger than resistance R, that is, jωL>>R. By the same token, impedance 1/jωC due to capacitance C become extremely smaller than the inverse number 1/G of conductance, that is, 1/jωC>>1/G. Accordingly, when approximating expression (2) by the conditions: jωL>>R, 1/jωC>>1/G, expression (2) becomes $$Z_0 = \sqrt{\frac{L}{C}}. \quad (3)$$

The impedance indicated by expression (3) can really be called the characteristic impedance.

What is important here is that characteristic impedance shown by expression (3) does not depend on transmission cable length L or pulse signal frequency ω. This point makes it easy to achieve matching impedance when connecting a transmission cable and functional circuit block.

The present invention constructs a system for transmission between functional circuit blocks having no impediment to information transmission throughout an inter functional circuit block transmission system having long distance transmission cables connecting between chips having functional circuit blocks.

According to the present invention, one of problems associated with processing of signals having GHz frequency band, that is, large fluctuation of power supply ground due to the operation of a functional circuit block has an adverse effect on the operation of adjacent functional circuit blocks is resolved through providing independent power supply ground for each functional circuit block.

EMBODIMENTS OF THE INVENTION

With the foregoing in view, an embodiment of the present invention will now be described with reference to the drawings.

(Inter Block Transmission System)

Figure 8:
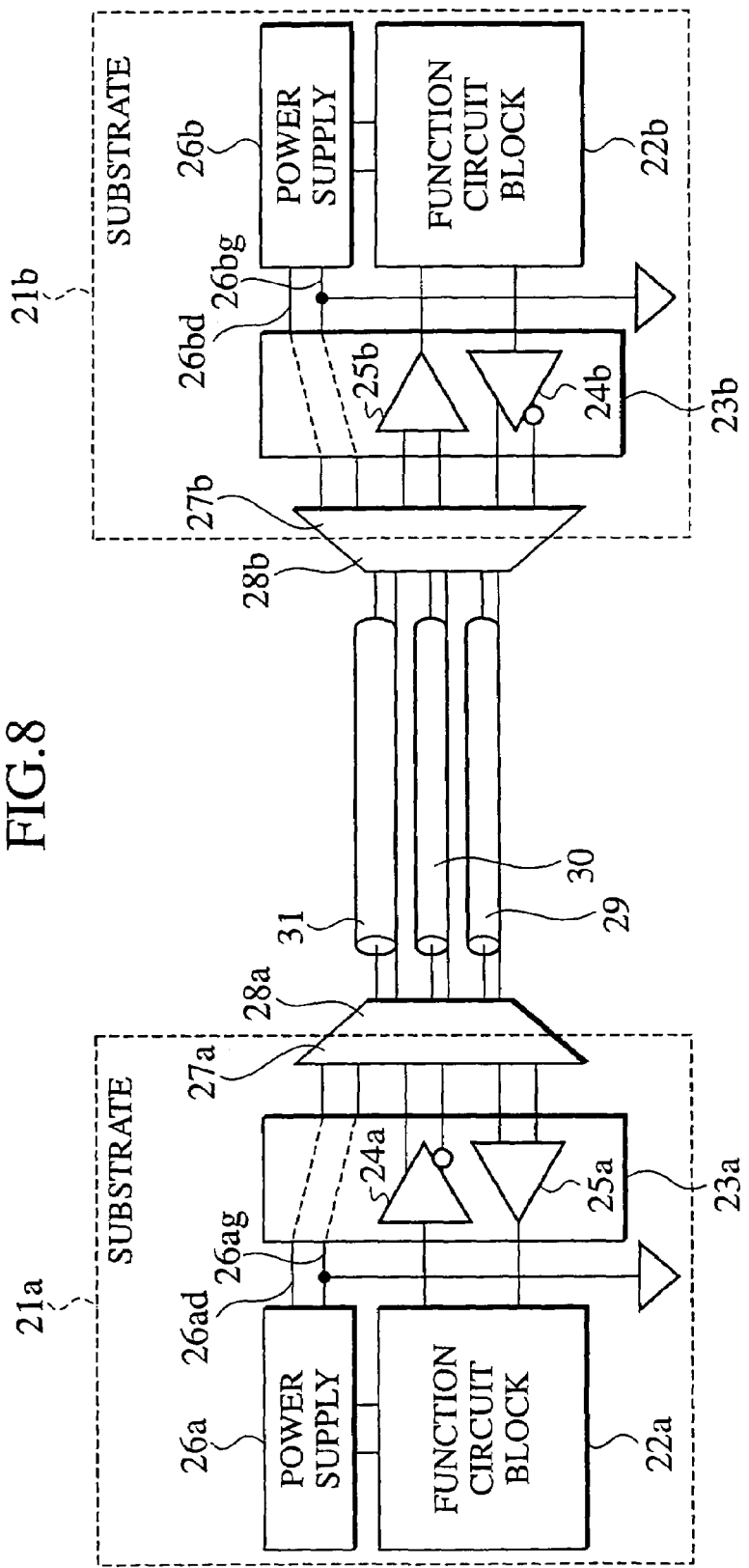
FIG. 8 shows the structure of an inter functional circuit block transmission system according to the present invention.

FIG. 8 shows the structure of an inter functional circuit block transmission system according to an embodiment of the present invention.

As shown in FIG. 8, on the substrates 21a and 21b are disposed respectively, functional circuit blocks 22a and 22b, input output circuits 23a and 23b, power supplies 26a and 26b and connector housings 27a, 28a, 27b and 28b connected to the input/output terminals of the input/output circuits 23a and 23b.

A plurality of driver circuits, 24a and 24b and receiver circuits 25a and 25b comprised of differentiating circuits are disposed respectively in the input/output circuits 23a and 23b.

The connector housings 27a, 28a, 27b and 28b are constructed so as to include the input output circuits 23a and 23b. Differential signal transmission cables 29 and 30 and power supply ground pair transmission cable 31 are connected to the connectors 28a and 28b. Here, pair cable means a transmission cable for carrying a pulse signal (electromagnetic waves) formed of one set of two covered wires. Generally, an inter functional block transmission system is formed on the substrate for each functional circuit block, however this structure can also be applied where transmission of a pulse signal occurs between functional circuit blocks in the same substrate.

In this way, the inter functional block transmission system of the present invention is provided with: the driver circuit 24a for inputting output signals from the functional circuit block 22a; the receiver circuit 25b for inputting signals output from the driver circuit 24a and inputting those signals to the functional circuit block 22b; the differential signal transmission pair cable 30 for connecting the driver circuit 24a and receiver circuit 25b and transmitting differential signals having GHz frequency band; the driver circuit 24b for inputting signals output from the functional circuit block 22b; the receiver circuit 25a for inputting signals output from the driver circuit 24b and inputting those signals into the functional circuit block 22a; the differential signal transmission pair cable 29 for connecting the driver circuit 24b and the receiver circuit 25a and transmitting differential signals having GHz frequency band; and the power supply ground transmission pair cable 31 for connecting the power supplies 26ad and the ground 26ag, which are connected with the driver circuit 24a, and the power supplies 26bd and the grand 26bg, which are connected with the receiver circuit 25b, and transmitting fluctuations of ground and power supply arising from fluctuations in signal output, wherein transmission of TEM waves is facilitated by achieving the characteristic impedance matching between the differential signal transmission pair cables 29 and 30 and power supply ground transmission pair cable 31.

(Relay Circuit)

The present embodiment deals with the issue that if the distance between functional circuit blocks becomes longer the amplitude of a signal being transmitted inside a transmission cable may attenuate. To resolve this problem, as shown in FIG. 9, a relay circuit 41 can be disposed between the differential signal transmission pair cables 29a, 29b, 30a and 30b, and the power supply ground transmission pair cables 31a and 31b. This relay circuit 41 is provided with a driver circuit 44 that is a differential circuit and a receiver circuit 45 that is a differential circuit. An inter functional circuit block transmission system is formed via this relay circuit by making the power supply ground pair transmission cables 31a and 31b array parallel to differential signal transmission pair cables 29a, 30a, 29b and 30b, thereby preventing attenuation of the amplitude of a signal transmitted in the transmission cables. Connector housings 42 and 43 are disposed at both ends of these driver and receiver circuits 44 and 45.

In this way, the inter functional circuit block transmission system according to this embodiment is provided with the relay circuit 41 that has the driver and receiver circuits 44 and 45 for inputting differential signals having GHz frequency band from one side of transmission cables (e.g. 30a and 29a) and outputting those signals to the other transmission cables (e.g. 20b and 29b) by connecting differential signal transmission pair cables 29a and 30a, and 29b and 30b, and for inputting signals of power supply and ground from one side of transmission cables and outputting those signals of the power supply and ground to the other transmission cables by connecting, thereby enabling attenuation of the amplitude of signals transmitted over the cables to be prevented.

(Pair Cables)

Figure 10A:
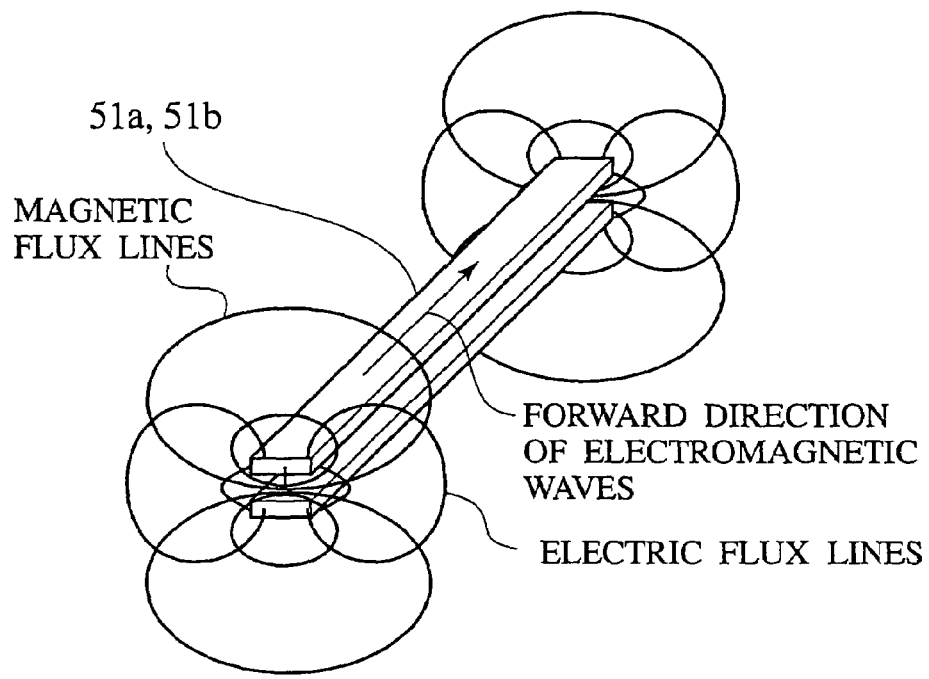
FIG. 10A shows TEM waves (transmitted waves) propagating in a longitudinal direction in an ideal transmission pair cable and FIG. 10B shows non-TEM wave (preceding wave and delayed wave) propagating in a transmission pair cable with an insulating material disposed between the pair.

As shown in FIG. 10A, generally, in an ideal pair cable structure in which the space between pair wires 51a and 51b is air, the electromagnetic field has only transverse components in the forward direction of electromagnetic waves, and the electromagnetic waves are propagated in the longitudinal direction of the pair cables at a speed of $3 \times 10^8$ m/s (the speed of light). This is called TEM mode transmission.

Figure 10B:
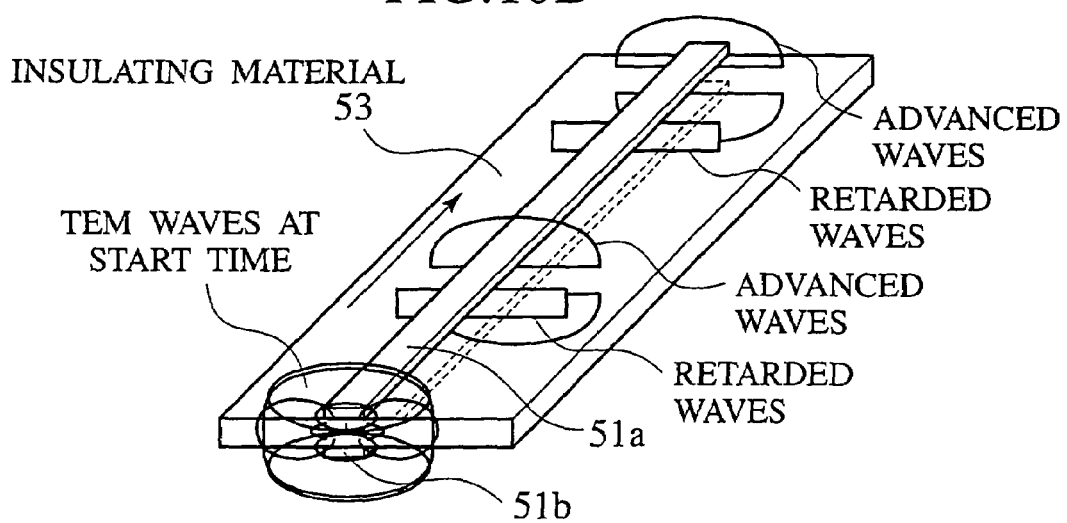

In contrast to this, as shown in FIG. 10B, in a pair cable structure having insulating material 53 of relative permittivity above 1 disposed between pair transmission wires 51a and 51b, the speed v of electromagnetic waves propagated in the insulating material of the pair cable is $v=C_0/(\mu_r \in_r)^{1/2}$. This speed is slower then the speed of propagation of electromagnetic waves in the air of the pair cable (this is known as retarded waves). In this situation, since the electromagnetic field has components in the forward direction of electromagnetic waves and as a result of weakening of the electromagnetic coupling between wires comprising the pair cable, cross talk increases between other pair cables. This is known as non-TEM mode transmission.

Figure 11A:
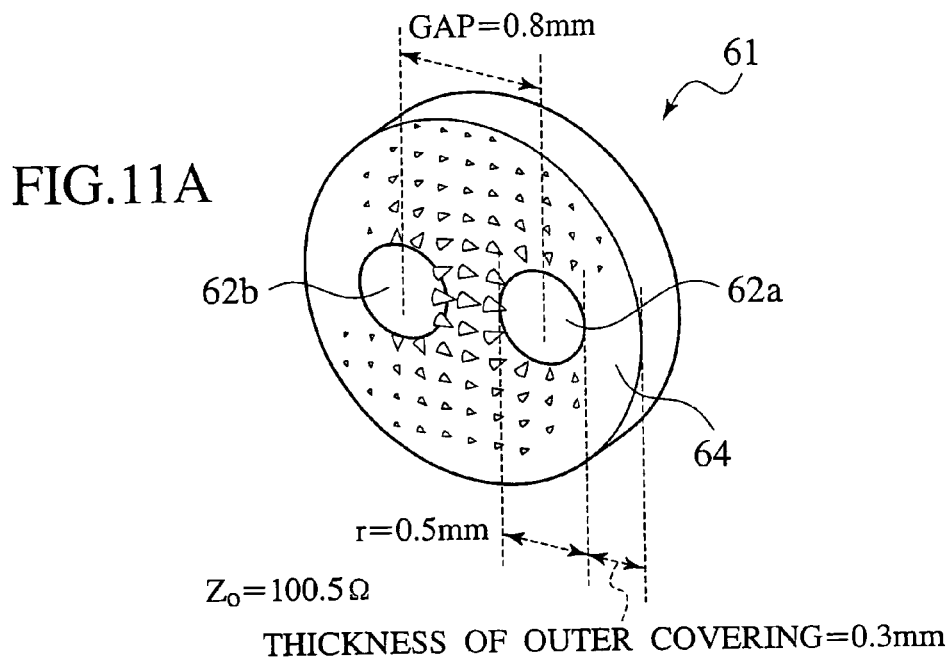
FIG. 11A provides a cross-sectional view of the structure of a pair cable used in a transmission cable of the present invention.
Figure 11B:
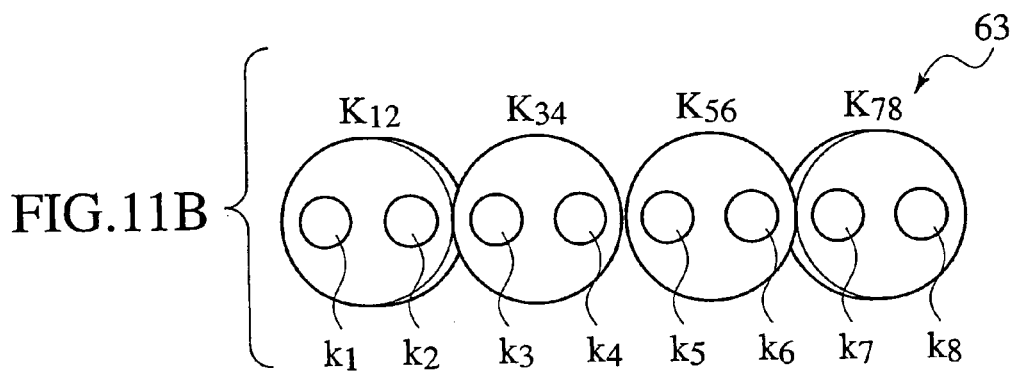
FIG. 11B is a cross-sectional view showing a flat cable structure having four pair cables arranged flatly.

FIG. 11A is a cross-sectional view showing the structure of pair cable 61 used as a transmission cable according to this embodiment. FIG. 11B is a cross-sectional view showing the structure of flat cable 63 having four pair cables $k_{12}$ (comprising wires $k_1$ and $k_2$), $k_{34}$ (comprising wires $k_3$ and $k_4$), $k_{56}$ (comprising wires $k_5$ and $k_6$) and $k_{78}$ (comprising wires $k_7$ and $k_8$) arranged in proximity and flat. The insulating material forming a covering for this pair cable 61 has a relative permittivity of 1.96. More specifically, each pair cable $k_{12}$, $k_{34}$, $k_{56}$ and $k_{78}$ comprises an insulating material forming a covering around two wires, respectively ($k_1$ and $k_2$), ($k_3$ and $k_4$), ($k_5$ and $k_6$) and ($k_7$ and $k_8$), which wires are arranged flatly with a predetermined gap therebetween (or twisted at a prescribed pitch).

Figure 4A:
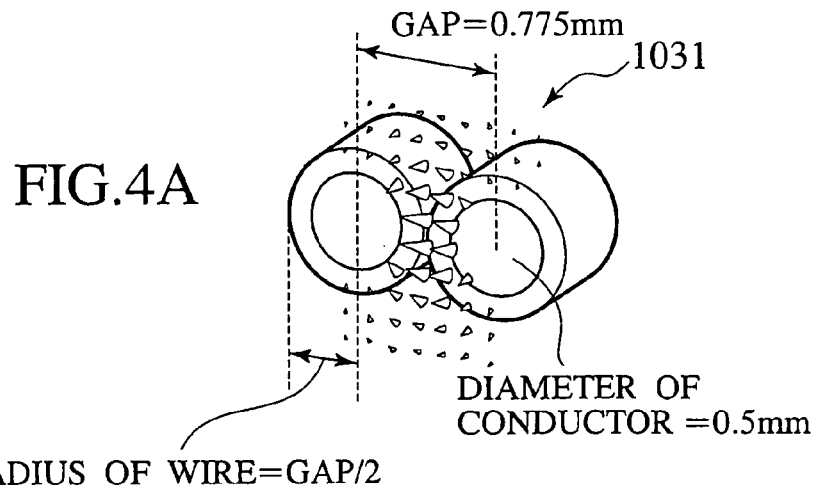
FIG. 4A is a cross-sectional view showing the structure of a pair cable employed in a conventional transmission cable, FIG. 4B provides a cross-sectional view showing the structure of a flat cable having four pair cables arranged flatly.
Figure 4B:
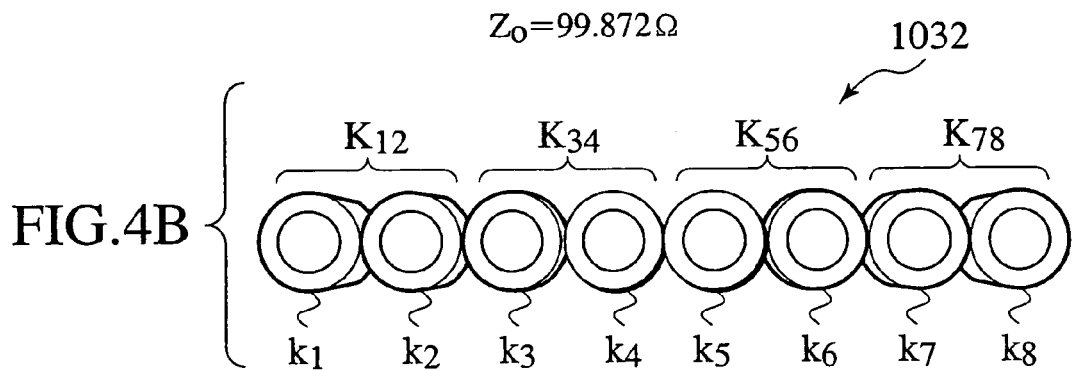
FIG. 4C is a graph showing the results of simulation of the S-parameters for the four pair cables of FIG. 4B.

FIG. 11A shows the results of a simulation of electrical field strength distribution for pair cable 61. The direction of the arrows shows the direction of the electrical field (that is, electric flux lines), the size of the arrows indicating the strength of the electric field (that is, the density of electric flux lines). The differential signal transmission pair cable 61 of this embodiment comprises insulated conductor, comprised of two conductorss 62a and 62b positioned with a predetermined gap (0.8 mm) therebetween (or twisted at a prescribed pitch), each having a diameter of 0.5 mm and being covered with a first insulating material (not shown in the drawing), and a second insulating material (a covering 64) having the relative permittivity of which is from 1 to 1.3 times greater than the relative permittivity of the first insulating material. The thickness of this covering 64 is 0.3 mm. Further, the characteristic impedance $Z_0$ of the differential signal transmission pair cables 61 is 100.5 Ω. As seen by comparing FIG. 11A and FIG. 4A the electric flux lines leaking into the air from the pair cable 61 of this embodiment are less than the electric flux lines leaking into the air from the conventional pair cable 1031. Accordingly, the coupling between wires forming the pair cable is stronger in the pair cable 61 and the electric flux lines leaking into the air are less conducive to creating cross talk between another pair cable.

Figure 4C:
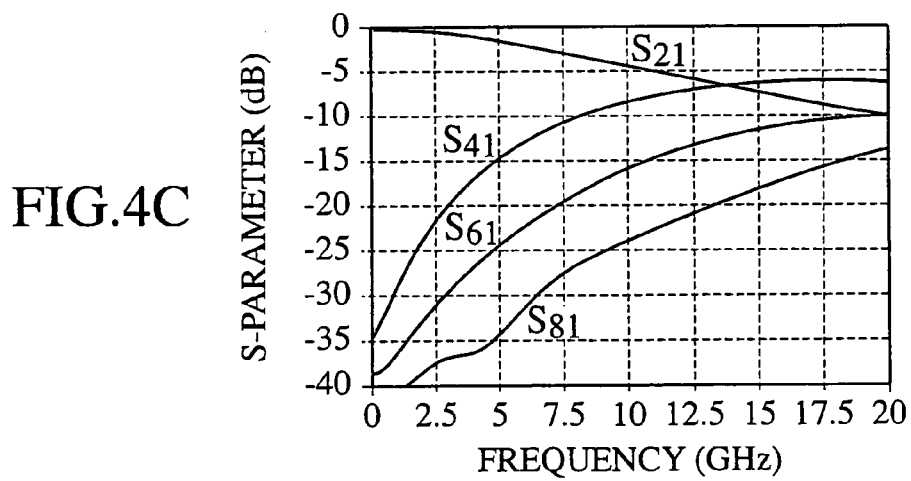
Figure 5:
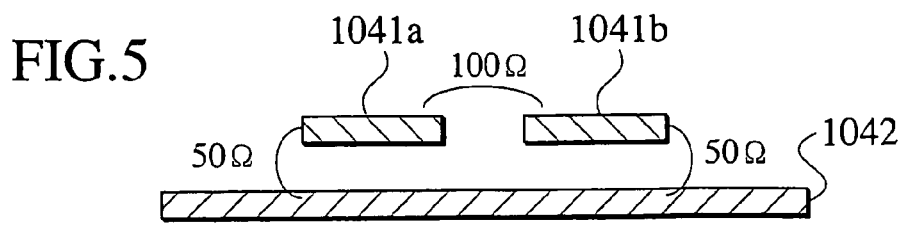
FIG. 5 shows a conventional differential transmission cable referenced to ground.
Figure 11C:
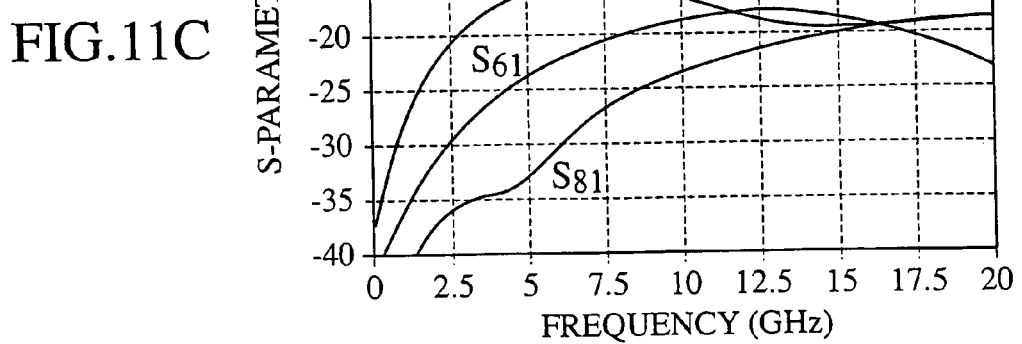
FIG. 11C is a graph showing the results of simulation for S-parameters for the four pair cables shown in FIG. 11B.

FIG. 11C shows the results of simulation of cross talk occurring between the four pair cables $k_{12}$, $k_{34}$, $k_{56}$ and $k_{78}$ comprising the flat cable 63 shown in FIG. 11B. Here, $S_{21}$, $S_{41}$, $S_{61}$ and $S_{51}$ represent the respective S-parameters for the pair cable $k_{12}$ itself and between the pair cables $k_{12}$ and $k_{34}$, the pair cables $k_{12}$ and $k_{56}$, and the pair cables $k_{12}$ and $k_{78}$. It is evident, by comparing the S-parameters for the flat cable 63 as shown in FIG. 11C and the S-parameters for the flat cable 1032 shown in FIG. 4C that there is less cross talk arising in the case of the flat cable 63 according to this embodiment than arises in the case of the conventional flat cable 1032.

Figure 12A:
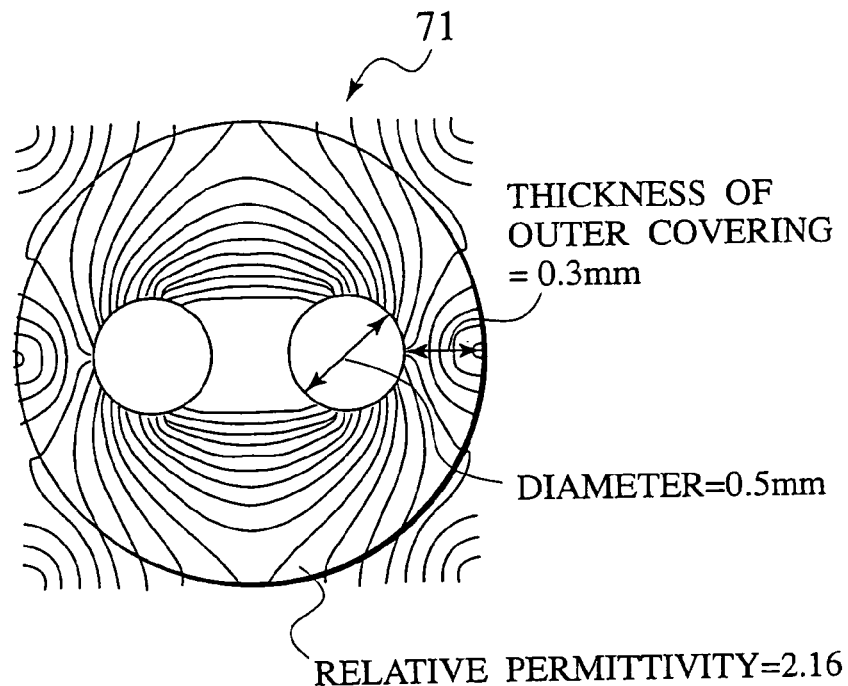
FIGS. 12A and 12B show examples of improved pair cables used for a transmission cable according to the present invention; the example shown in FIG. 12A illustrating the case where covering of a thickness of 0.3 mm is used and the example shown in FIG. 12B the case where covering of a thickness of 0.5 mm is used.
Figure 12B:
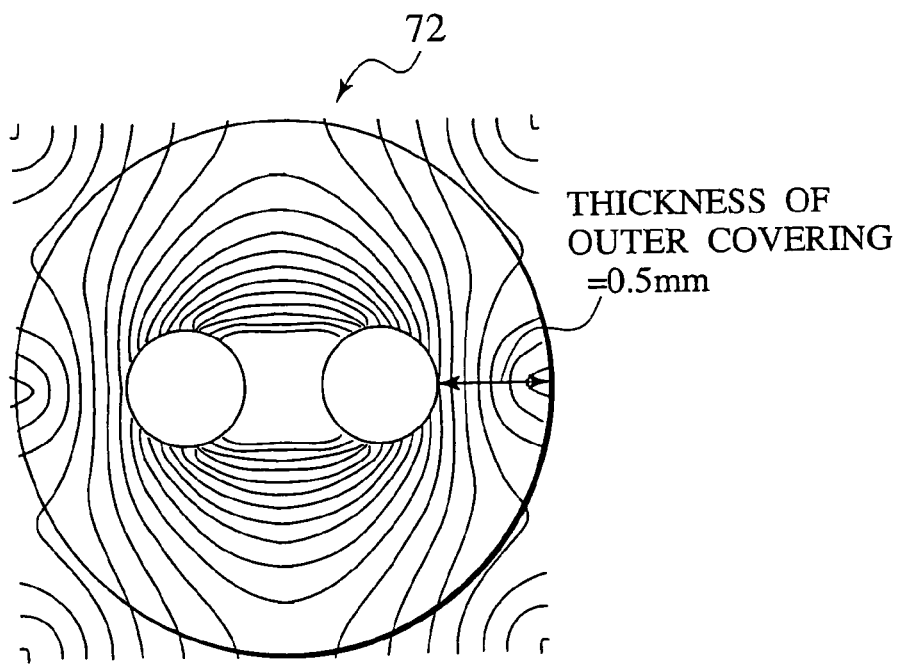

FIGS. 12A and 12B show examples of improved pair cables used for a transmission cable according to the present invention, the example shown in FIG. 12A illustrating the case where covering of a thickness of 0.3 mm is used and the example shown in FIG. 12B the case where covering of a thickness of 0.5 mm is used; in both cases the relative permittivity of the insulating material is 2.16.

It is evident when comparing FIGS. 12A and 12B that the electric flux lines leaking into the air are less in the case of the pair cable 72 having the thicker insulating material comprising the covering. In contrast to electric field strength of $3 \times 10^4$ V/m in the region between wires, the strength of the electric field in the peripheral region is one digit smaller order at $3 \times 10^3$ V/m, thus illustrating that electromagnetic waves can be propagated maintaining TEM mode in the case of the pair cable 72. Accordingly, the covering of a thickness of 0.5 mm, producing 12 lines of electric force, is more preferable to the covering of thickness of 0.3 mm, producing 10 lines of electric force.

Figure 13A:
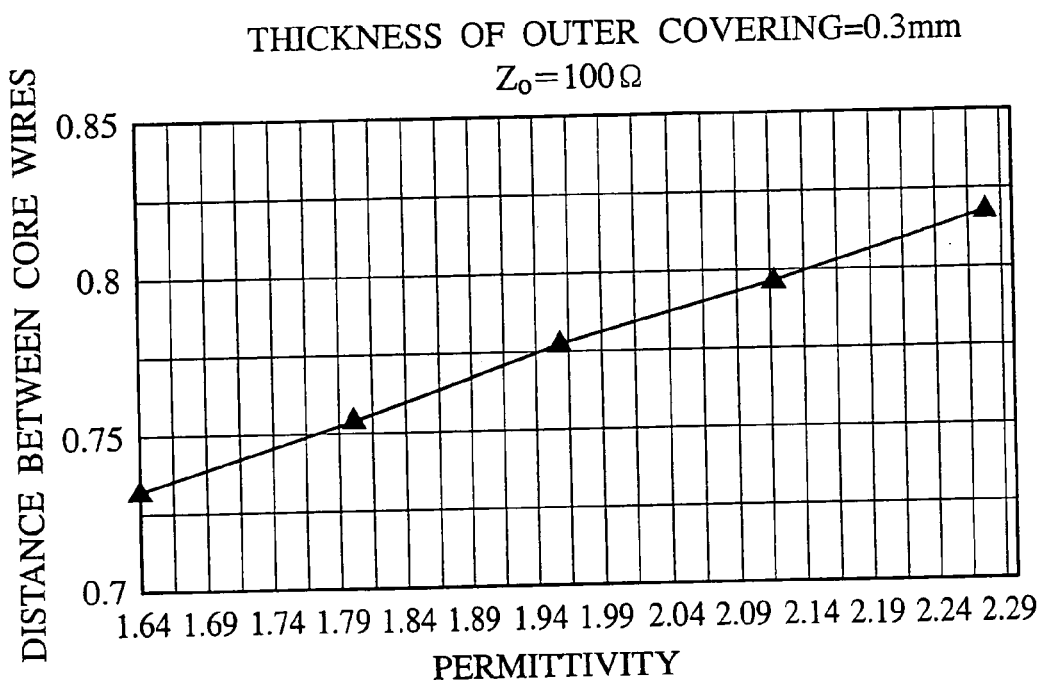
FIGS. 13A and 13B are graphs showing the relationship between the distance between wires having a diameter of 0.5 mm and relative permittivity of insulating material comprising the covering thereof, for characteristic impedance of 100 Ω.
Figure 13B:
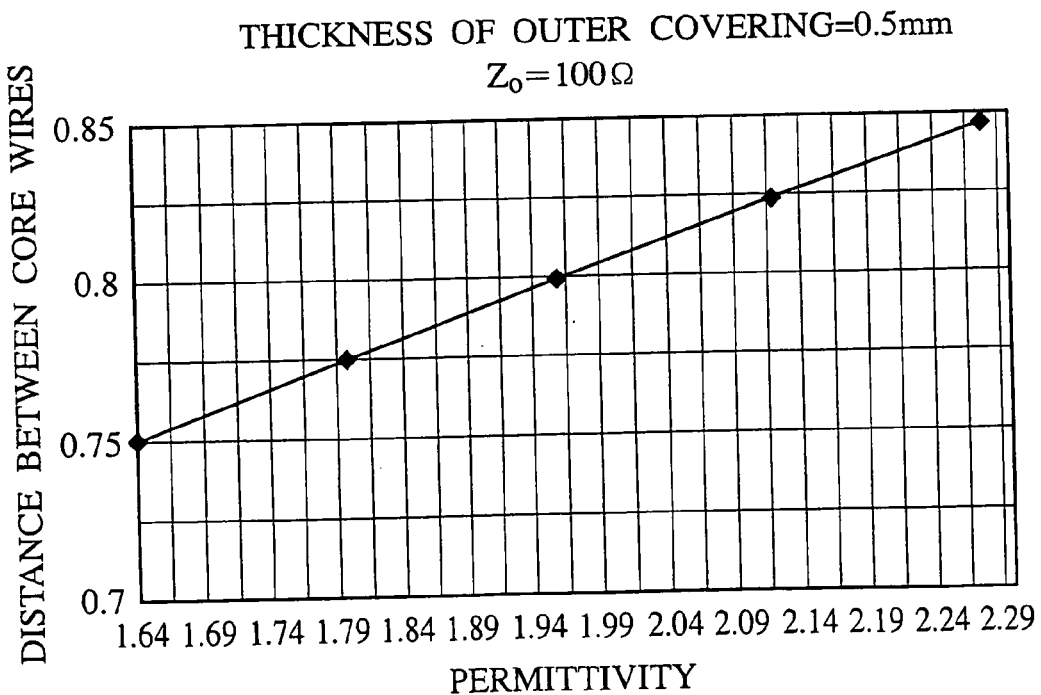

FIGS. 13A and 13B are graphs showing the relationship between the distance between core wires having a diameter of 0.5 mm and relative permittivity of insulating material comprising the covering thereof, for characteristic impedance $Z_0$ of 100 Ω, FIG. 13A illustrating the case where covering of a thickness of 0.3 mm is used and FIG. 13B the case where covering of a thickness of 0.5 mm is used. These graphs show the relationship between the distance between core wires and relative permittivity of insulating material comprising the covering thereof, for a design value ($Z_0$=100 Ω) for characteristic impedance $Z_0$.

(Examples of Pair Cable Arrangements)

FIGS. 14A and 14B to FIGS. 18A and 18B are graphs showing cross talk arising due to differences in the arrangement of four pair cables. FIGS. 19A and 19B to FIGS. 20A to 20C are graphs showing cross talk due to differences in the arrangement of four pair cables viewed from distribution of the electric field.

In FIGS. 14A, 15A, 16A, 17A, and 18A each of four pair cables $k_{12}$, $k_{34}$, $k_{56}$, and $k_{78}$ is comprised of two wires such that the pair cable $k_{12}$ is comprised of two wires $k_1$ and $k_2$; the pair cable $k_{34}$ two wires $k_3$ and $k_4$; the pair cable $k_{56}$ two wires $k_5$ and $k_6$; and the pair cable $k_{78}$ two wires $k_7$ and $k_8$.

Figure 14A:
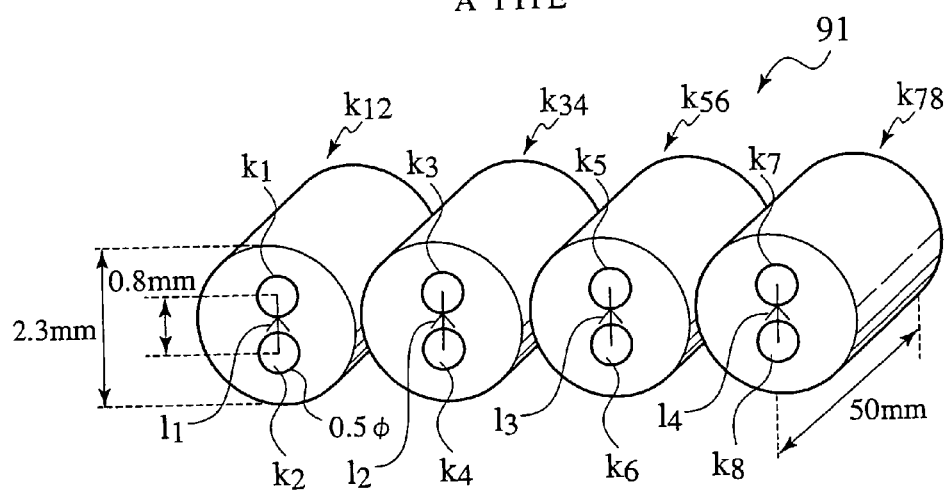
FIG. 14A shows an example of A type having an arrangement of four pair cables and FIG. 14B is a graph showing results of simulation of S-parameters for the four pair cables shown in 14A.

As shown in FIG. 14A the A type flat cable 91 is constructed having the four pair cables arranged adjacently and flatly such that center lines $l_1$, $l_2$, $l_3$ and $l_4$ joining between the centers of the two wires forming each of the four pair cables $k_{12}$, $k_{34}$, $k_{56}$, and $k_{78}$ are all parallel.

Figure 15A:
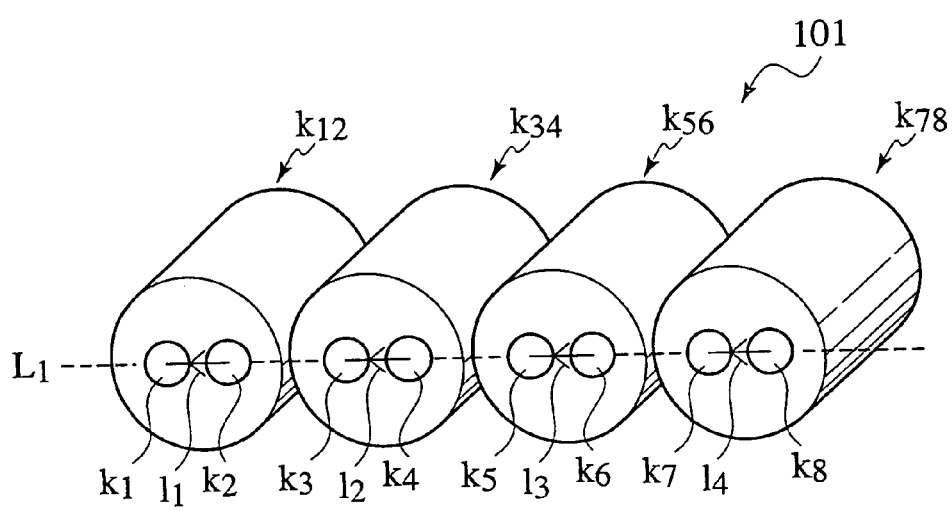
FIG. 15A shows an example of B type having an arrangement of four pair cables and FIG. 15B is a graph showing results of simulation of S-parameters for the four pair cables shown in 15A.
Figure 15B:
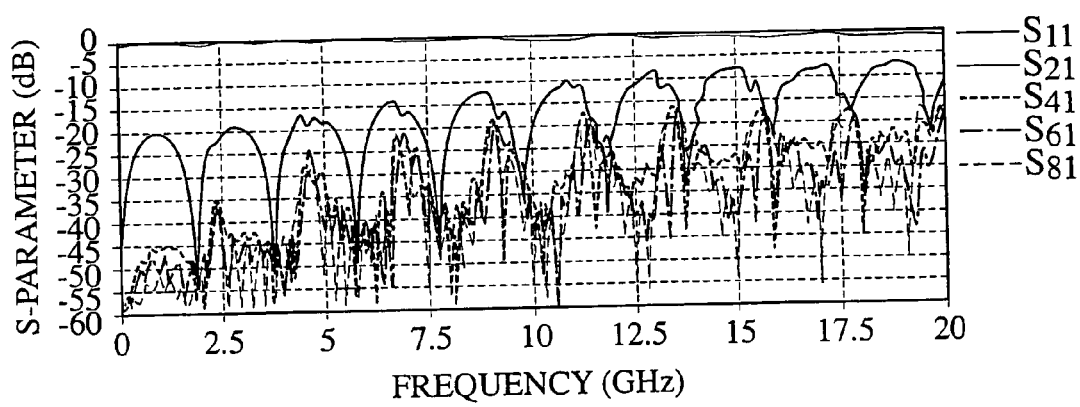

In the same way, as shown in FIG. 15A, the B type flat cable 101 is constructed having four pair cables arranged adjacently and flatly such that center lines $l_1$, $l_2$, $l_3$ and $l_4$ joining between the centers of the two wires forming each of the four pair cables $k_{12}$, $k_{34}$, $k_{56}$ and $k_{78}$ are all arranged on the same straight line $L_1$.

Figure 16A:
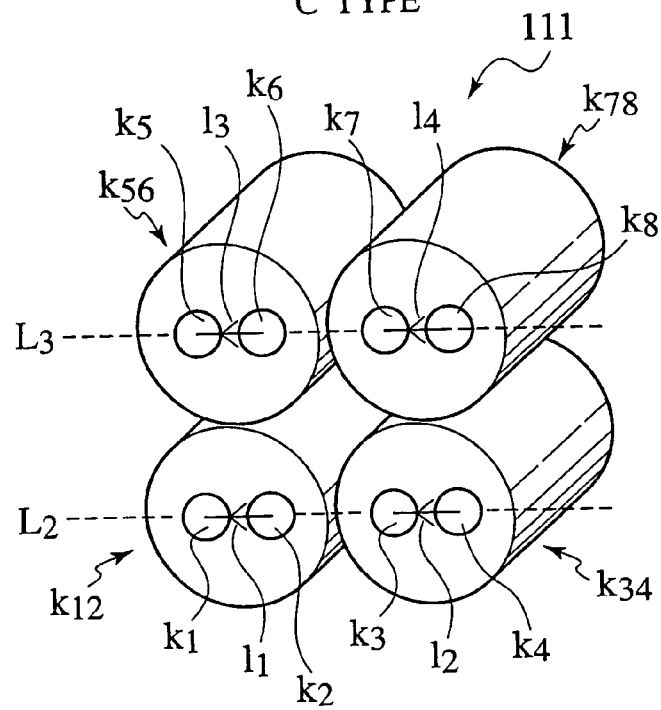
FIG. 16A shows an example of C type having an arrangement of four pair cables and FIG. 16B is a graph showing results of simulation of S-parameters for the four pair cables shown in 16A.
Figure 16B:
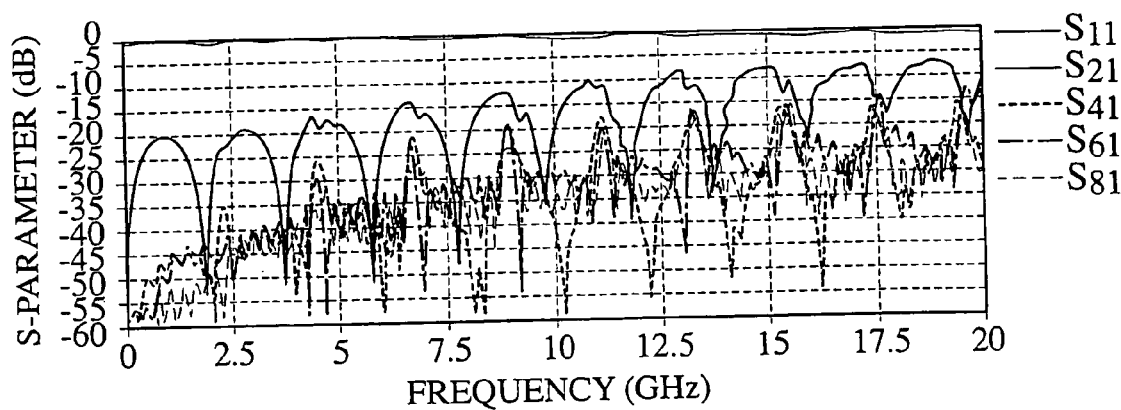

As shown in FIG. 16A, the C type flat cable 111 is constructed having two pair cables $k_{12}$ and $k_{34}$ arranged adjacently and flatly such that center lines $l_1$ and $l_2$ joining between the centers of the two wires comprising the pair cables $k_{12}$ and $k_{34}$ are all arranged on the same straight line $L_2$, further, the other two pair cables $k_{56}$ and $k_{78}$ are arranged adjacently and flatly such that center lines $l_3$ and $l_4$ joining between the centers of the two wires forming each of the other two pair cables $k_{56}$ and $k_{78}$ are arranged on the same straight line $L_3$ running parallel to the straight line $L_2$, moreover each of these sets of two pair cables (the set comprising $k_{12}$ and $k_{34}$ and the set of $k_{56}$ and $k_{78}$) are arranged one above the other such that the two straight lines $L_2$ and $L_3$ are parallel.

Figure 17A:
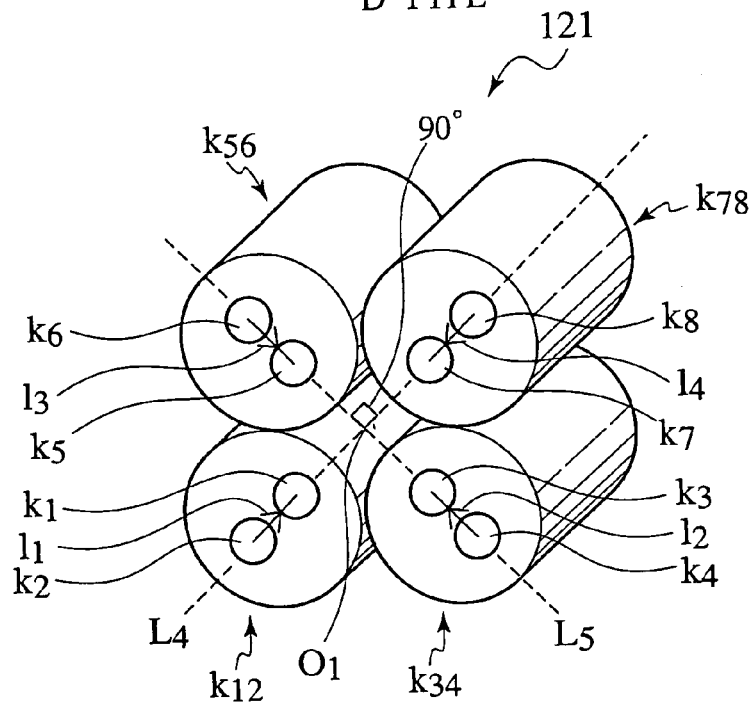
FIG. 17A shows an example of D type having an arrangement of four pair cables and FIG. 17B is a graph showing results of simulation of S-parameters for the four pair cables shown in 17A.
Figure 17B:
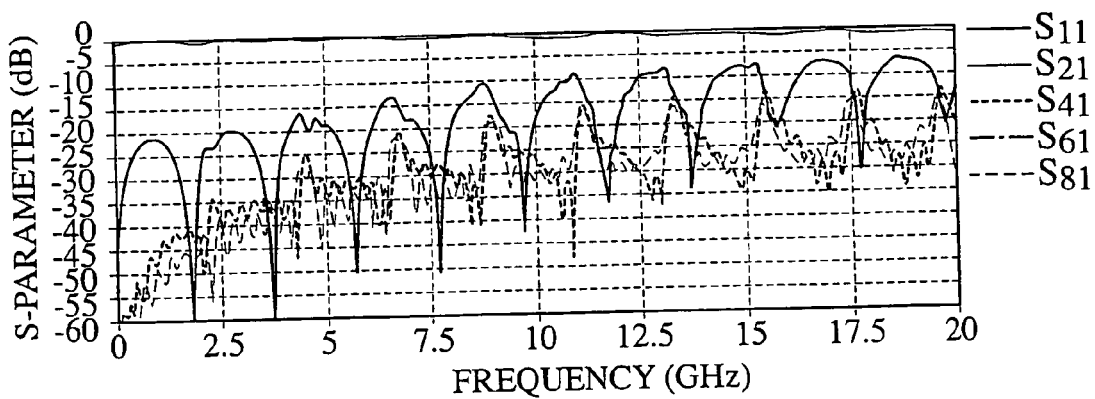

As shown in FIG. 17A, the D type flat cable 121 is constructed having center lines $l_1$ and $l_4$ joining between the centers of the two wires respectively comprising the two pair cables $k_{12}$ and $k_{78}$ arranged following along the same straight line $L_4$, further, the two center lines $l_2$ and $l_3$ joining between the two wires forming each of the two pair cables $k_{34}$ and $k_{56}$ are arranged following along the same straight line $L_5$, moreover the two sets of pair cables (the set comprising $k_{12}$ and $k_{34}$ and the set comprising $k_{56}$ and $k_{78}$) are arranged one above the other such that these two straight lines $L_4$ and $L_5$ intersect orthogonally at point $O_1$.

Figure 18A:
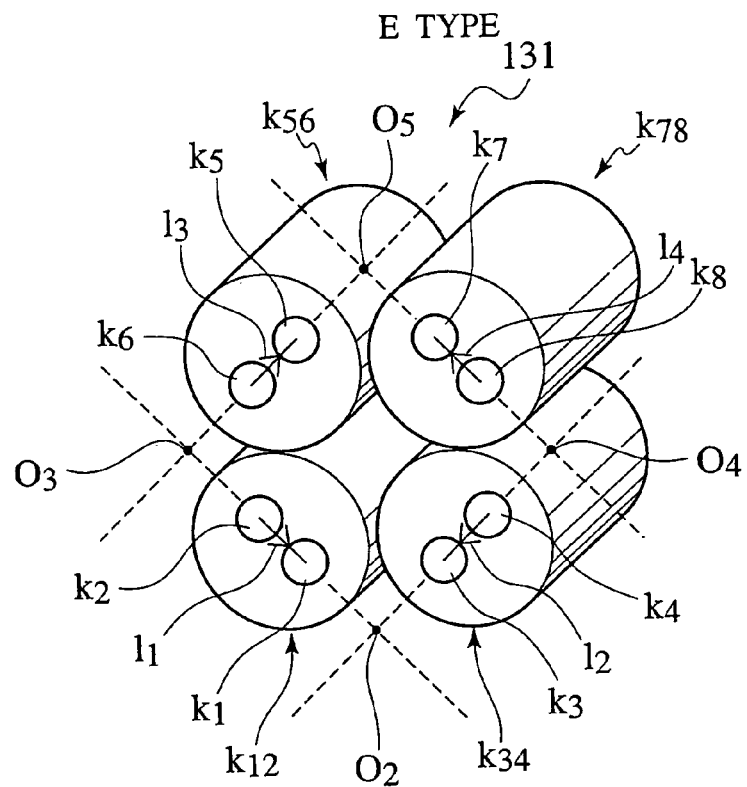
FIG. 18A shows an example of E type having an arrangement of four pair cables and FIG. 18B is a graph showing results of simulation of S-parameters for the four pair cables shown in 18A.

As shown in FIG. 18A, the E type flat cable 131 is constructed having center lines $l_1$ and $l_4$ joining between the centers of the two wires respectively comprising the two pair cables $k_{12}$ and $k_{78}$ arranged parallel, further, the two center lines $l_2$ and $l_3$ joining between the two wires forming each of the two pair cables $k_{34}$ and $k_{56}$ are arranged parallel, moreover the two sets of pair cables (the set comprising $k_{12}$ and $k_{34}$ and the set comprising $k_{56}$ and $k_{78}$) are arranged one above the other such that each of these parallel two center lines ($l_1$ and $l_4$, $l_2$ and $l_3$) intersect orthogonally at the four points $O_2$, $O_3$, $O_4$ and $O_5$. The arrows above the four center lines $l_1$, $l_2$, $l_3$, and $l_4$ in FIGS. 14A, 15A, 16A, 17A, and 18A indicate the direction of lines of electric force.

Further, FIGS. 14B, 15B, 16B, 17B and 18B show S-parameters as an indication of cross talk between pair cables in the flat cables from type A to type E. Here, a simulation was conducted of S-parameters for each pair cable under condition in which a transmission signal was transmitted from one end of pair cable $k_{12}$. $S_{11}$ is a parameter for reflection showing the ratio of reflected waves returning to another end of pair cable $k_{12}$ under the above condition. $S_{21}$ is a parameter for transmission showing the ratio of transmitted waves at another end of pair cable $k_{12}$ under the above condition. $S_{41}$ is a parameter for transmission showing transmitted waves at another end of pair cable $k_{34}$ under the above condition. $S_{61}$ is a parameter for transmission showing transmitted waves at another end of pair cable $k_{56}$ under the above condition and $S_{81}$ is a parameter for transmission showing transmitted waves at another end of pair cable $k_{78}$ under the above condition.

As is evident by viewing FIGS. 14B, 15B, 16B, 17B, 18B, 19A, 19B and FIGS. 20A, B and C, the A type flat cable (where the orientations of the electrical fields of the four flat cables are all parallel) has the lowest cross talk while the B type flat cable (where the orientations of the electrical fields of the four flat cables are all the same) has the highest cross talk. Thus, the most desirable structure for a flat cable in descending order is A→E→D→C→B. When wires are not twisted together (in other words, when arranged parallel) A type or E type structure may be employed for a flat cable.

Figure 14B:
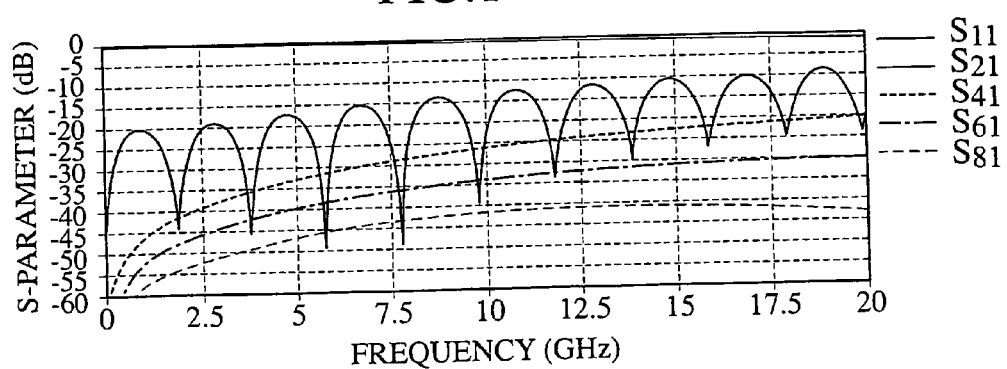

As shown in FIGS. 14A and 14B, the A type flat cable as differential signal transmission pair cable 91 (that is, four pair cables are arranged such that the four center lines ($l_1$, $l_2$, $l_3$, $l_4$) joining the center points of the two wires forming a pair are each parallel) is employed, thereby enabling a reduction in cross talk occurring between cables.

Figure 18B:
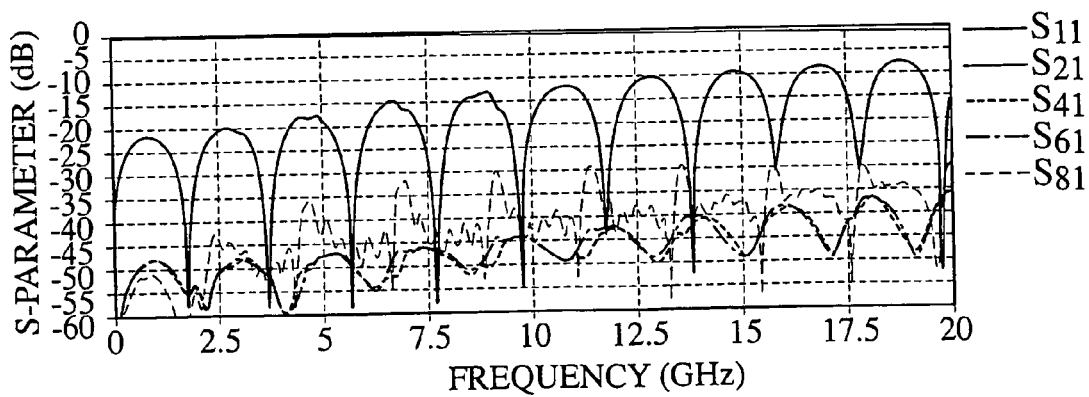
Figure 19A:
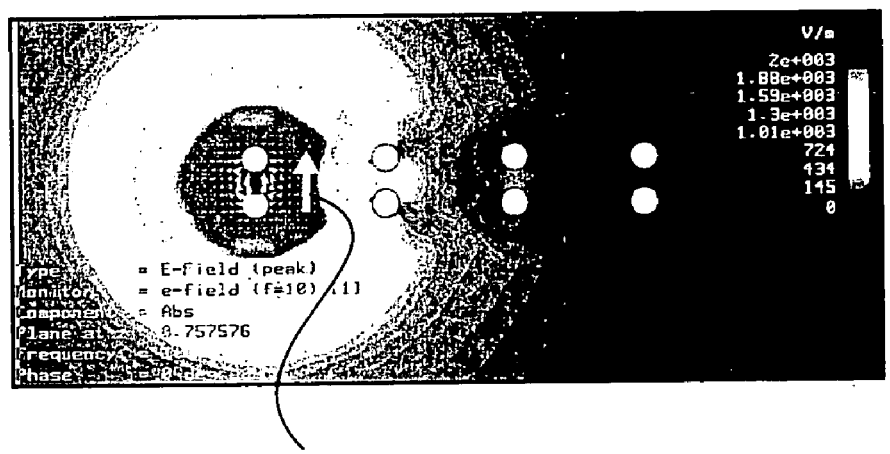
FIGS. 19A and 19B show cross talk due to differences in the arrangement of pair cables, viewed from distribution of the strength of electrical field.
Figure 19B:
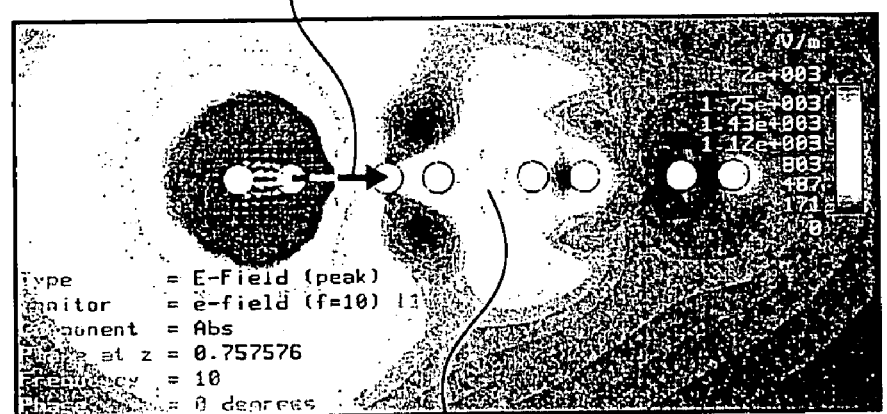
Figure 20A:
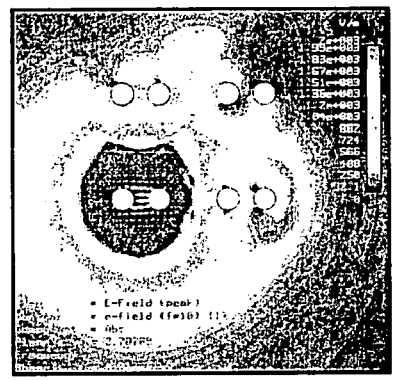
FIGS. 20A to 20C show cross talk due to differences in the arrangement of pair cables, from the viewpoint of electrical field strength distribution.
Figure 20B:
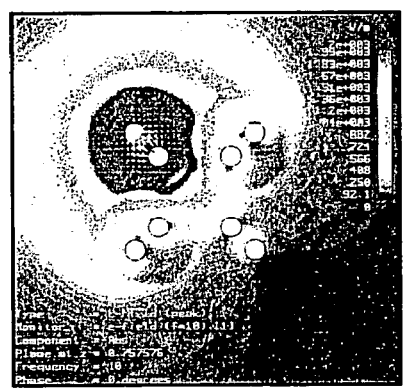
Figure 20C:
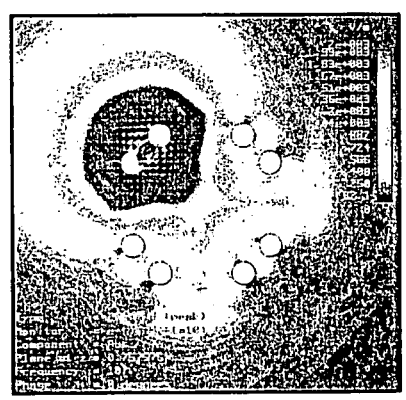

As shown in FIGS. 18A and 18B the E type flat cable as differential signal transmission pair cable 131 (that is, four pair cables are arranged such that the center lines joining the center points of the two wires forming a pair are each orthogonally disposed) is employed, thereby enabling a reduction in cross talk occurring between cables.

Further, when it is used a flat cable having a structure such that a plurality of twisted pair cables, which are comprised of two wires twisted at a prescribed pitch, are arranged adjacently and flatly, if the pitch of each twisted pair cable is made different, it is envisioned that as electromagnetic interference would occur only locally, practically, this would result in a tendency to cross talk like that occurring in the case of the E type flat cable shown in FIGS. 18A and 18B.

(Examples of Driver Circuits and Receiver Circuits)

Figure 21A:
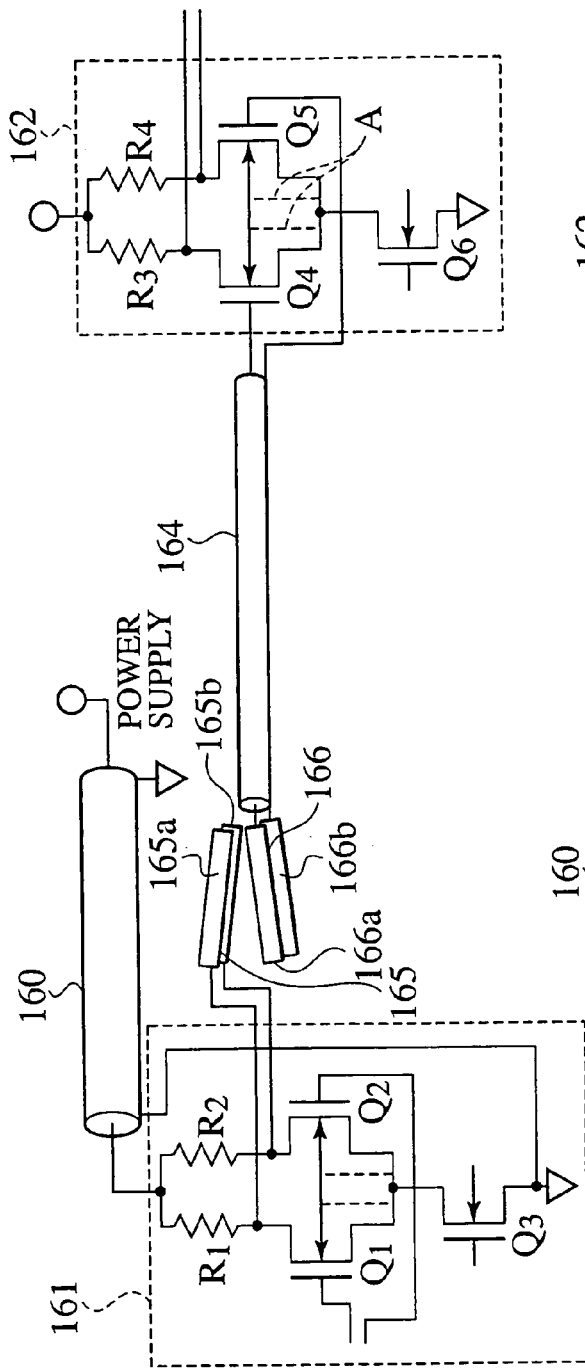
FIG. 21A shows a directionality coupling system for the sending end of an nMOS differential driver/receiver and FIG. 21B shows a capacitive coupling system for the sending end of a CMOS single end driver/receiver.
Figure 21B:
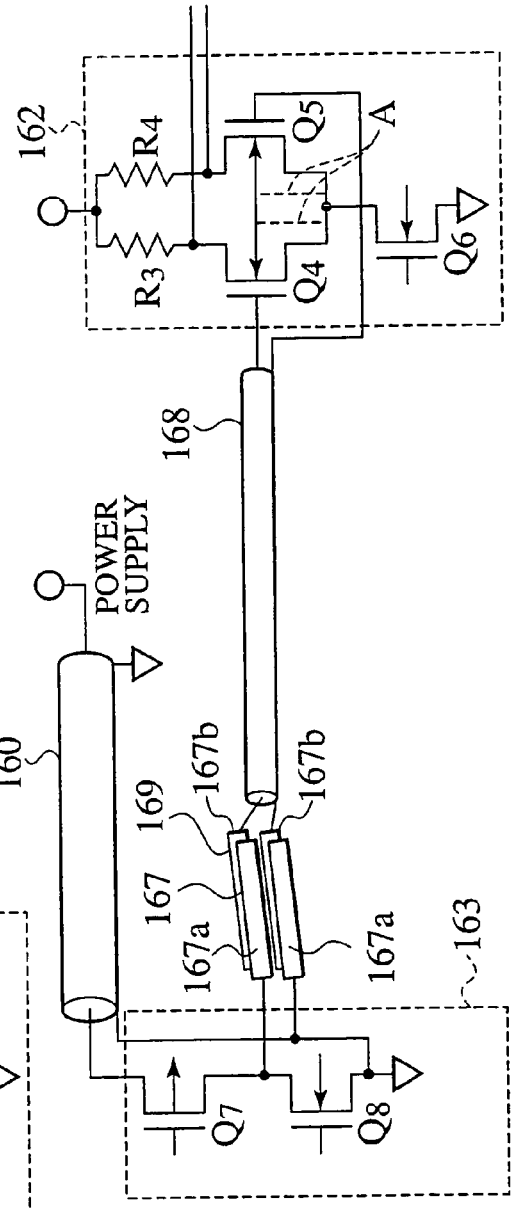
Figures 23A, 23B:
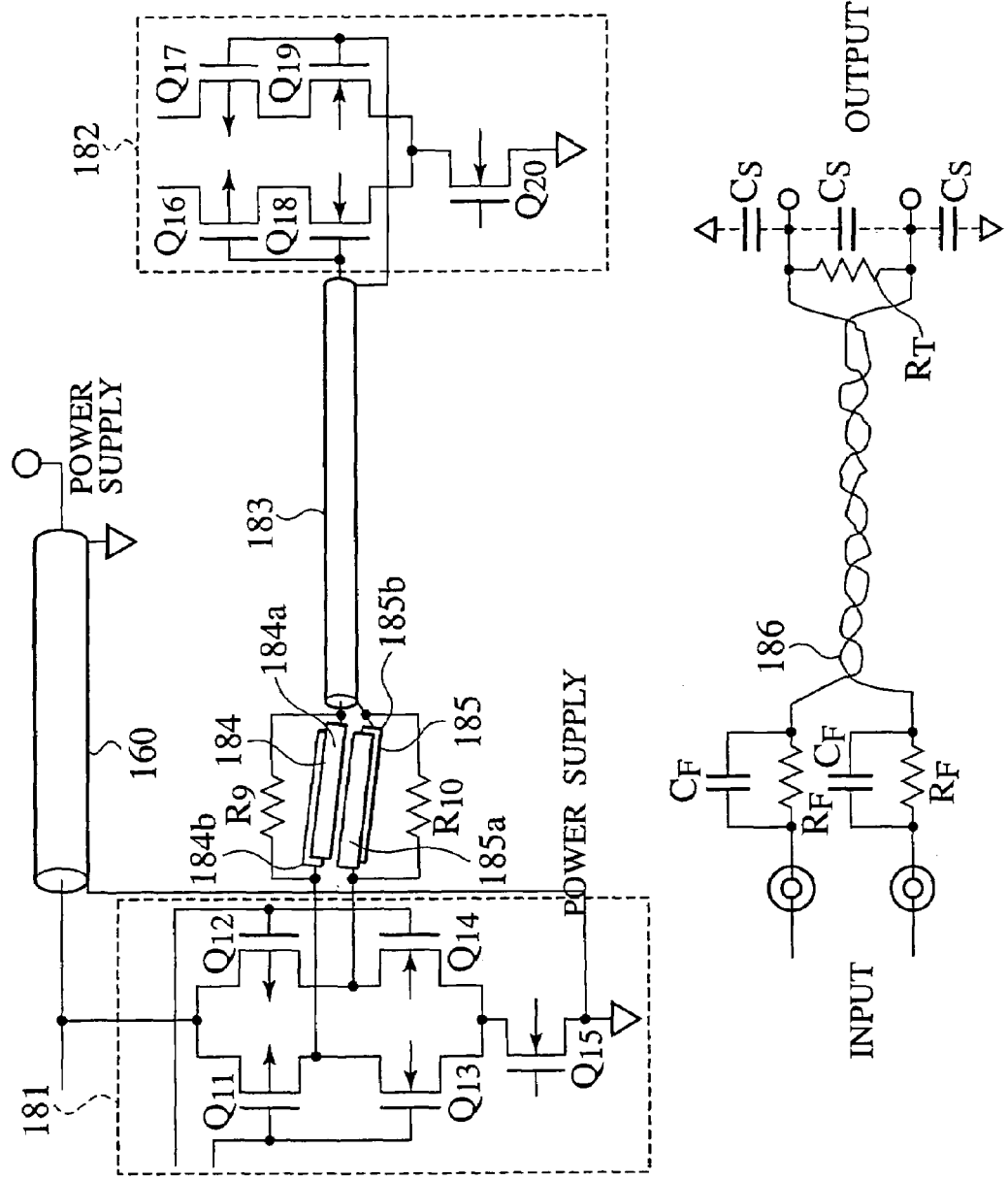
FIG. 23A shows an improved system for an LVDS type circuit and FIG. 23B shows a twisted pair cable.

FIGS. 21A and 21B through to FIGS. 23A and 23B show a second exemplary configuration of inter functional circuit block transmission systems comprising a driver circuit and a receiver circuit connected by a long transmission cable. In these examples a single end type differential circuit being used for a differential circuit, in a system providing directionality or capacitance couplers.

Figures 22A, 22B:
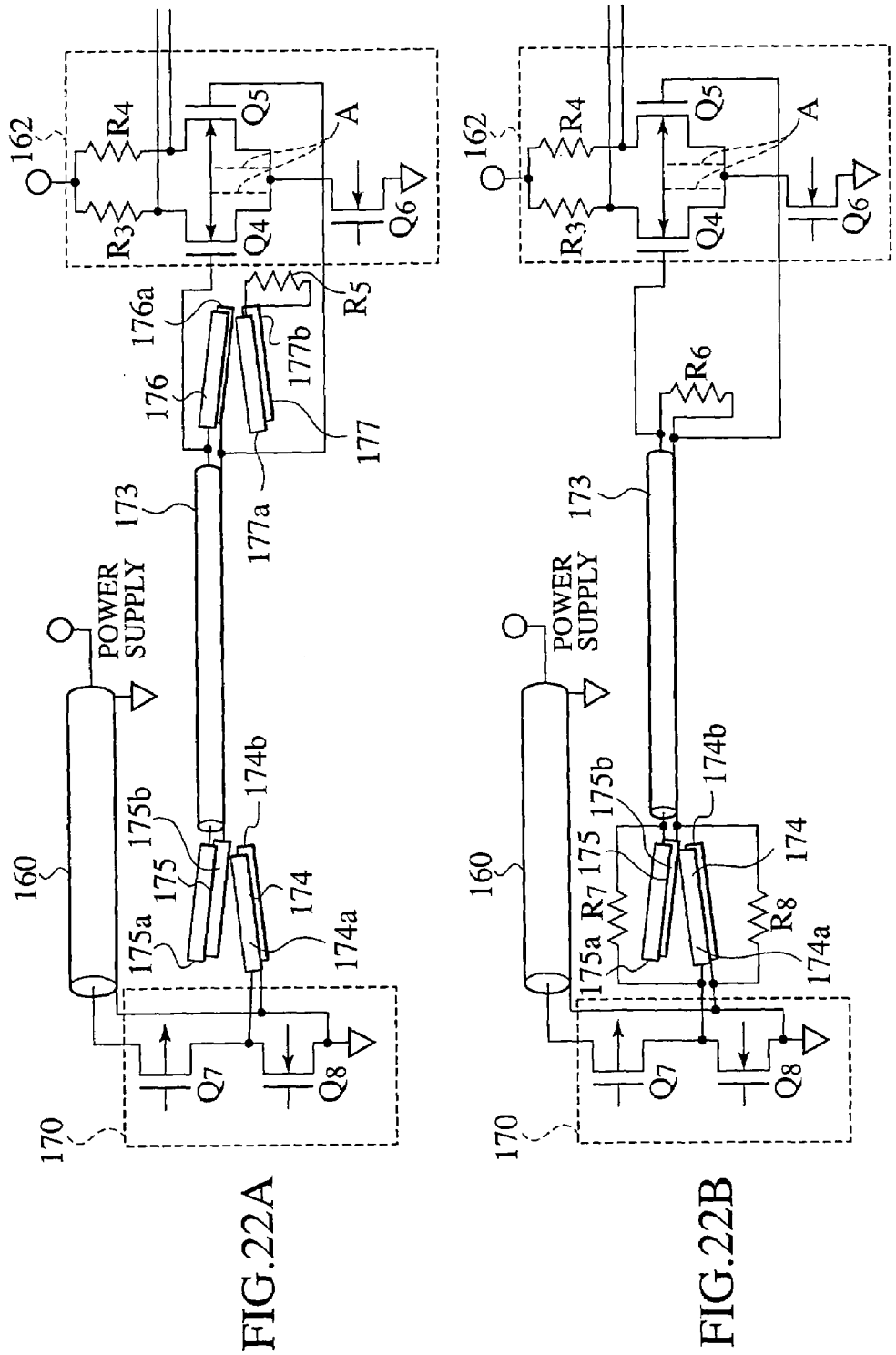
FIG. 22A shows a capacitance coupling system or a resistance type double coupling system for the end terminal of a CMOS single end driver/receiver and FIG. 22B shows a sending end coupling system of a CMOS single end driver/receiver.

FIG. 21A shows a system for an nMOS differential driver-receiver circuit, coupled with a directionality coupler at the sending end of the driver circuit. FIG. 21B shows a system for a CMOS single end type driver-receiver circuit coupled with a capacitance coupler at the sending end of the driver circuit. FIG. 22A shows a system for a CMOS single end type driver-receiver circuit coupled with a capacitance coupler or a directionality coupler at the sending end of the driver circuit, and coupled with a capacitance coupler or double coupling with a directionality coupler of an end resistance type at the terminating end of the receiver circuit of the transmission cable. FIG. 22B shows a system for a CMOS single end type driver-receiver circuit coupled with a directionality coupler or a directionality coupler at the sending end of the driver circuit, and coupled with resistance at the end of the receiver circuit side of the transmission cable. FIG. 23A shows an improved system using an LVDS type circuit and FIG. 23B shows a twisted pair cable.

Conventionally, in an inter functional circuit block transmission system having a driver circuit comprising a single inverter, a transmission cable is formed as a set of a signal line and ground line, and differential signals (in other words, complimentary signals) are made by the complimentary role realized by these signal and ground lines, and are received at the receiving end of the differential receiver circuit as a differential signal (referred to the following Documents 1, 2 and 3). This inverter has impedance within the range from 50 Ω to 100 Ω, and has a structure referred to substrate ground of LSI, that is, standard ground.

Document 1: K. Otsuka, et al., "Measurement Potential Swing by Electric Field on Package Transmission Lines", Proceedings of ICEP, pp490–495, April 2001.

Document 2: K. Otsuka, et al., "Measurement Evidence of Mirror Potential Traveling on Transmission Lines", Technical Digest of 5th VLSI Packaging Workshop of Japan, pp27–28, December 2000.

Document 3: K. Otsuka and T. Suga, "Stacked Pair Cables", Japan Institute of Electronics Packaging, Vol. 4, No. 7, pp556–561, November 2001.

One of characteristics of the present invention is that the pair of MOS transistors inside the differential receiver circuit are in the same well structure (Japanese Patent Application 2002-22708), and further the differential receiver circuit is not connected to substrate ground (reference ground). In this case, even if for example, common mode noise exists in the transmission cable and the electric potential of the complimentary signal is at variance with standard electric potential, the difference in electric potentials can be correctly detected in the same well structure so the transmission signal can be correctly received without reliance on ground. However, when it is necessary to prevent latch up due to substantial vibration, the lower part of the gate must be connected to the current control MOS drain as shown by the dotted line A for the receiver circuit 162 in FIGS. 21A, 21B, 22A and 22B. Structures, such as SOL and the like, having no relationship with latch-up, do not require such a connection.

FIG. 23A shows a system in which the ground present in conventional transmission cables is eliminated, the end termination of the transmission cable being provided from a directionality or capacitance coupler instead. Here, the receiver circuit 182 may be a single end type receiver circuit. Further, even in an ECL type circuit not shown in the drawings, in the same way, ground is removed and end termination provided by a directionality or capacitance coupler.

Each kind of coupler installed as end termination for the transmission cables shown in FIGS. 21A, 22A and 22B will now be described in detail. These couplers prevent multiple reflections while blocking direct current.

In the driver-receiver circuit shown in FIG. 21A the directionality couplers 166 (166a, 166b) and 165 (165a, 165b) are coupled to the end terminal of the differential signal transmission pair cable 164 driver circuit side and the sending end of the driver circuit 161. Here, both the input terminal 166a of the directionality coupler 166 and the output terminal 165a of the directionality coupler 165 are open-ended terminals. Therefore, direct electric current does not flow. That is, the flow of electric charge stops at the output terminal 165a of the directionality coupler 165 and the moved electric charge is maintained. This configuration is ideal when the directionality couplers 165 and 166 are short in length.

However, when the directionality couplers are of a longer length, reflection occurs at the output terminal 165a of the directionality coupler, and corresponding thereto, reflected waves return to the differential signal transmission pair cable 164. Therefore, the length of the directionality coupler must be suitable for a range below 1/40 of wavelength λ. Accordingly in order to realize this kind of circuit structure, it is preferable for the directionality coupler to be inside the semiconductor chip.

In this way, a transmission cable structure (for transmitting signals having GHz frequency band) having a differential signal transmission pair cable 164, that is connected to the driver circuit 161 and the receiver circuit 162, transmitting differential signals having GHz frequency band, is provided. In this transmission cable structure, the differential signal transmission pair cable 164 has directionality couplers 165 and 166 that have two sets (first parallel electrodes 165a, 165b and second parallel electrodes 166a, 166b) of long shaped planar parallel electrodes, and inputs differential signals into one end of the first parallel electrodes 165a and 165b, and is connected to one end of the second parallel electrodes 166a and 166b. Further, in this differential signal transmission pair cable 164, the differential signals are transmitted by positioning the first parallel electrodes 165a and 165b and the second parallel electrodes 166a and 166b in mutual proximity, thereby enabling multiple reflections to be prevented while interrupting direct current (details of the directionality coupler are described subsequently).

In contrast to the directionality couplers 165 and 166 shown in FIG. 21A, the arrangement shown in FIG. 21B adds capacitance couplers 167 and 169 in series as end terminals of the side of the deriver circuit 161 of the differential signal transmission pair cable 164. As shown in FIG. 21B, when the capacitance couplers 167 and 169 are a long shape, a structure in which the capacitance couplers 167 and 169 are inside a semiconductor chip, in the same manner as applies with respect to the system shown in FIG. 21A, is preferable. Further, as the capacitance coupler structure shown in FIG. 21B becomes longer when disposed on a printed substrate, a chip capacitor can be used instead, thereby enabling a shorter length to be attained.

In this way, a transmission cable structure (for transmission of signals having GHz frequency band) having a differential signal transmission pair cable 168, that is connected to the driver circuit 163 and the receiver circuit 162, transmitting differential signals having GHz frequency band, is provided. In this transmission cable structure, the differential signal transmission pair cable 168 has capacitance couplers 167 and 169 that have two sets (first parallel electrodes 167a, 167b and second parallel electrodes 169a, 169b) of long shaped planar parallel electrodes, and inputs the differential signals into one end of the first parallel electrodes 167a and 167b, and is connected to one end of the second parallel electrodes 169a and 169b. Further, in this differential signal transmission pair cable 168, the differential signals are transmitted by positioning the first parallel electrodes 167a and 167b and the second parallel electrodes 169a and 169b in mutual proximity, thereby enabling multiple reflections to be prevented while interrupting direct current (details of the directionality coupler are described subsequently).

FIG. 22A provides an example of a configuration having directionality couplers (or capacitance couplers) 174 and 175 at the output terminal of the driver circuit 170. The directionality couplers (or the capacitance couplers) 174 and 175 plays a role in propagating only electromagnetic energy at times when the driver circuit 170 transits between on-off states, in the direction of the transmission cable 173, so there is no buildup of electric charge in the transmission cable 173. The receiver circuit 162 operates by instantaneously detecting the transitioning energy, at which times the transitioning energy moves to the directionality couplers (or capacitance couplers) 176 and 177 at the subsequent stage and is absorbed at terminating resistance $R_5$, so a latch circuit needs to be added at stages subsequent to the receiver circuit 162.

This is a method by which the receiver circuit 162 is only operated by energy of electromagnetic waves (signal) at times of the transition, thus making the receiver circuit 162 operate in reaction to a reverse signal. Because the terminating resistance $R_5$ is inserted in the output terminal 177b of the directionality coupler 177, there are no reflected waves as electric charge is discharged instantaneously.

If capacitance couplers are used instead of the directionality couplers 176 and 177 shown in FIG. 22A, terminating resistances ($R_3$, $R_4$) are coupled between drain terminals of the receiver circuit 162, and the resistance value of these terminating resistances $R_3$ and $R_4$ is adjusted by a range from 50Ω to 1 MΩ. Accordingly, the electric charge can be discharged before the next clock comes.

FIG. 22B provides an example coordinated to the differential signal transmission pair cable 173 having high speed performance. Here, only electromagnetic waves at times when the directionality coupler of the differential signal transmission pair cable 173 transitions between on-off states is propagated, and the receiver circuit 162 instantaneously reacts in response to the transition energy, and then the transition energy is absorbed at terminating resistance $R_6$. The terminating resistance $R_6$ in this case is matched to the characteristic impedance of the transmission cable 173.

The principles of operation of the above-described systems will be described subsequently, however, the directionality coupler plays a role as a smoothing high pass filter that passes high frequencies within a range from 100 MHz up to tens of GHz. It is sufficient for the capacity of the capacitance coupler to be within the range from 10 pF to 100 pF.

In the driver-receiver circuit shown in FIG. 23A the differential signal transmission pair cable 183 is of a structure that does not reference ground. Further, this structure provides end terminal for the driver circuit side of the differential signal transmission pair cable 183 in the form of directionality couplers (or capacitance couplers) 184 and 185. A conventional receiver circuit is suitable for the receiver circuit 182. In this exemplary configuration, as only electromagnetic energy at times of transition between on-off states of the driver circuit is propagated on the transmission pair cable 183, a latch circuit is required at stages subsequent to the receiver circuit 182. In this configuration any one of the transmission cable structures shown in FIGS. 21A and 21B to FIGS. 22A and 22B may be substituted or a receiver circuit also can be substituted.

As shown in FIGS. 21A and 21B to FIGS. 23A and 23B the power supply and ground form a pair cable. Here, when resistance of a transistor of an inverter forming the driver circuit is within a range from 500Ω to 1 kΩ and characteristic impedance $Z_{0s}$ of the transmission cable is 50 Ω, then the amplitude v of the transmitted signal is within a range from v=from $V_{dd}\times(50/550)$ to $V_{dd}\times(50/1050)$. Thus, since the receiver circuit becomes a sensor amplifier that detects these levels, the above described differential circuit structure is preferable.

In the case of a 10 GHz pulse signal the maximum value for rising time $t_r$ of voltage and the trailing time $t_f$ of the voltage is 35 ps and is normally shorter than this value. As a transmission cable coupler can be used with changes occurring at such high-speed, the pulse signal can be transmitted by the function of a direct current blocking filter. Even in the case of control signals having substantial direct current flow elements for enable/acknowledge, such as CAS, RAS or CS, used for DRAM and the like, sufficient electric charge can be maintained as gate charge of a sensor amplifier comprising the receiver circuit, such that the pulse signal can be received, and the pulse signal can be kept at a subsequent latch.

As shown in FIG. 23A, if terminating resistances ($R_9$, $R_{10}$) are serially connected from the viewpoint of the driver-receiver circuits, for a control signal having a substantial direct flow component, problems may arise in designing a chip device based on concentrated constant circuits as electric current is normally expended in this resistance.

However, in order to prevent the phenomena whereby the corresponding to the width of a signal the amplitude of the signal changes, there are cases where it is preferable to insert resistance for matching a directionality coupler or capacitance coupler with the signal level indicated by the clock pulse (that is, lowering the amplitude level), as shown in FIGS. 22B and 23A.

The relationship between this resistance and capacity in the present invention should be set as $$R_T/(R_F+R_T)=C_F/(C_{ST}+C_F) \tag{4}$$

or $$R_T/(R_F+R_T)=\alpha_{CF}/(C_{ST}+C_F), \text{ where } \alpha=0.7 \text{ to } 1.3. \tag{5}$$

In a circuit in which a directionality coupler or capacitance coupler are not installed at the end of the differential signal transmission pair cable, current flowing in this resistance is simply loss, but in the case of the present invention, there is the advantage that current can be controlled for this resistance component only, to a greater extent than in the case of conventional terminating resistance type circuits.

(The Relationship Between Capacity and Resistance Shown in FIG. 23B)

A differential signal pair outputted from the driver circuit is inputted respectively into one end of each of a resistor $R_F$ and a condenser $C_F$ connected in parallel, and inputted into twisted pair cable 186 connected to the respective other ends of this resistor $R_F$ and condenser $C_F$. Further, the other end of the twisted pair cable 186 is connected to terminating resistance $R_T$ and both ends of this terminating resistance $R_T$ are connected to the input terminals of the receiver circuit. Furthermore, the total stray capacitance arising around the terminating resistance $R_T$ is defined as $C_{ST}$. In this situation, the rate of attenuation $A_{TR}$ of low frequency waves is described as $$A_{TR}=R_T/(R_F+R_T). \tag{6}$$

For high frequencies, the rate of attenuation $A_{TC}$ is described as $$A_{TC}=C_F/(C_{ST}+C_F). \tag{7}$$

In eye pattern analysis, the condition for opening the eyes of eye patterns is fulfilled when the rates of attenuation of the expressions (6) and (7) are the same. That is, $$R_T/(R_F+R_T)=C_F/(C_{ST}+C_F). \tag{8}$$

Here, as the signal process must be performed at the speed of electromagnetic waves, the terminal couplers ($C_F$, $R_F$) and terminating resistance $R_T$ are made of metal. Thus, the speed of movement of electric charge in cable or the resistance of poly crystal semiconductors is $5\times10^4$ m/s when a saturation electric field is applied, and this value of the speed of movement of electric charge is three digits smaller in comparison to the speed of electromagnetic waves. Therefore, the cable or resistance of poly crystal semiconductors cannot be used.

Further, because the resistance load $R_L$ totaled from the driver circuit and terminal (this means load resistance from viewpoint of power supply) is 550 Ω to 1050 Ω, characteristic impedance $Z_{0p}$ of the power supply ground pair cable need not be small. That is, where electrical energy is supplied to n signal drivers by one power supply ground pair cable, $R_L/n>Z_{0p}$ is sufficient (Japanese Patent Publication No. H11-284126 and Japanese Patent Publication No. 2000-174505).

It is also sufficient, instead of expression (8), for $$R_T/(R_F+R_T)=\alpha C_F/(C_{ST}+C_F), \text{ where } \alpha=0.7 \text{ to } 1.3 \tag{9}$$

(Energy Charge in a Transmission Cable)

Figure 24:
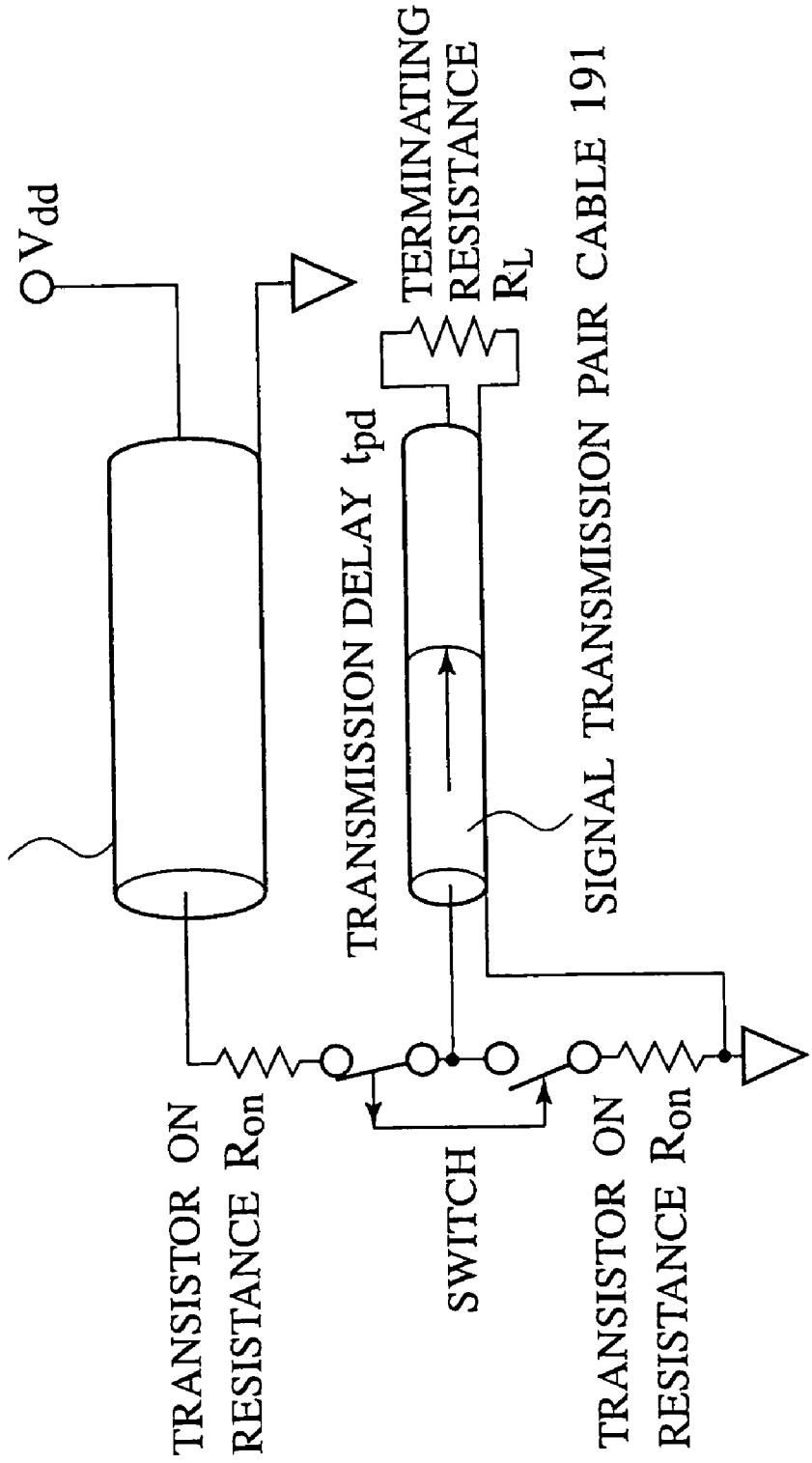
FIG. 24 shows the principles of movement of electrical energy.

FIG. 24 is an explanatory drawing showing a mechanism by which electrical energy is charged in a transmission cable.

Generally, the load at the instant the transistor connected to power supply $V_{dd}$ is turned on is the total of on resistance $R_{on}$ of the transistor and characteristic impedance $Z_{0s}$ of the signal transmission pair cable 191. Thus, electrical current $i=V_{dd}/(R_{on}+Z_{0s})$ flows in the shorter time from among pulse on time $t_{on}$ (the time the transistor is on) and the time of [transmission delay] $t_{pd}$. If the signal energy reaches terminating resistance $R_L$ after time $t_{pd}$, the effect of load $Z_{0s}$ ceases, and $R_L$ exerts an effect instead. In this case, as $Z_{0s}=R_L$, the value of electrical current i shown in above expression does not change, thus, the amount of electric charge moving inside time $t_{on}$ of one instance of pulse on time is obtained by $Q=i\times t_{on}$.

Figure 1:
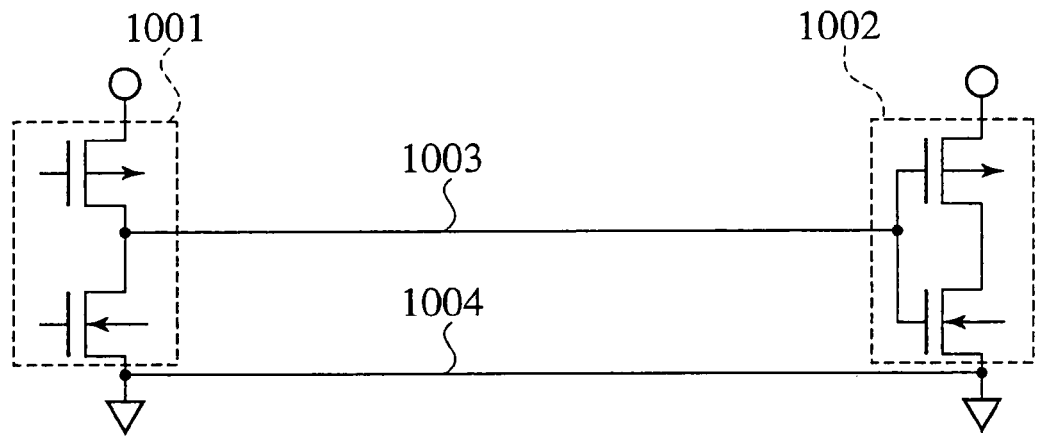
FIG. 1 shows a conventional signal line and ground line for connecting a driver circuit and a receiver circuit.

When a transistor connected to ground enters an on condition (that is, the input signal transitions to high) and the power supply side is off, since the signal level matches the level of ground, there is no electric current flowing inside the transmission cable (i=0) and all electric charge inside the transmission cable changes to thermal energy due to terminating resistance. In other words, when a transistor connected to ground enters an on condition, electric charge does not flow, the transistor does not apparently operate. Accordingly, the pulse off signal does not require energy enabling energy to be conserved in comparison to the conventional differential circuits shown in FIGS. 2 and 3. However, the present invention is inferior in terms of energy to the conventional driver-receiver circuit shown in FIG. 1, wherein the amount of electric charge (energy) $Q=C_L\times V_{dd}$ requires only the amount of electric charge $C_L$. The present invention provides the directionality coupler or the capacitance coupler as a solution to this problem.

(Power Supply Ground Pair Cables)

Figure 2:
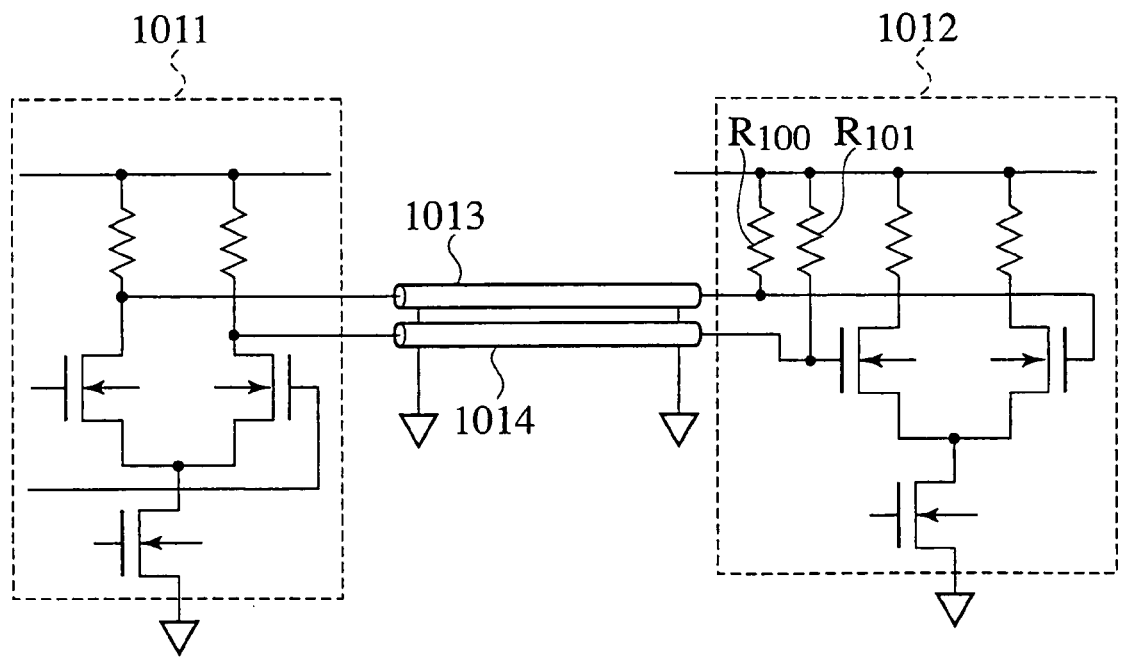
FIG. 2 shows a conventional transmission cable connected to a CML type differential circuit.
Figure 3:
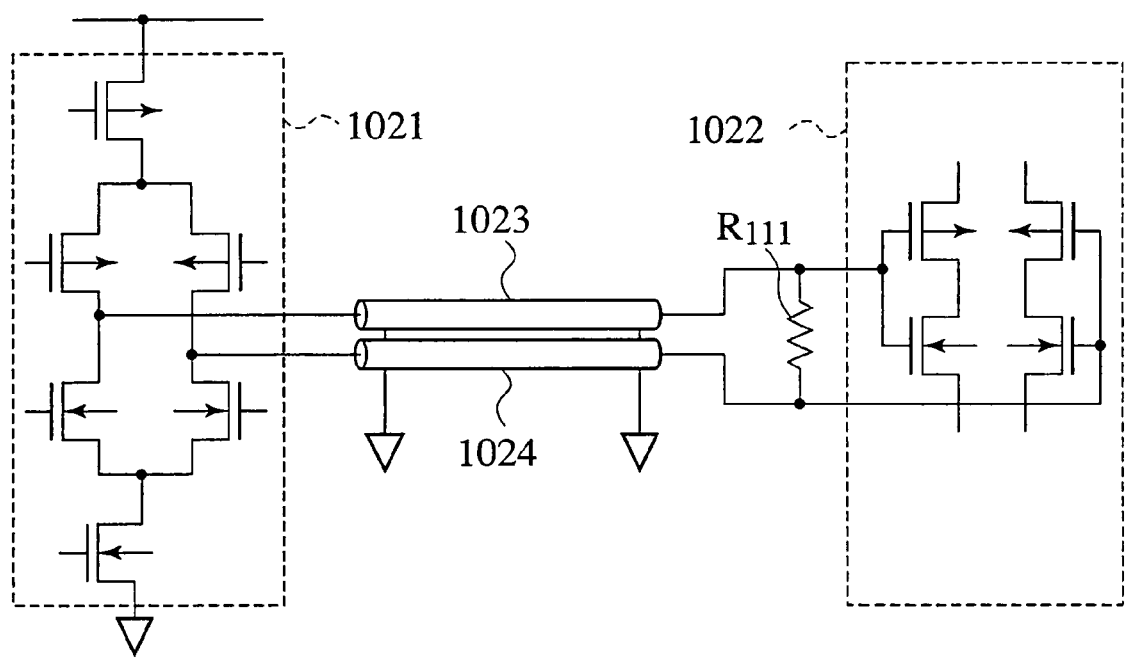
FIG. 3 shows a conventional transmission cable connected to an LVDS type differential circuit.

Since the differential circuits shown in FIGS. 2 and 3 form current switches, direct current constantly flows and fluctuations of power supply and ground do not occur. Thus, these differential circuits can be considered the ideal circuit for high speed signal transmission without requiring any particular device for power supply and ground structure.

However, when these differential circuits perform switching operations, total capacitance between transistor drain sources and capacitance between drains and substrate ground become inverted due to changes in electric potential occurring during switching operations, leading to a process of discharge and charge causing an extremely steep spike current to flow. This kind of spike current cannot be prevented simply by inserting a bypass capacitor having inductance.

For example, in the case of a pulse signal having 20 GHz frequency both rising time $t_r$ and trailing time $t_f$ must be values below 17.5 ps. Here, if $V_{dd}=1$V, $R_{on}+R_L=(950+50)$ Ω and i=1 mA (0.1V amplitude), even with bypass capacitor inductance at a small value $L_c=100$ pH, power supply drop voltage obtained is $V_{drop}=L_c\cdot di/dt=100$ pH·1 mA/17.5 ps=5.7 mV. In this case, ten driver circuits cannot be supplied with power by one power supply. That is, $V_{drop}=57$ mV. Apart from this, if as skew of current switch or differences in operating characteristics of nMOS and pMOS such as LVDS type differential circuit a condition arises in which fluctuations of power supply/ground cannot be controlled (Power Supply and Ground)

FIG. 24 shows power supply and ground of the present invention. As described above, a cable having essentially no stray capacitance or inductance is suitable for power supply/ground cable 192. Here, maximum allowable current $l_{max}$ from the intrinsic impedance $Z_{0p}$ of this power supply/ground cable 192 is $l_{max}=V_{dd}/Z_{0p}$, here $V_{dd}$ shows power supply voltage. If $V_{dd}=1$V, $Z_{0p}=25$ Ω, electric current $l_{max}=4$ mA without frequency characteristics is supplied instantaneously to a transistor. Here, "instantaneously" means carrier speed, (that is, speed of electron electric field saturation: $5\times10^4$ m/s) that is the speed at which electric charge charges the transistor, is three digits smaller than the speed of electromagnetic waves $\{1.5-3\times10^8$ m/s).} In order to ignore the electric inertia that arises at such times, it is sufficient in the exemplary configuration shown in FIG. 24 that the terminating resistance $R_L$ of the differential signal transmission pair cable 191 be smaller than on resistance $R_{on}$ of the transistor. For example, If $V_{dd}$=1V, $R_{on}+R_L$=(950+50) Ω, then i=1 mA (amplitude 0.1V), thus, even if 10 differential circuits are operated, consumption of 25% of $1_{max}$ is sufficient. This 25% aberration cannot be ignored, but as described, the electron carrier speed in a transistor being 3 digits slower than the speed of electromagnetic waves mitigates this aberration such that in practice no problem arises. Accordingly the above described condition $Z_{Opp}<Z_{Os}/n$ is sufficient.

(Directionality Couplers)

FIGS. 25A to 25C show the structures of first and second directionality couplers according to the present invention.

The depth wise direction (direction of L) of the first directionality coupler 201 and second directionality coupler 202 shown in FIGS. 25A to 25C represents the direction of transmission of differential signals (electromagnetic waves) and the path for transmitting differential signals inside these directionality couplers 201 and 202 of differential signal transmission is the pair of wires arranged vertically; in the case of directionality coupler 201, the pair of 201f and 201g (201f–101g), and in directionality coupler 202, the pair of 202g and 202i (202g–202i). This is called a stacked pair cable.

These pair of wires (201f–201g, 201h–201i, 202f–202g, and 202h–202i) are parallely disposed with extremely narrow intervals therebetween, respectively, GAPS 201d, 201e, 202d and 202e, such that electromagnetic energy moves freely between adjacent pair cables; in the case of the first directionality coupler 201, between stacked pair cables 201f–201h and 201g–201i, and in the case of the second directionality coupler, between stacked pair cables 202f–202h and 202g–202i.

The difference between the first and second directionality couplers 201 and 202 is the composition of the insulating material disposed around the wires disposed in the upper and lower parts. That is, in the first directionality coupler 201 shown in FIG. 25A the lower wires 201h and 201i form the first parallel electrode, and these lower wires are accommodated in an insulating layer of quartz (quartz layer) $SiO_2$, while the upper wires 201f and 201g forming the second parallel electrode are accommodated in an insulating layer of air (air layer).

Further, in the second directionality coupler 202 shown in FIG. 25B the lower wires 202h and 202i form the first parallel electrode, and these lower wires are accommodated in an insulating layer of quartz (quartz layer) $SiO_2$, while the upper wires 202f and 202g forming the second parallel electrode are accommodated in an insulating layer 203 of aluminum AL (aluminum layer).

Since electromagnetic space has scale invariance, the size of the directionality couplers 201 and 202 can be done scale transformation in three dimension. In the light of this characteristic, one example of the size for the directionality couplers 201 and 202 is as shown in FIG. 25D. Further, in the plan view shown in FIG. 25C, port 1 is an input terminal into which are injected signals transmitted from the driver circuit and port 2 is an output terminal for taking electromagnetic energy (moving between) adjacent stacked pair cables (in the case of directionality coupler 201, stacked pair cables 201g–201i, and in the case of directionality coupler 202, stacked pair cables 202g–202i) and for outputting that electromagnetic energy to the differential signal transmission pair cable (or the receiver circuit connected to the end terminal thereof). The other ends are open ends.

The functions of the directionality coupler will now be described.

Generally, an electromagnetic wave that has transverse components in the forward direction only of a transmitted signal is called a TEM wave (Transverse Electromagnetic wave). TEM waves are a waveguide mode within a transmission cable. The speed $c_0$ of an electromagnetic wave propagated in the air is $c_0=1/(\mu_0 \in_0)^{1/2}=3\times 10^8$ m/s, here $\mu_0$ is rate of permeability in a vacuum and $\in_0$ is rate of permittivity in a vacuum. However, the speed v of electromagnetic waves within insulating material is dependent on relative permeability $\mu_r$ and relative permittivity $\in_r$, that is, $v=c_0/(\mu_r \in_r)^{1/2}$. If $\in_r=4$ and $\mu_r=1$, then $v=1.5\times 10^8$ m/s (that is, one half the speed of electromagnetic waves in a vacuum).

When the first directionality coupler 201 shown in FIG. 25A is used, because the speed of electromagnetic waves in the air layer is twice as fast as the speed of electromagnetic waves in the insulating layer, for TEM waves at the starting point (port 1), TEM mode gradually breaks down while the TEM waves proceeding through the stacked pair cable 201f–201h. This makes the coupling between the wires 201f and 201h forming the stacked pair cable weak, and the effective electromagnetic space expands. Thus, the coupling between the stacked pair cable is strong and electromagnetic energy moves easily to the neighboring stacked pair cable 201g–201i.

The results, expressed as S-parameters, of a simulation of this phenomena performed using three dimensional electromagnetic analysis software are shown in FIGS. 26A to 26C and 27A through 27C.

Figure 26A:
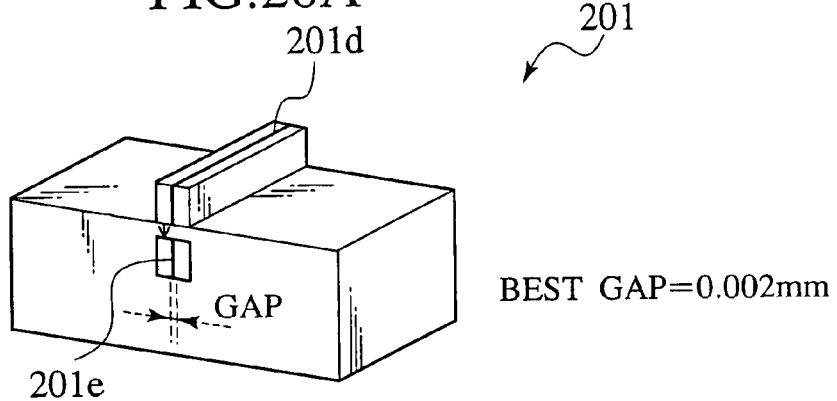
FIG. 26A shows the structure of the first directionality coupler.
Figure 26B:
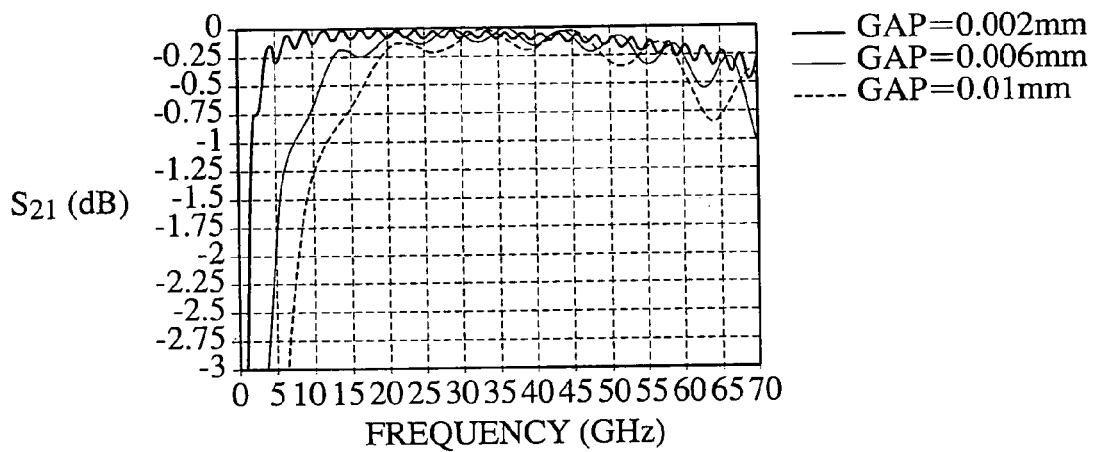
FIG. 26B shows the characteristics of the frequency of energy conveyed from port 1 to port 2 when the GAP of the first directionality coupler is altered in three stages, 0.002, 0.006 and 0.01 mm
Figure 26C:
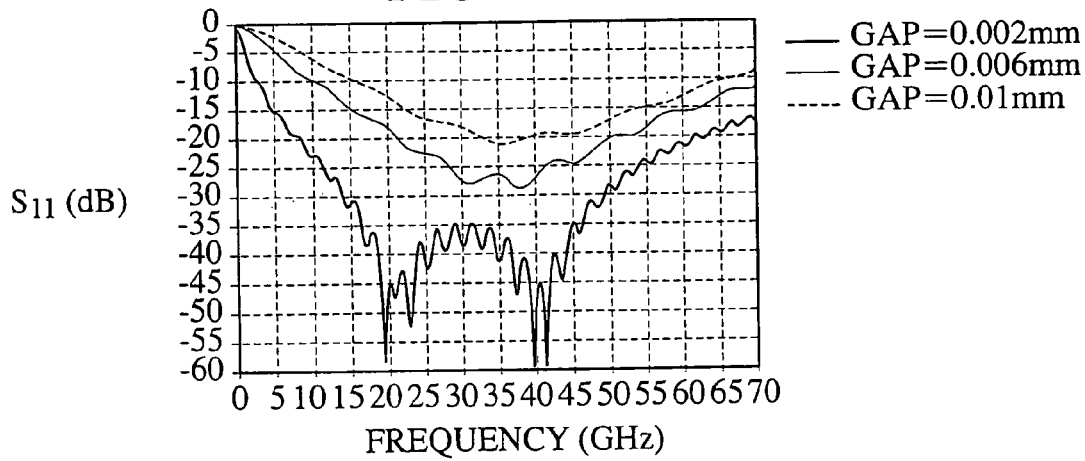
FIG. 26C shows the value for energy rebounding at port 1.

FIG. 26B shows S-parameters (transmission parameters) in relation to frequency (sine wave 0–70 GHz), for transmitted waves transmitted from port 1 to port 2 when the gaps 201d and 201e for first directionality coupler 201 are changed through three levels, 0.002, 0.006 and 0.01 mm. FIG. 26C shows S-parameters of reflected waves (reflection parameters) reflected at port 1, in relation to frequency. As transmitted waves transmitted as smoothly as possible in relation to frequency and less electromagnetic energy of reflected waves is preferable, it is evident from this simulation that GAP=0.002 mm is best.

Figure 27A:
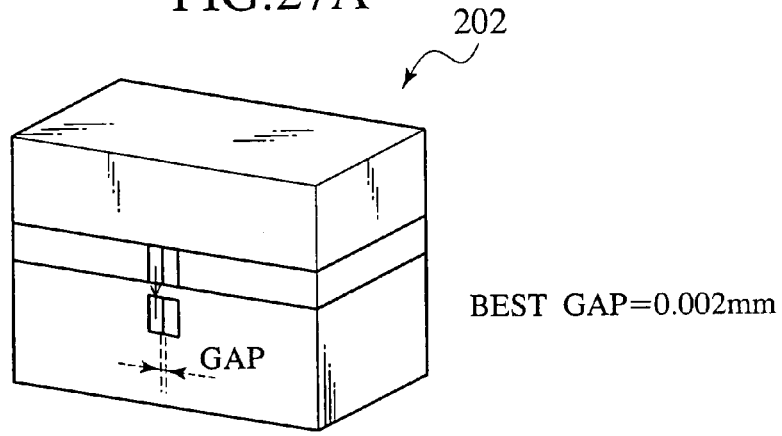
FIG. 27A shows the structure of the second directionality coupler.
Figure 27B:
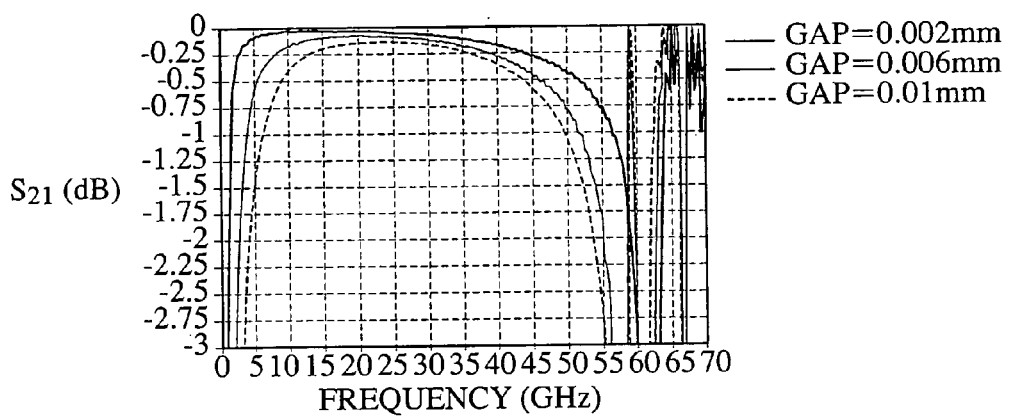
FIG. 27B shows the frequency characteristics of energy propagated from port 1 to port 2 when the GAP of the second directionality coupler is altered in three stages, 0.002, 0.006 and 0.01 mm
Figure 27C:
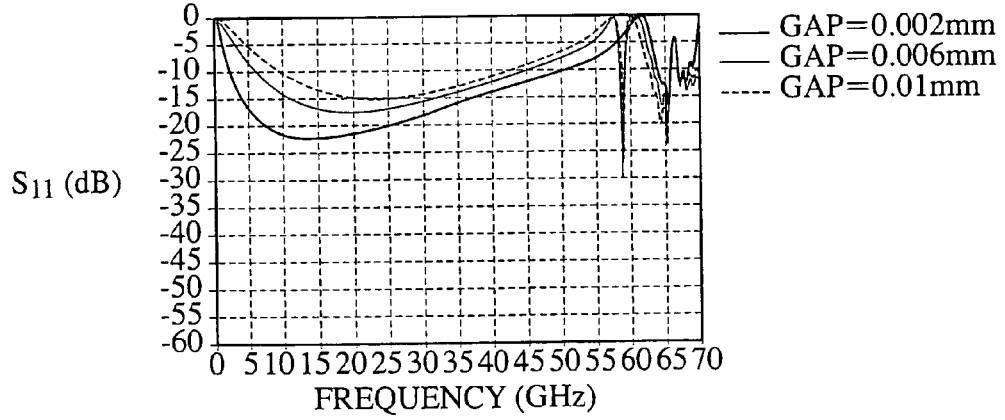
FIG. 27C shows the value for energy reflecting at port 1 in the directionality coupler shown in FIG. 27A.

The results of the same simulation that was carried out to produce the results of FIG. 27A being performed with respect to the second directionality coupler 202 are shown in FIGS. 27B and 27C. When comparing FIGS. 26B and 26C and FIGS. 27B and 27B, it is evident that transmission of components having low frequency is superior in the case of the second directionality coupler 202 than in the case of the first directionality coupler 201, and that because there is no hunting in the case of the directionality coupler 202, this is the superior directionality coupler.

Also, it is difficult, from S-parameters, to envision the actual waveform when transmission signals are propagated. Accordingly, in order to show the effects of directionality couplers from a different angle, the results of simulations to obtain types of measurements other than S-parameters for signal output when pulse signals are input to the directionality coupler 202, are shown in FIGS. 28A to 28D and FIG. 29.

Figure 28B:
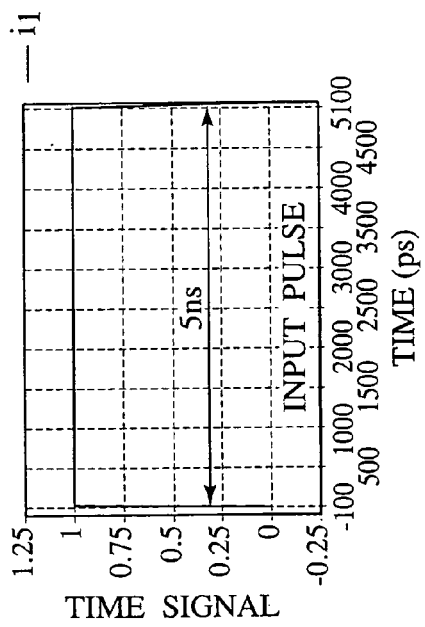
FIG. 28A provides an external view of the second directionality coupler 202 and FIG. 28B shows the waveform of a pulse signal inputting to the second directionality coupler 202.
Figure 28A:
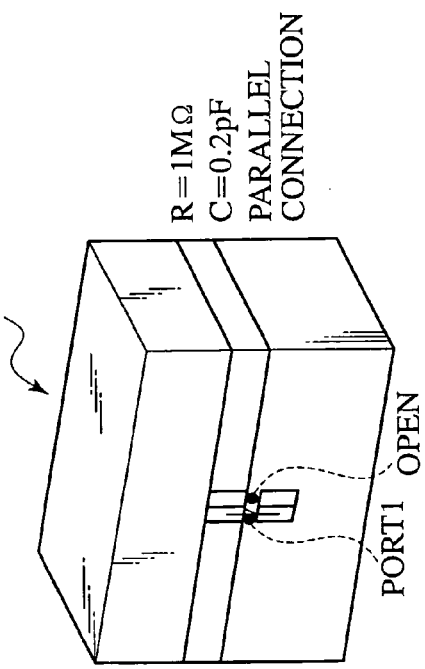
Figure 28D:
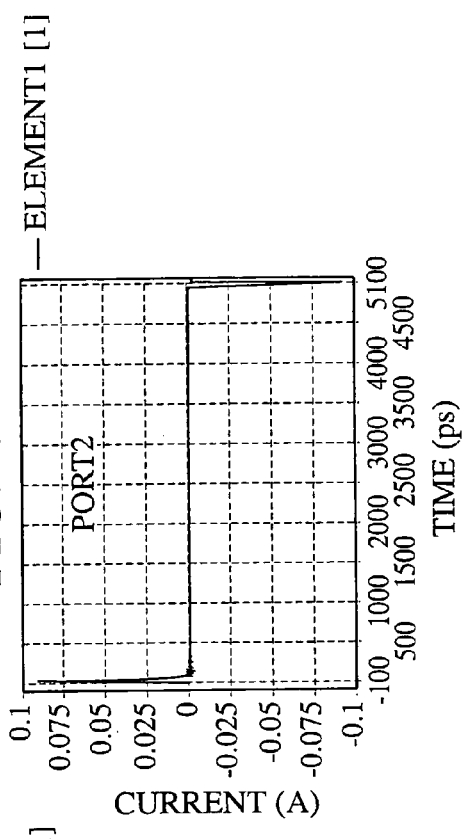
FIG. 28C shows the results of a simulation of the voltage waveform for a passing pulse and FIG. 28D shows the results of a simulation of the voltage waveform for a passing pulse.
Figure 28C:
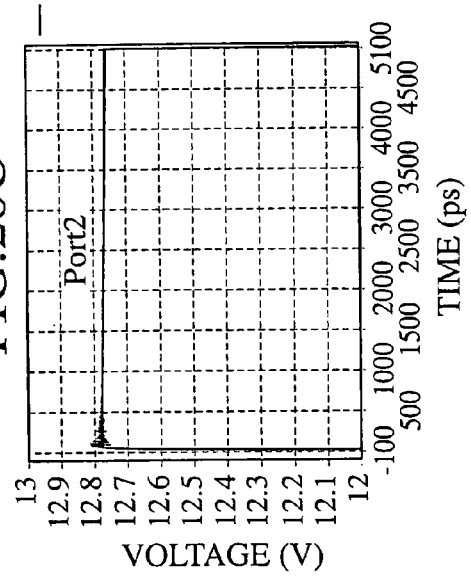

FIGS. 28C and 28D show the results of simulations for different types of measurements for transmitted pulse waves (transmitted waves) when the pulse signal shown in FIG. 28B is input to the second directionality coupler 202 shown in FIG. 28A.

Specifically, FIGS. 28C and 28D show the results of a simulation of electric current and voltage of transmitted waves output from port 2, when the input signal (having a pulse width of 5 ns) shown in FIG. 28B is input from port 1 of the second directionality coupler (C=0.2 pF, R=1 MΩ) shown in FIG. 28A. The end adjoining the port 1 is an open end. Here, electromagnetic energy of alternating components of the input signal input from port 1 of the stacked pair cable 202*f*–202*h* moves via the second directionality coupler 202 (C=0.2 pF, R=1 MΩ) to port 2 of the adjoining stacked pair cable 202*g*–202*i*, where the electromagnetic energy accumulated (C=0.2 pF) is consumed by leakage resistance (R=1 MΩ).

Accordingly, no reflection arises at the differential signal transmission pair cable. In other words, using the second directionality coupler 202 as an intermediary enables termination indirectly. Further, a further substantial advantage that becomes evident is that power consumption through direct current components of the input signal is suppressed by the second directionality coupler 202. Another substantial advantage of using the second directionality coupler 202 as an intermediary is that in terms of signal amplitude is that of the same levels of power supply voltage can be obtained for control signals of long cycles.

FIG. 29 shows a model for the output signal, envisioning a load of resistance 1 MΩ and capacitor 2 pF for a transistor disposed in a receiver circuit.

It is evident from FIG. 29 that waveform 242, of an output signal that is a high quality reproduction of input signal 241, can be obtained. Specifically, in contrast to input signal 241 that has a rising and trailing time of 25 ps and an effective pulse frequency of 14 GHz, output signal 242 has a trailing time of below 250 ps. Accordingly, it is evident that an output signal of 7 GHz can be transmitted. The reason the waveform of the output signal of FIG. 29 attenuates only slightly during the holding time (that is, the time when the on signal is rising), is that there is no energy supply from direct current, so the amount of this attenuation is equivalent to an electric current leak of 1 MΩ. Output signal waveform 243 is an output signal waveform derived from conventional technology, output from a receiver circuit without passing via a directionality coupler. The effects of the present invention are clearly revealed when a comparison is made between the output signal waveform 242 obtained with the present invention and output signal waveform 243 obtained with conventional technology.

Further, as shown in FIG. 29, output signal amplitude $V_{out}$ in relation to the power supply voltage $V_{dd}$ is a low value determined by the on resistance of the transistor. If the signal is a clock signal having a waveform that has a short holding time, the waveform is maintained when the signal is transmitted, however, if the signal is a signal having a waveform that has a long holding time like input signal 241, unless that signal passes via a directionality coupler, electric potential attenuates after time $t_1$ due to the characteristics of attenuation in RC integration circuits (in other words, the effect by which energy is consumed due to resistance affecting a transmitted higher harmonic wave), moreover, at time $t_2$ to $t_3$ electric potential of output signal 243 becomes 0 V.

Because the attenuation of output signal 243 is loose, there is no undershoot and thus, the differential circuit does not reverse. However as electric potential becomes a negative value as shown in times from $t_3$ to $t_4$ when input signal 241 goes to off, the differential circuit reverses. At this time, if there is a latch at a lower stage to the sensor amplifier, the correct signal can be picked up regardless of holding time.

In the case of a long differential signal transmission cable, as illustrated by the case shown in FIG. 24, direct current flows during time $t_{pd}$. At this time, when a directionality coupler or capacitance coupler as shown in FIGS. 21A, 21B, 22A, 22B, or 23A is not connected (in other words, in the case of a conventional differential circuit as shown in FIG. 3), the moved electric charge is absorbed as it is at terminating resistance R111.

In contrast to this, in the arrangements shown in FIGS. 21A, 21B, 22A, and 22B, electric charge charged from the differential signal transmission cable attenuates due to direct current conductance of the load. Where a directionality coupler is disposed only immediately prior to the receiver circuit, electric charge charged from the differential signal transmission cable cannot be discharged and remains until the driver circuit reverses. Thus, it is beneficial in terms of energy consumption to have a directionality coupler disposed at the output terminal of the driver circuit.

(Capacitance Coupler)

Figure 30:
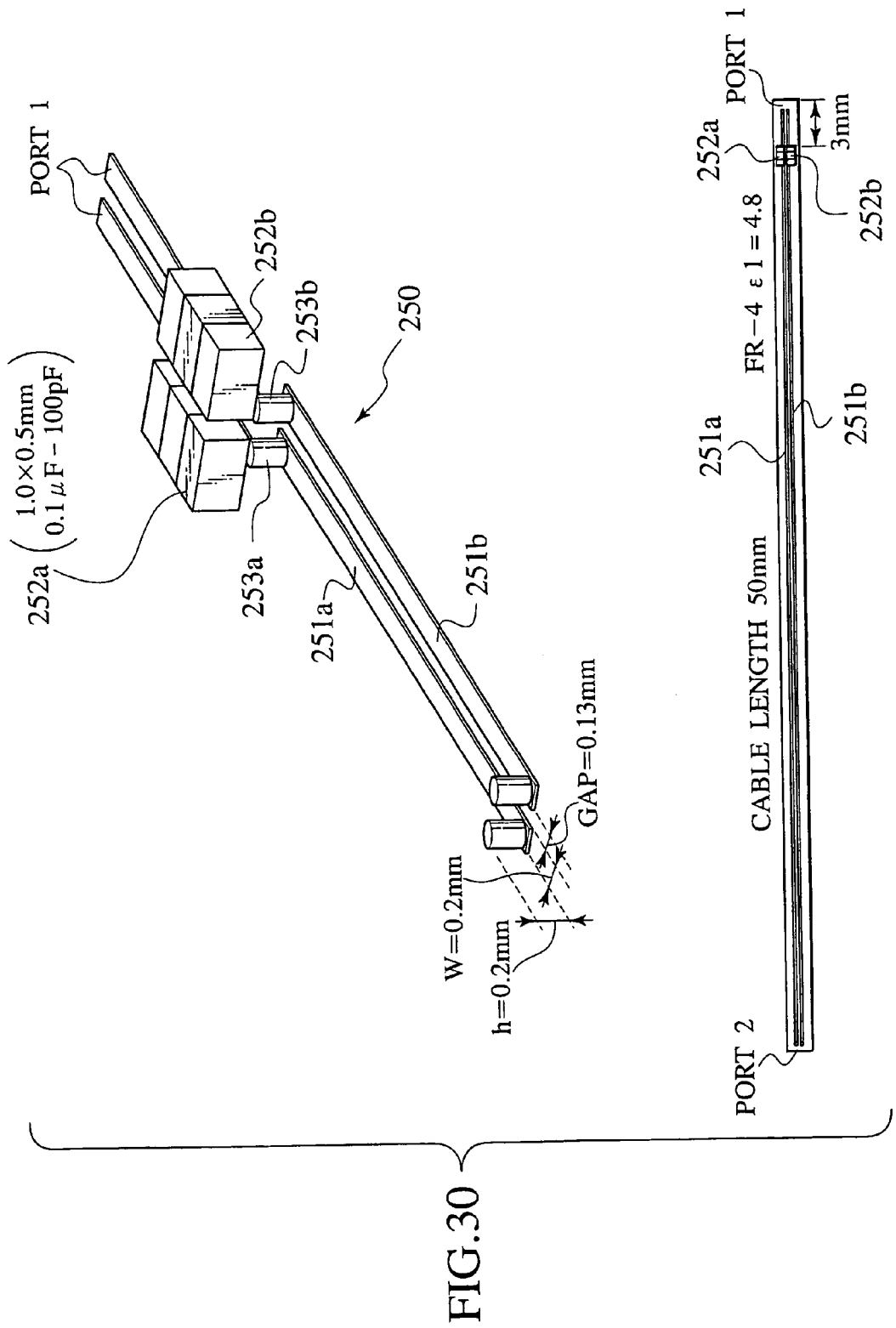
FIG. 30 shows an example of a capacitance coupler represented by the coupler of FIG. 21B.

FIG. 30 shows a representative example of the capacitance coupler shown in FIG. 21B.

As shown in FIG. 30, the capacitance coupler 250 related to the present invention comprises differential signal transmission pair cables 251*a* and 251*b* having characteristic impedance of 50 Ω and having chip capacitors 252*a* and 252*b* of a size of 1.0×0.5 mm and capacity of 1.0 μF to 100 pF, respectively disposed 3 mm from the port 1 end thereof, the differential signal transmission pair cable 251*a* and 251*b* extending parallel for a further 50 mm from beer holes 253*a* and 253*b* (both 0.2 mm high) disposed so as not to be in contact with each other, in a position opposing the respective chip capacitors. Further, the differential signal transmission pair cable 251*a* and 251*b*, are parallely disposed with a 0.2 mm gap therebetween.

Figure 31B:
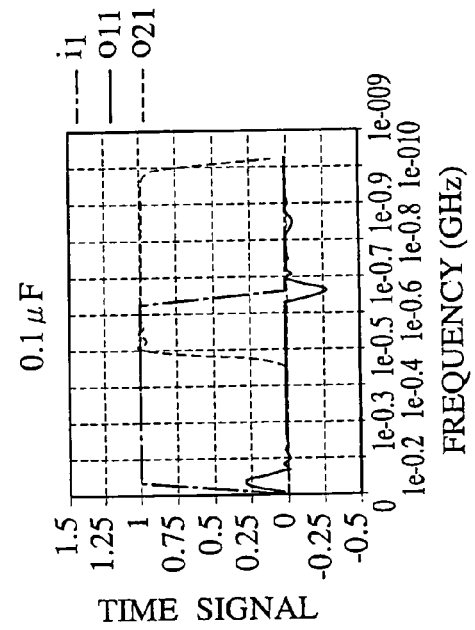
FIG. 31B shows transmission states for pulse waveform with chip capacitor of 0.1 „F.
Figure 31D:
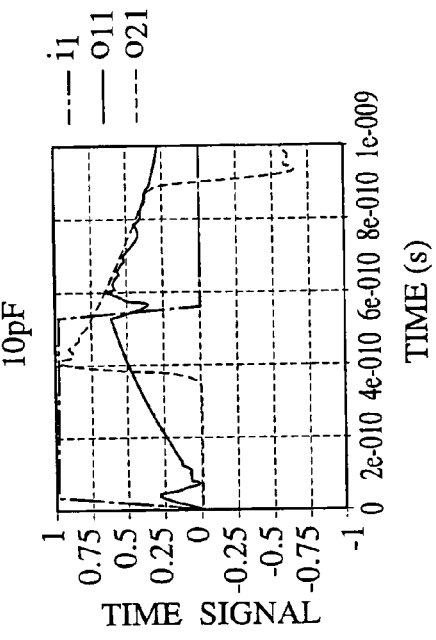
FIG. 31D shows transmission states for pulse waveform with chip capacitor of 10 pF.
Figure 31A:
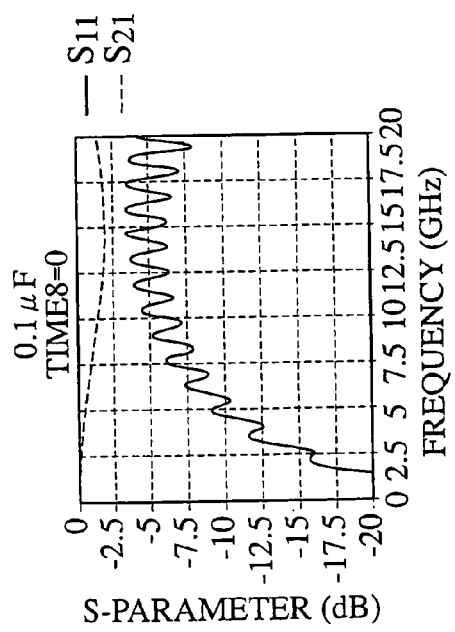
FIG. 31A shows the results of a simulation of S-parameters.
Figure 31C:
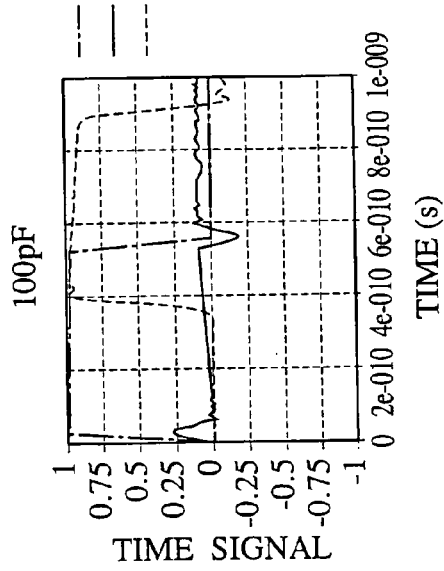
FIG. 31C shows transmission states for pulse waveform with chip capacitor of 100 pF.

FIGS. 31A to 31D show the results of a simulation of several measurements of a differential signal propagated to port 2 of capacitance coupler 250, via chip capacitors 252*a* and 252*b* and beer holes 253*a* and 253*b*, after input from port 1 of the capacitance coupler 250. Specifically, FIG. 31A shows the results of a simulation of S-parameters when capacity of chip capacitance is 1 μF. Here, $S_{11}$ shows the reflection parameter and $S_{21}$ the transmission parameter. Further, FIG. 31B shows the condition of transmission of pulse waveform when capacity of the capacitors is 1 μF, FIG. 31C shows the condition of transmission of pulse waveform when capacity of the capacitors is 100 pF, and FIG. 31C shows the condition of transmission of pulse waveform when capacity of chip capacitance is 10 pF.

Both the rising and trailing times of signal input from port 1 are 25 ps, and the effective waveform of the signal being 14 GHz. The chip capacitors 252*a* and 252*b* have no parasitic impedance.

The dielectric loss tangent for the cable used in the simulation of FIG. 31A is tan δ=0, however, it is evident that in comparison with the transmission characteristics shown in FIGS. 27A to 27C and 28A to 28D, that S-parameters are not good due to the effects of the beer holes 253*a* and 253*b*. When chip capacitor capacity is 100 pF however, as is evident from FIG. 31C, as a pulse waveform having rising time and trailing time of below 50 ps is obtained, adequate transmission conditions are obtainable using chip capacitors having capacity of above 100 pF. That is, because when chip capacitor capacity is small at 10 pF sufficient energy cannot be passed, it is necessary to have fairly substantial chip capacitor capacity.

Figure 32A:
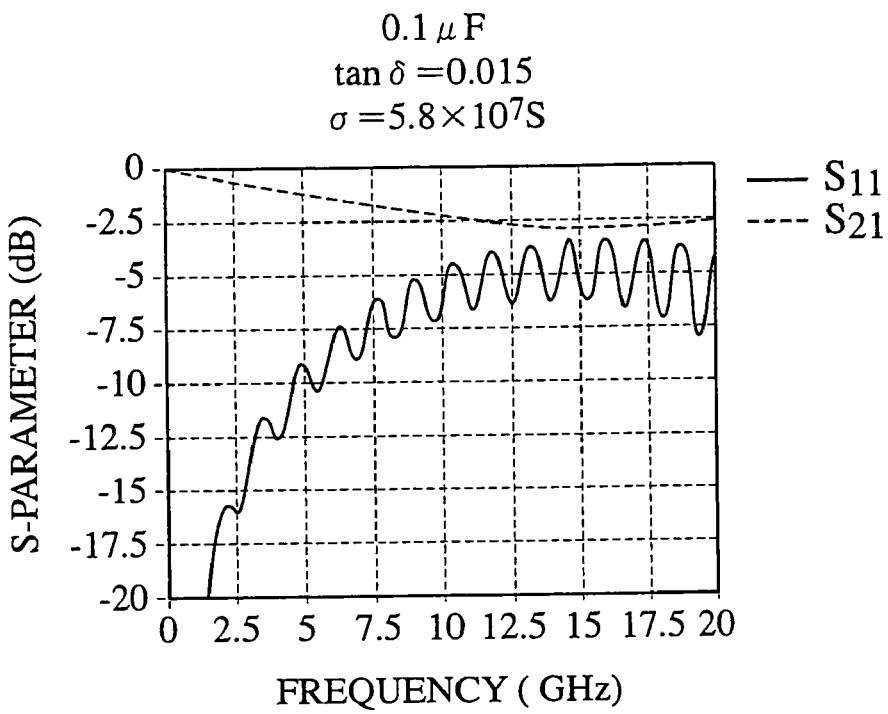
FIGS. 32A and 32B shows the results of a simulation when dielectric loss tangent tan „ of the transmission cables shown in FIGS. 31A to 31D is tan „=0.015.
Figure 32B:
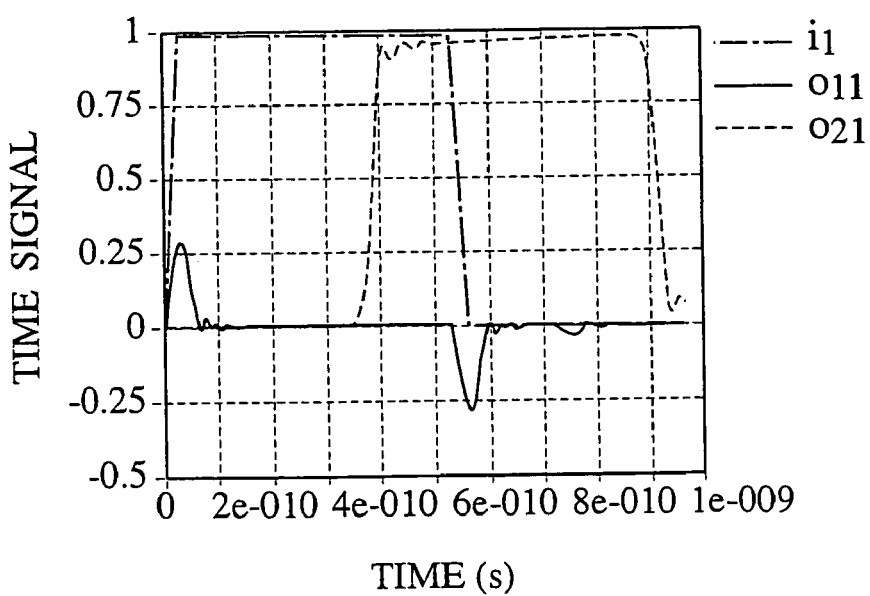

Further, FIGS. 32A and 32B show conditions of transmission of pulse waveform and S-parameters when dielectric loss tangent of the differential signal transmission pair cable 251*a* and 251*b* is tan δ=0.015. It is evident from FIGS. 32A and 32B that pulse waveform has largely the same transmission characteristics as the transmission conditions shown by the S-parameters and pulse waveform shown in FIGS. 31A and 31B. The reason for this is revealed in the following expression for power loss below $$P = \frac{wl}{d}\omega\varepsilon'' \frac{V_{dd}^2}{2} = \frac{wl}{d}\omega\varepsilon' \frac{V_{dd}^2}{2}\tan\delta = \frac{wl}{d}\pi f \varepsilon' V_{dd}^2 \tan\delta = 2\pi f C V_{dd}^2 \tan\delta \quad (10)$$

where w is the width of the pair cable wires, d is the interval between the wires, l is the length of the wires, $V_{dd}$ is power supply voltage and C is total wire capacity. It is evident from expression (10) that energy (power) loss rises as frequency f of the pulse signal increases, but that the dielectric loss tangent tan δ is only effective in respect of higher harmonic wave's components during pulse rising time and as that waveform during rising time dulls, the effect of the dielectric loss tangent tan δ decreases as a result of the lowering frequency of higher harmonic wave's components.

Figure 33A:
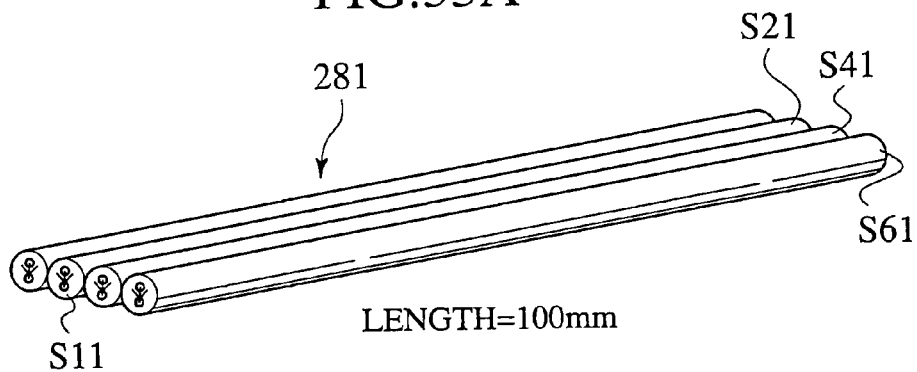
FIG. 33A shows a twisted pair cable and FIGS. 33B, 33C and 33D illustrate different transmission characteristics for different dielectric loss tangents tan „.
Figure 33B:
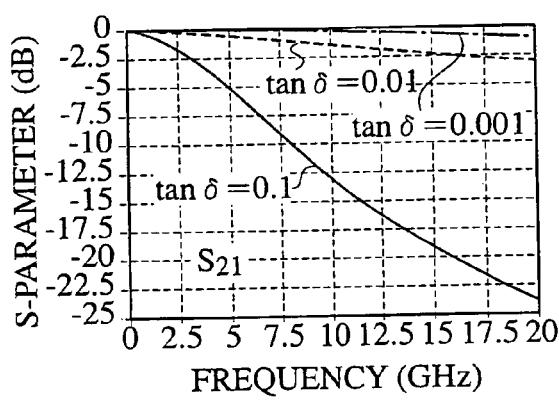
Figure 33C:
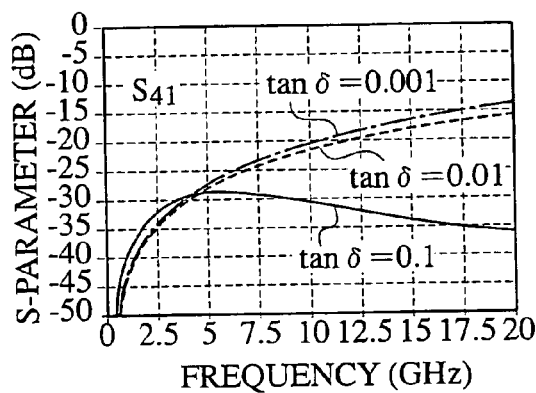
Figure 33D:
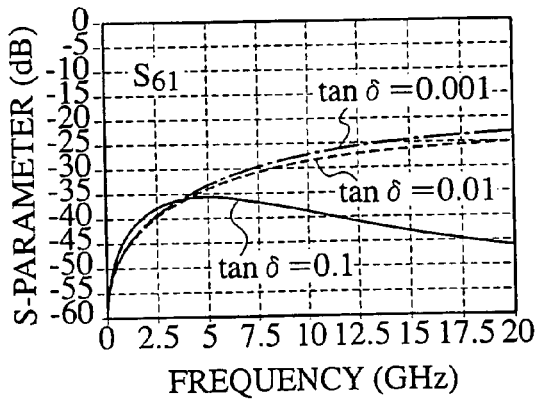

FIG. 33A shows flat cable 281 comprising four twisted pair cables disposed adjacently and flatly, each consisting of two wires arranged twisted at a prescribed pitch. FIGS. 33B, 33C and 33D show S-parameters for each dielectric loss tangent tan δ value (0.1, 0.01, 0.01) of the respective twisted pair cables.

In contrast to the case (tan δ=0) shown in FIG. 31A, in which the rate of attenuation in respect of a sine wave having 15 GHz frequency is −2 dB, the rate of attenuation in respect of a sine wave having a frequency of 15 GHz in the case (tan δ=0.015) shown in FIG. 32A, is −3 dB, so that signal attenuation occurs at 2 dB/100 mm. From this, it is evident that the extent of attenuation of a signal increases as dielectric loss tangent increases. As shown in FIGS. 33A to 33D, this tendency is the same even where twisted pair cables are used, producing a poorer result. The most important factor when using a long distance transmission cable is making the dielectric loss tangent tan δ a small value. For example, if the dielectric loss tangent is tan δ=0.0001, a pulse signal having a few GHz frequency (sine wave having 15 GHz frequency) can be propagated over a distance of 1 m with −3 dB attenuation. This degree of attenuation is sufficiently within the permissible range. Where the dielectric loss tangent is tan δ=0.0001 and a signal having a few GHz frequency (sine wave having 15 GHz frequency) is conveyed 10 m, attenuation is −20 dB, the energy reducing to one tenth.

A method for reducing the dielectric loss tangent tan δ is disclosed in U.S. Pat. No. 6,476,330, and a system using this method provides an example. However, if a transmission cable is sound, having no cross talk or electromagnetic radiation, waveform deformation of a signal is small and a receiver circuit can accurately catch the signal. In the case of a pulse signal having a 2 GHz frequency, both the rising time $t_r$ and the trailing time $t_f$ must be within a range below 175 ps. That is, the system must be such that only electromagnetic energy during this transition region (i.e. rising and trailing times) passes a varactor or a capacitance coupler. If $V_{dd}$=1 V, $R_{on}$+$R_L$=(950+50) Ω, then i=1 mA (amplitude 0.1V) and Q=175 ps×1 mA=0.175 pC is obtained. Here, attenuation is −20 dB, and only 17.5 fC of electric charge is propagated to the receiver terminal. Envisioning even substantial capacity for the gate of the receiver circuit at 15 fF and parasitic capacitance of 100 fF (such values being obtainable for a transmission cable up to directly prior to the gate), then Q=175 fF×0.1 V=11.5 fC and sufficient electric charge reaching the receiver circuit as energy that raises the voltage of the receiver circuit to the moral voltage and turning the receiver circuit switch on.

The important point here is that no problem arises provided the total of cross talk and electromagnetic energy of reflected waves in the transmission cable is a further −20 dB below this energy level (i.e. the energy level of 17.5 fC).

In order to make electromagnetic energy of reflected waves basically zero, a functional circuit block transmission system must be of a configuration such that characteristic impedance of transmission cables (connecting wirings) from the driver circuit to the receiver circuit, including connectors and beer hole substrate, is perfectly matched.

Besides the flat cable comprising twisted pair cables shown in FIG. 33A, the cable structures shown in FIGS. 34A to 34D are conceivable for a transmission cable on a chip or substrate. FIG. 34A shows pair coplanar cable 291 comprising four wires (conductors) embedded in homogenous insulation material; FIG. 24B shows guard coplanar cable 292 comprising six wires (conductors) embedded in homogenous insulation material; FIG. 34C shows stacked pair cable 293 comprising four wires (conductors) embedded in homogenous insulation material and FIG. 34D shows guard stacked pair cable 294 comprising six wires (conductors), embedded in homogenous insulation material.

The important factors are (1) the existence of a structure wherein a differential signal transmission pair cable is clearly designated a pair cable and (2) that the wires are disposed in an insulating material having the same permittivity so that the electromagnetic waves can be transmitted maintaining the transmission mode of the TEM waves. It is important to note that a coupler is the opposite of this phenomenon, in other words, requiring moving electromagnetic energy to an adjacent cable, disrupting the transmission modes of the TEM waves).

The differential signal transmission pair cable 291 shown in FIG. 34A comprises two pair cables $1p_{ab}$ and $1p_{cd}$ consisting of two sets of two wires (conductors), 291a–291b and 291c–291d disposed parallel and with interval d (first interval) therebetween, these pair cables being arranged over the same straight line $L_{10}$, the two wires 291b–291c having the shortest interval therebetween from among the wires comprising these differential signal transmission pair cable being coplanar wires, disposed with interval s (second interval) therebetween.

The differential signal transmission pair cable 293 shown in FIG. 34C comprises two pair cables $2p_{ab}$ and $2p_{cd}$ consisting of two sets of two wires (conductors), 293a–293b and 293c–293d disposed parallel and with interval d (first interval) therebetween, these pair cables being arranged parallel in a stacked pair configuration arranged with interval s, (second interval) therebetween.

The differential signal transmission pair cable 292 shown in FIG. 34B comprises two pair cables $3p_{abc}$ and $3p_{def}$ consisting of two sets of wires 292a–292c and 292d–292f disposed parallel and with a single wire, respectively 292b and 292e disposed intervening therebetween, these two sets of wires having a common connection therebetween, these pair cables being arranged over the same straight line $L_{11}$, the two wires having the shortest interval therebetween from among the sets of wires comprising these pair cables being guard coplanar wires, disposed with interval s (second interval) therebetween.

The differential signal transmission pair cable 294 shown in FIG. 34D comprises two pair cables $4p_{abc}$ and $4p_{def}$ consisting of two sets of wires 294a–294c and 294d–294f disposed parallel and with a single wire, respectively 294b and 294e disposed intervening therebetween, these two sets of wires having a common connection therebetween, these pair cables being arranged parallel in a guard stacked pair configuration arranged with interval s, (second interval) therebetween.

In FIGS. 34A to 34D the width of wires having opposing faces between the wires comprising the pair cables is w, the thickness of wires having opposing faces between adjacent pair cables is t, and between the intervals d and s as defined above, the inequality is satisfied with the inequality: 3.3 wd<ts. Here, the strength of coupling between the wires forming the pair cables is proportionate to $(1/ts)^2$. Accordingly, it is evident from the above inequality that the coupling strength of the pair cables is approximately ten times the coupling strength of adjacent cables. This means that 10% of electromagnetic energy forms cross talk elements between adjacent pair cables. Seemingly, although this would be an adverse effect that cannot be ignored, as the shape of the conductors is not isotropic like a cylindrical form, and as the anisotropic from controlled by the coupling of opposing faces of the two wires is stronger, in experiments, the cross talk arising is kept below 5%.

It is therefore evident that using differential signal transmission pair cables as shown in FIGS. 34A to 34D, differential signals having GHz frequency band can be transmitted without disrupting the transmission modes of the TEM waves.

(Parts Connecting to the Transistor)

FIG. 35 shows the structure of the simplest driver circuit 161 shown in FIG. 21A. First, power supply $V_{dd}$ and GND (ground) are connected respectively to coplanar cables 301v and 301g forming a transmission cable, disposed directly above nMOS and varactor structured transistors Q1 and Q2. Stacked pair cables 302a and 302b that transmit input signals, extend to directly prior to gates g1 and g2. Output signals from gate terminals g1 and g2 are output from stacked pair cables 302a and 302b and directionality coupler 165 connected to drain terminals d1 and d2, arranged to form a pair. Output signals from the directionality coupler 165 are transmitted toward a receiver circuit (not shown in the drawing) connected to an output terminal of differential signal transmission pair cable (a stacked pair cable for example) 164. By pass capacitors C300 are disposed at each connecting part of the transistor thus configured.

Thus, the transmission cable related to the present invention connected to the differential circuit comprising the pair of transistors Q1 and Q2, comprises stacked pair cable 302a and 302b connected to the pair of gate terminals g1 and g2 of the transistor, coplanar cable 301v that inputs power supply, via resistance to the pair of drain terminals d1 and d2 of the transistor, and a second stacked pair cable, 165a and 165b, connected to the pair of drain terminals d1 and d2 of the transistor for outputting differential signals externally, such that apart from electrode parts of transistors Q1 and Q2, all wiring forms a transmission cable, enabling transmission of a pulse signal of tens of GHz.

Figure 36:
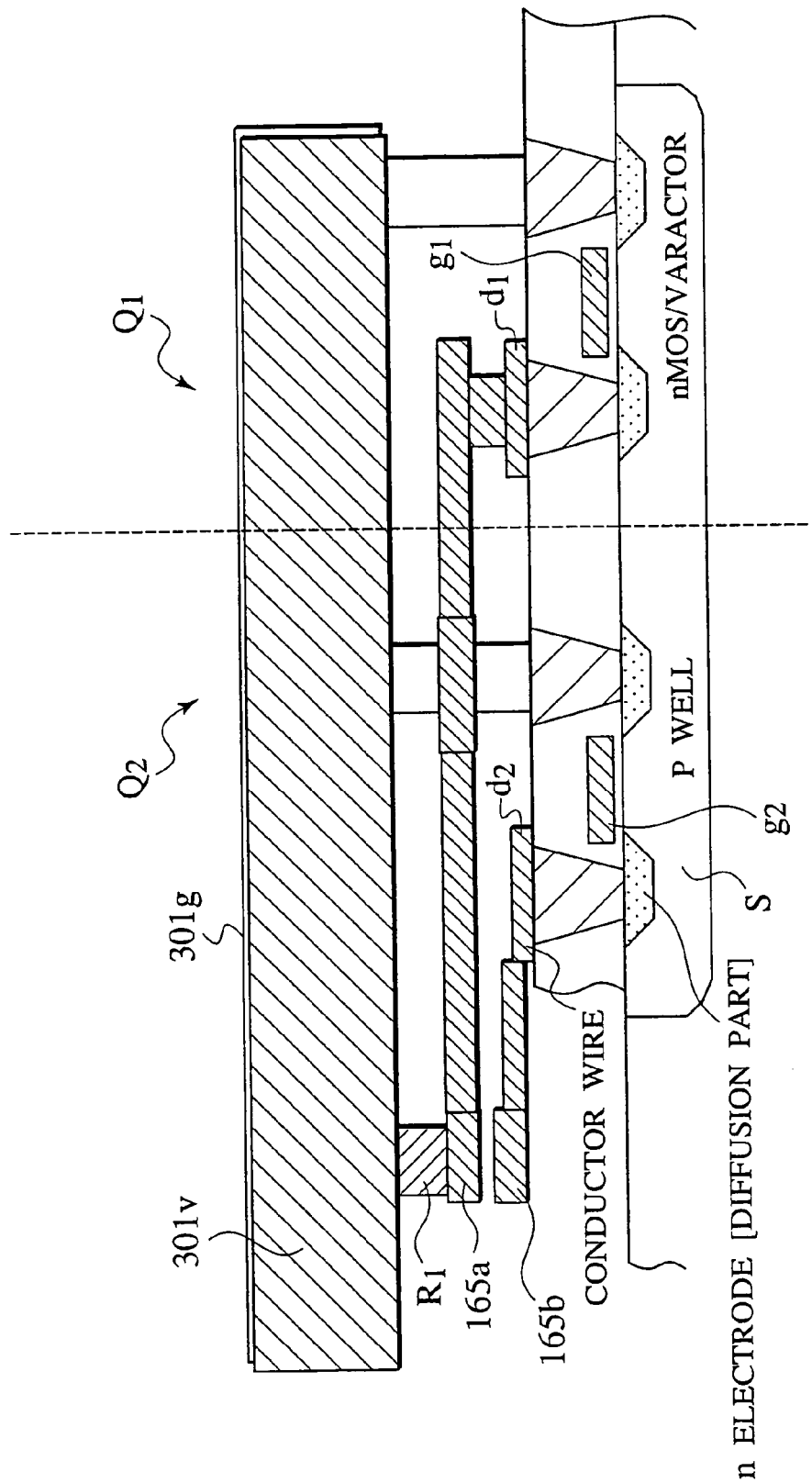
FIG. 36 is a cross-sectional view showing the structure of transistors Q1 and Q2 forming the driver circuit 161.

FIG. 36 is a cross-sectional view showing the structure of transistors Q1 and Q2 forming the driver circuit 161.

In FIG. 36, the varactor, which plays a role as reverse nMOS, inside the same well structure such that a pump up and pump down of electric charge is achieved. Coplanar cable 301v that forms upper layer power supply and coplanar cable 301g, forming ground, are of a coplanar structure in this case, however, a different structure is also possible. Gate terminals g1 and g2 can be of polysilicon as the approach to the transmission cable is short, however, a metal electrode having a high carrier speed is preferable. In the cross-sectional direction of FIG. 36, the thickness of the wiring, the width of the wiring and the thickness of the insulation layer are set based on the aforementioned inequality 3.3 wd<ts, that prescribes the relationship between adjacent wires. Characteristic impedance $Z_{0p}$ of the power supply ground transmission cable should be characteristic impedance within a range below 1/(n), where n is the number of differential signal transmission pair cables having intrinsic impedance $Z_{0s}$ of the output signal differential driver circuit, (in other words, $Z_{0p}<Z_{0s}/n$).

(Viahole Structure)

Figure 37A:
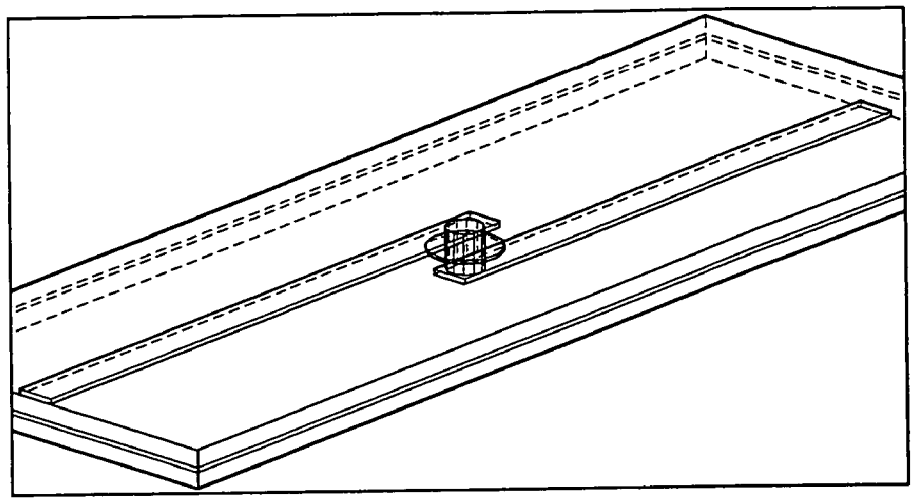
FIG. 37A shows the structure of the beer whole disposed through flat ground and FIG. 37B shows an enlarged view of the structure shown in FIG. 37A.
Figure 37B:
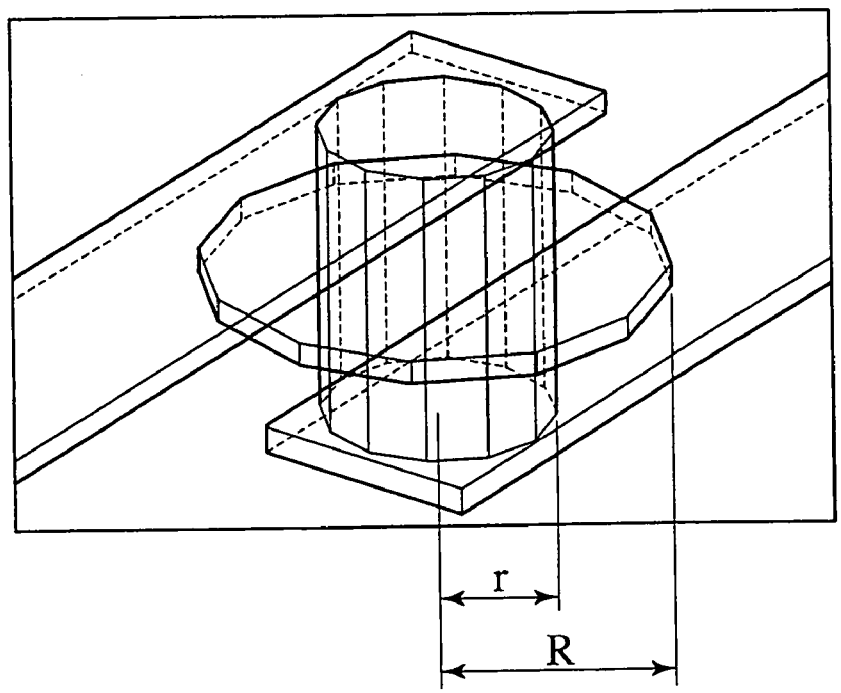

FIGS. 37A and 37B show the structure of viaholes disposed through flat ground. FIG. 38 is a table showing the relationship of the radius of the anti viahole R and the radius of viahole r (the numeric values in the table showing the ratio of R/r).

The structure of the viahole substrate is also important. As shown in FIG. 30, in a coplanar transmission cable a viahole structured having a diameter equal to the width of the cable is the structure providing connectivity, and as this provides good transmission properties, even where the length of the cable is 53 mm, a signal of a frequency band of tens of GHz can be transmitted where transmission properties are as shown in FIGS. 31A to 31D.

As shown in the table of FIG. 38 the optimum value for the ratio R/r in a beer hole structured as shown in FIGS. 37A and 37B via flat ground, having a length of 2 mm and including a cable of a length of 50 mm is 2.0–2.5, enabling a signal of a frequency band of tens of GHz to be transmitted.

(Connector Structure)

FIGS. 39A and 39B show an example of a connector structure related to the present invention.

The best method for the connection to long transmission cables is to connect as directly as possible, the wire pair of the substrate and the wire pair of the transmission cable, an example of this being the normal flat spring insertion type shown in FIGS. 39A and 39B. A pin, not shown in the drawing, and the spring are secured by connector housings 341a and 341b, and in this example, the connection to substrate 342 is accommodated by a through hole 343. Of course, a surface mounting of a soldered inserted pin is also suitable. The pair cable of substrate 342, structured as shown in FIG. 39B, is accommodated by through hole 343, the stacked pair cable 344a–344b, insulated from both above and below by the substrate 342, is separated by only a short distance. However, as described, consideration is paid to minimizing disconnectivity from intrinsic impedance of the viahole.

(Examples of Other Connectors)

Figure 40A:
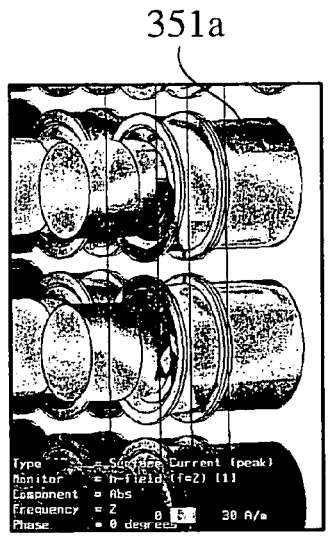
FIG. 40A and FIG. 40B show the structure of a spiral connector and FIG. 40C is a graph showing the S-parameters of the spiral connector shown in FIGS. 40A and 40B.
Figure 40B:
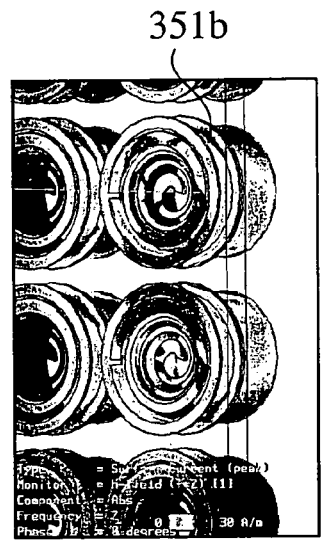
Figure 40C:
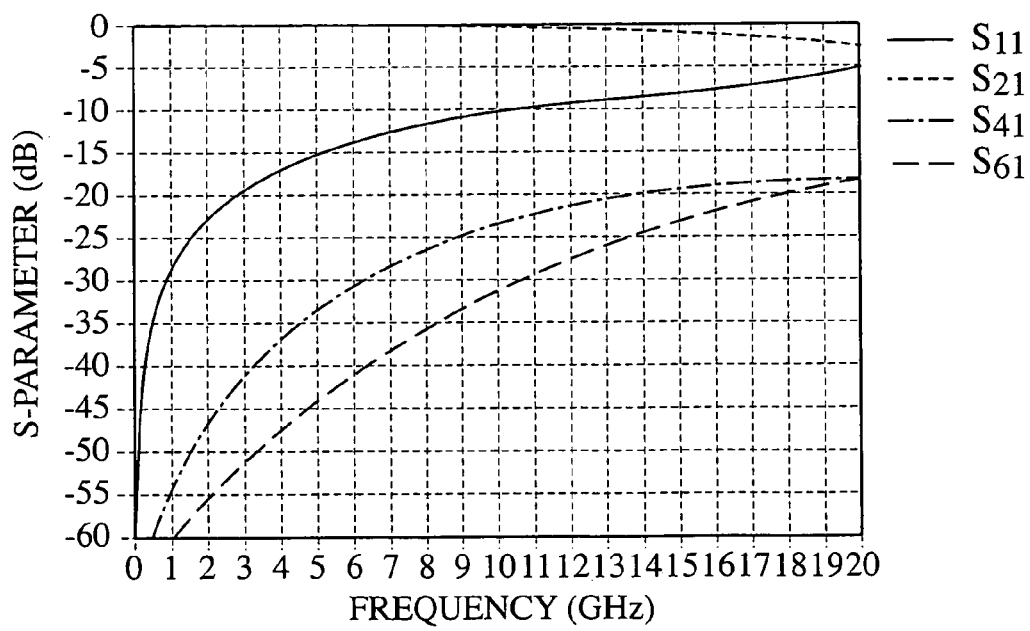

FIGS. 40A and 40B show the structure of a spiral connector and FIG. 40 is a graph showing the S-parameters thereof.

Spiral connectors 351a and 351b, providing examples of other connectors disclosed in Japanese Patent Application No. 2001-77338, 2001-266844, and 2002-167999 can also be used. These connectors enable the connection between the substrate pair cable and twisted pair cable to be short, realizing a coupling that provides good frequency characteristics, as is evident from the results of a simulation of S-parameters for these connectors shown in FIG. 40C.

(Differential Circuit Transmission Cable)

Figure 41:
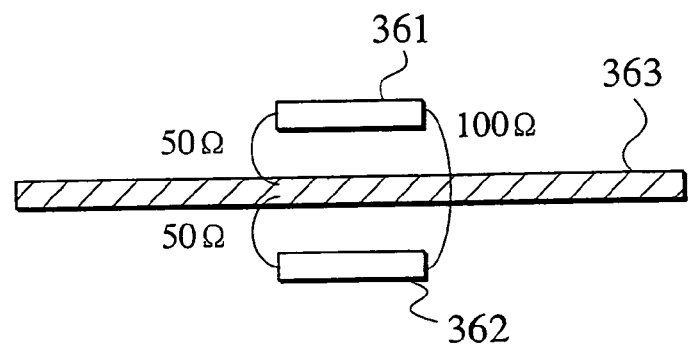
FIG. 41 shows a differential transmission cable referenced to ground.

FIG. 41 shows a differential transmission cable referenced to ground.

The method of connecting the above described ground and a driver-receiver circuit will now be described. As shown in FIGS. 2 and 3 the transmission cables 1013, 1014, 1023 and 1024 used in the differential circuit are referenced to ground.

In contrast to this, as shown in FIG. 41, the structure provided by the present invention has the wires 361 and 362 of the differential signal transmission pair cable disposed with ground layer 363 inserted therebetween such that equivalent intervals are maintained between these wires and the ground layer 363. Intrinsic impedance between the wires 361 and 362 is 100 Ω and the intrinsic impedance between each of those wires and ground is 50 Ω.

Figure 42:
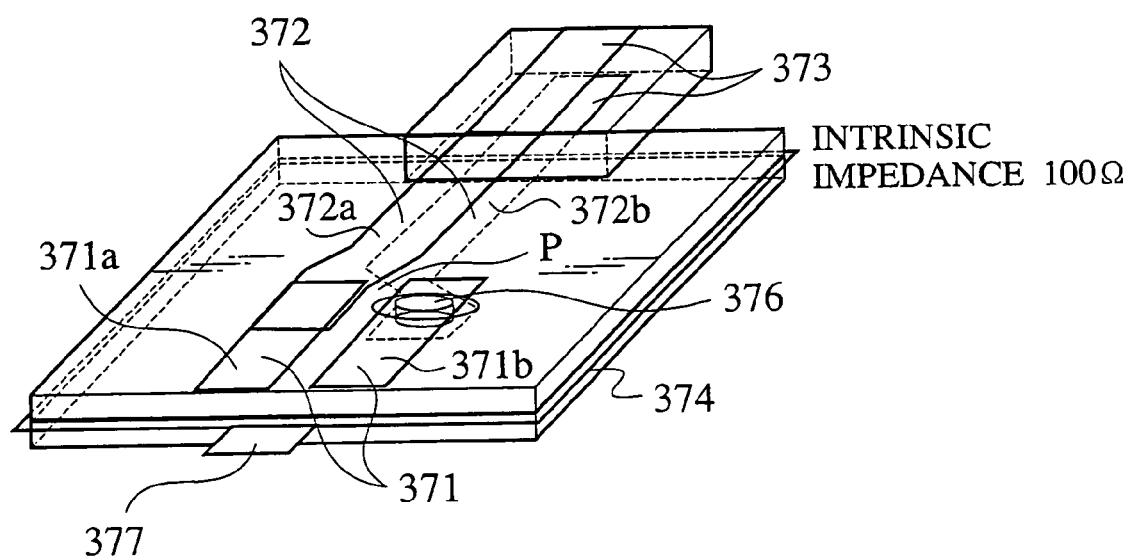
FIG. 42 shows a conventional transmission cable 371, and transmission cable 372 and stacked pair cable 373 with no ground according to this invention.

FIG. 42 shows the method of connecting conventional differential signal transmission cable 371, and a stacked pair cable 373 not referenced to ground and a differential signal transmission pair cable 372 related to the present invention.

As shown in FIG. 42 the differential signal transmission pair cable 372 connected to the differential circuit extends in a y shaped form at point P (that is, a y shape is formed by the bending of both of the wires of the pair 372a and 372b forming the differential signal transmission pair cable 372), while the wire 372b is pulled up by a viahole 376 to the uppermost layer and connected to the wire 371b of the conventional differential signal transmission cable, the ground of this cable being connected by a ground connecting part 377 to a circuit terminal (not shown in the drawing). Connection of ground 374 of the differential signal transmission pair cable 372 of the present invention to a circuit terminal is not necessarily required.

As shown in FIG. 42, because the connecting part of the stacked pair cable 373 does not require ground, stacked pair-cable 373 can be cut off at any point, it being possible for example, to form the connection through a connector to twisted pair cables of a LAN cable, and whatever kind of terminating resistance need not be connected to ground if the characteristic impedance of the stacked pair cable 373 is the same as that of the LAN cable. As the electromagnetic field formed by the differential signal transmission pair cable 372 of the present invention is symmetrically distributed with respect to the ground 374, the electric potential of this ground is normally 0V, thereby enabling this kind of configuration to be realized, providing features not found in a conventional differential signal transmission cable.

(Stacked Pair Transmission Cable in Which a Driver Circuit and Receiver Circuit are Connected)

Figure 43:
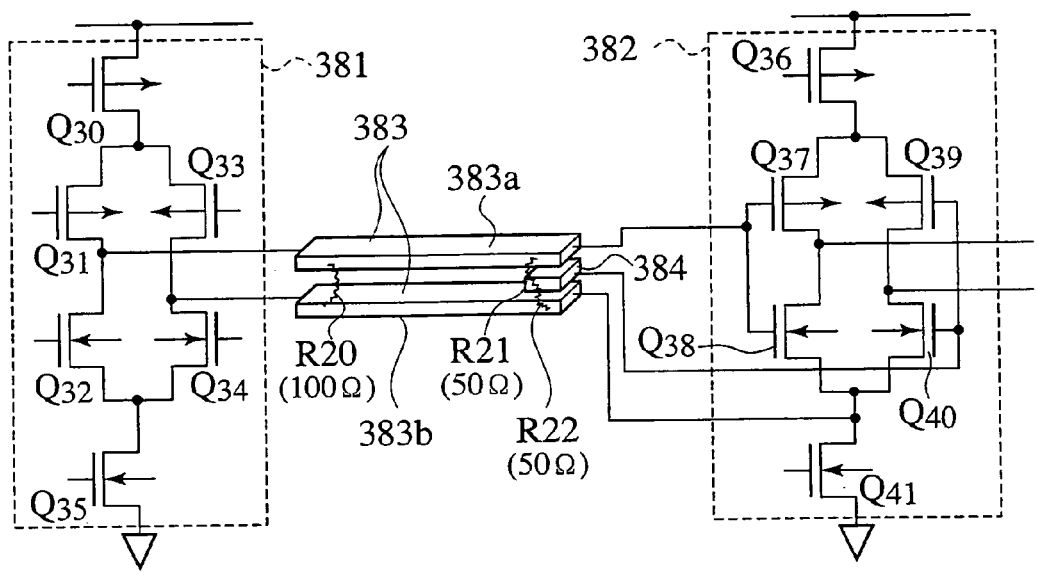
FIG. 43 is a circuit diagram showing the coupling structure for a driver circuit providing a differentiation circuit without ground and a receiver circuit with 0 level ground.

FIG. 43 is a circuit diagram showing the coupling structure for a driver circuit providing a differentiation circuit not referenced to ground and a receiver circuit referenced to zero level.

As shown in FIG. 43, the output signal from a driver circuit 381 connects to a stacked pair cable 383 that is not referenced to ground, whilst the power supply system for the receiver circuit 382 is completely independent, and further, the direct current components are blocked.

It is especially important that the on resistance of the transistors Q31, Q32, Q33 and Q34 used in the driver circuit 381 is 100 Ω in order to prevent reflection occurring inside the transmission cable. Of course, it is possible to adjust this on resistance with damping resistance used frequently in conventional technology.

While it may be thought that the amplitude of a signal transmitted would be ½ at the data terminals of the transistors Q37, Q38, Q39 and Q40 used in the receiver circuit 382, the gate capacity is small reflecting virtually everything, such that in actuality, double the amplitude is obtained and the same level of voltage can be achieved as in the case where referencing zero level of ground is not performed.

(Single End Type Transmission Cables)

Figure 44:
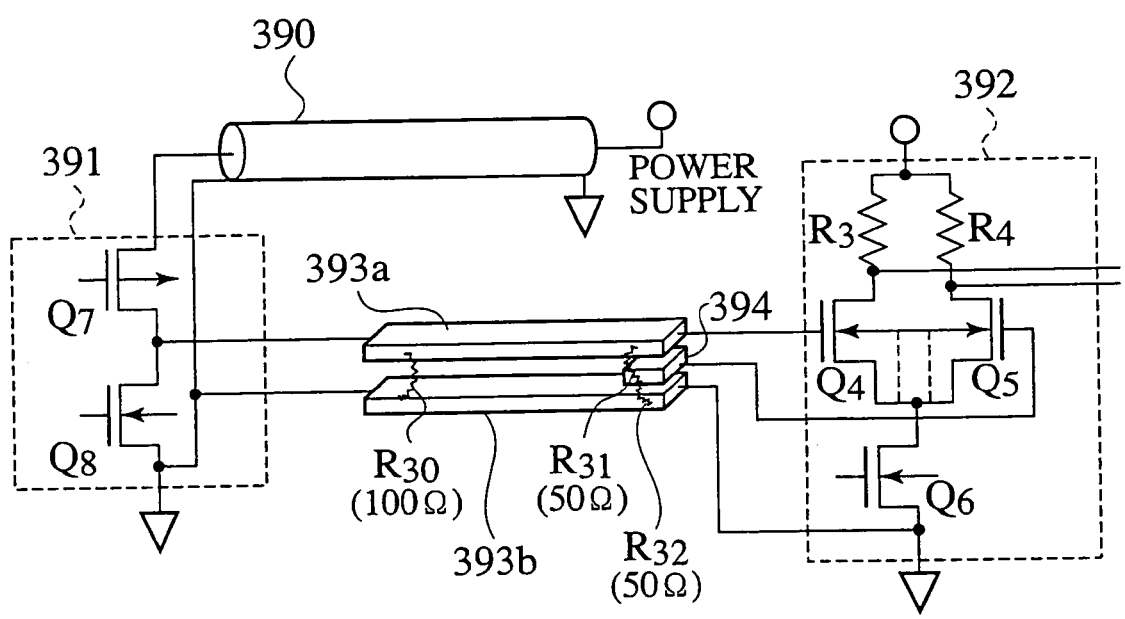
FIG. 44 is a diagram showing the coupling structure for a driver circuit providing a differentiation circuit with ground and a receiver circuit with 0 level ground.

FIG. 44 is a circuit diagram showing the coupling structure for a driver circuit providing a ground referenced differentiation circuit and a receiver circuit zero level referenced.

As shown in FIG. 44, the output signal of the driver circuit 391 is referenced to ground, the power supply system of the receiver circuit 391 is adjacent to the power supply system of the receiver circuit 392, and there is no blocking of direct current components.

In this case it is important, in order to prevent reflection occurring inside the transmission cable, that the on resistance of each of the transistors Q7 and Q8 used in the driver circuit 391 be 100 Ω. Of course, it is possible to adjust this on resistance with damping resistance used frequently in conventional technology.

While it may be thought that the amplitude of a signal transmitted would be ½ at the data terminals of the transistors Q4, Q5, and Q6 used in the receiver circuit 392, the gate capacity is small reflecting virtually everything, such that in actuality, double the amplitude is obtained and the same level of voltage can be achieved as in the case where referencing zero level of ground is not performed.

(ESD Protection Circuit)

Figure 45A:
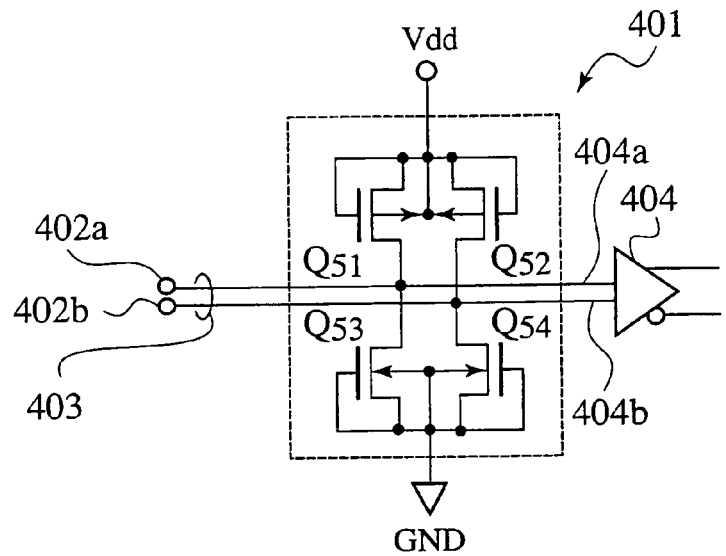
FIG. 45A shows an ESD protection circuit and FIG. 45B provides a cross-sectional view of the structure of the ESD protection circuit of FIG. 45A.
Figure 45B:
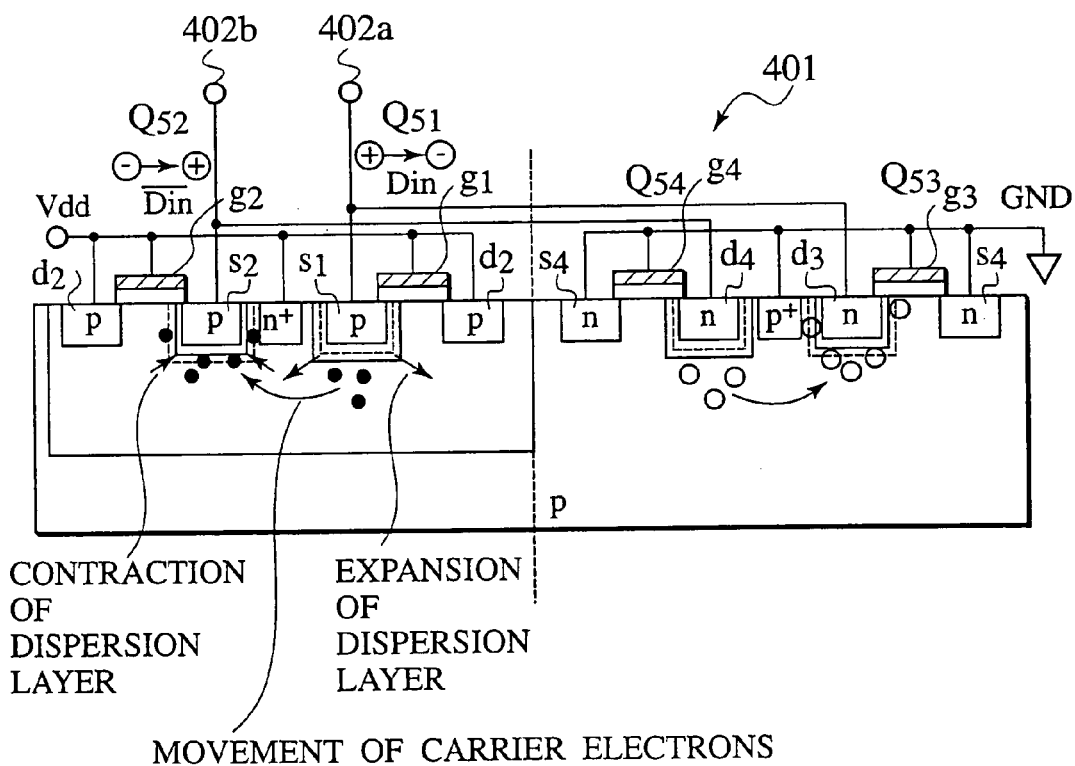

FIG. 45A shows an ESD protection circuit and FIG. 45B provides a cross-sectional view of the structure of an ESD protection circuit.

As shown in FIG. 45A, ESD protection circuit 401 comprises a differential transmission cable 403 having external terminals 402a and 402b and a receiver 404, the transistors Q51, Q52, Q53, and Q54 being disposed therebetween.

Specifically, drain and gates of the transistors Q51 and Q52 are commonly connected to power supply $V_{dd}$, and drain and gates of the transistors Q51 and Q52 are commonly connected to ground. Further, the external terminal 402A is commonly connected to the source of the transistor Q51, the drain of Q53 and the input terminal 404A of receiver 404, while external terminal 402b is commonly connected to the source of transistor Q52, the drain of Q54 and input terminal 404b of receiver 404.

Further, as shown in FIG. 45B, the ESD protection circuit is structured having protection circuits of the differential cable grouped in a pair, disposed adjacently in the same well structure, the objective being to enable complementary usage of carrier collecting in capacity of the drain dispersion layer and pn joined depletion layer between subs. As a differential signal comes on and off the thickness of the drain dispersion layer increasing, the capacity lessening and electric charge being discharged, and decreasing, the capacity expanding and electric charge being absorbed (diffused electric potential: 0.6 V), this action is used such that the capacity of the ESD protection circuit essentially becomes undetectable, preventing dulling of the differential signal.

As shown in FIG. 45A, an ESD protection circuit is printed listed for the receiver circuit, however instead of the receiver circuit, it is also suitable to have an ESD protection circuit for the driver circuit.

(LAN Cable Connector)

FIGS. 46A to 46E show the basic structure of a LAN cable connector 410 related to the present invention. FIG. 46A shows a perspective view of plug 415 connected to LAN cable 411. FIG. 46B shows a perspective view of jack 417. FIG. 46C shows a perspective view of mounting board 419. FIG. 46D shows a perspective view, viewed from the side of the mounting board, of LAN cable connector 410 integrating plug 415 with jack 417 and mounting board 419 and FIG.

46E shows a perspective view, viewed from the side of the LAN cable, of LAN cable connector 410 integrating plug 415 with jack 417 and mounting board 419.

Figure 47A:
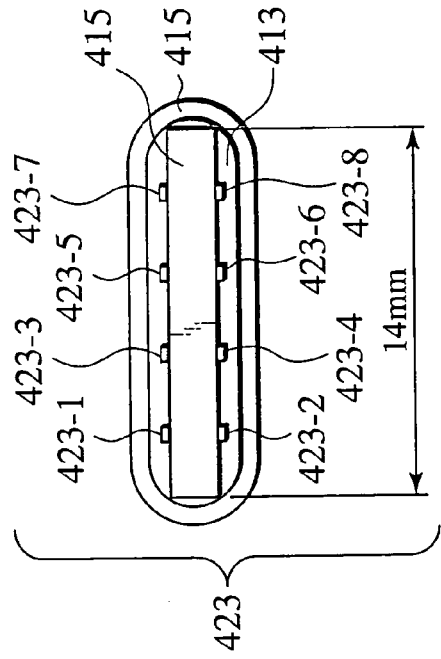
FIGS. 47A to 47D show cover 415 inserted in the connecting part between LAN cable 411 and plug 415.
Figure 47B:
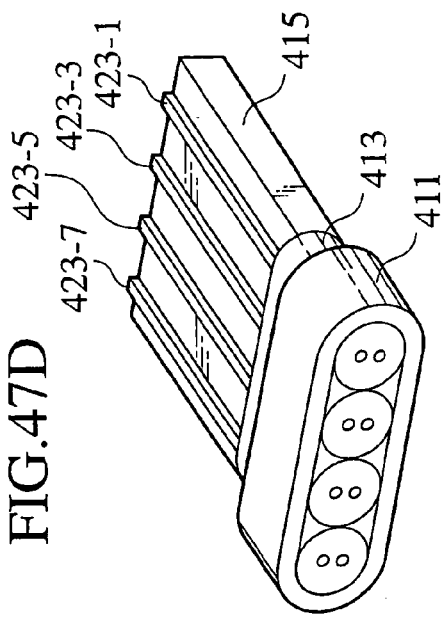
Figure 47C:
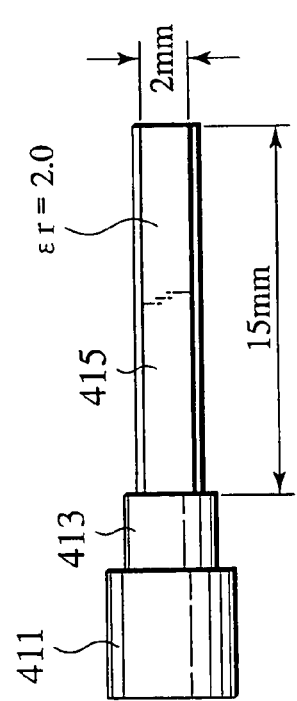
Figure 47D:
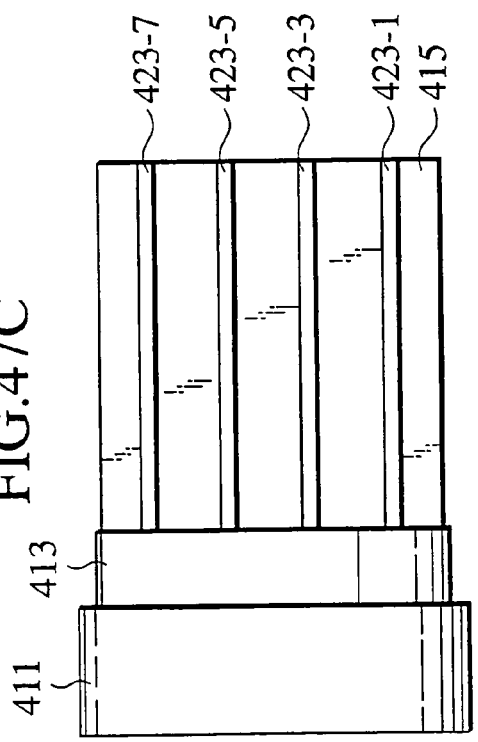

FIGS. 47A to 47D show cover 415 inserted in the connecting part between LAN cable 411 and plug 415, FIG. 47A providing a side view, FIG. 47B providing a view from the end face of the plug, FIG. 47C providing a side view and FIG. 47D providing a perspective view.

The LAN cable 411 comprises an A type flat cable shown in FIG. 14A, the respective pair cables thereof each having impedance matching to $Z_0=100$ Ω.

The plug 415 comprises an insulating medium (relative permittivity $\in_r=1.9$ to 2.2) of a thickness of 2 mm, with four sets of pair lines (first pair lines) 423 formed of conducting material such as gold Au or copper Cu disposed in the upper and lower layers of this insulating body. More specifically, each of the four sets of pair lines 423 comprises two conducting wires, respectively the set of 423-1 and 423-2, the set of 423-3 and 423-4, the set of 423-5 and 423-6 and the set of 423-7 and 423-8 vertically disposed via the plug 415, the impedance of each of these first pair lines being in conformance at $Z_0=100$ Ω.

Where the relative permittivity $\in_r$ of the plug 415 deviates from the above-described range it is not possible to maintain impedance of 100 Ω.

The four sets of pair lines 423 of the plug 415 are in contact with the corresponding four pair cables of the LAN cable 411, the cover 413 being disposed over the contacting part of this connection.

FIGS. 48A to 48E show the structure of jack 417 and mounting board 419. FIG. 48A is a perspective view of substrate integrating/joining part 433 and plug integrating/joining part 431 disposed in jack 417. FIG. 48B is a side view showing jack 417 viewed from the plug integrating/joining part 431. FIG. 48C is a rear view of jack 417 viewed from the substrate integrating/joining part 433. FIG. 48D is a side view of jack 417 and FIG. 48E is a perspective view of mounting board 419.

The jack 417 comprises an integrating/joining part 431 that is a cavity having roughly the same elongated form as the external form of the plug 415. The four sets of pair lines 423 of the plug 415 are connected so as to be longitudinally overlaid over the four sets of pair lines (second pair lines) 435, disposed following the outer surface of the plug integrating/joining part 431. This plug fitting part 431 is disposed at the front face of the jack 417, while fitting part 433 (1.6 mm×15 mm), the cross-section of the longitudinal direction of which is concave shaped, is disposed at the rear face of the jack 417, to accommodate insertion of the mounting board 419. These second pair lines 435 comprise two conducting bodies of gold Au or copper Cu disposed on the inner surface of the upper and lower layers of the cavity extending from the plug fitting part 431 to the substrate integrating/joining part 433. The impedance of each of these second pair lines matches $Z_0=100$ Ω.

The mounting board 419 has a concave shaped cavity enabling this board to be inserted in a longitudinal direction in the concave shaped substrate integrating/joining part 433 disposed in the jack 417. This mounting board 419 comprises an insulating body of a thickness of 1.6 mm, having relative permittivity $\in_r=4.6$ to 5.2 (4.8), four sets of pair lines 437 (third pair lines) formed of conducting material such as gold Au or copper Cu being disposed above this insulating body. More specifically, each of the four sets of pair lines 437 comprises two conducting wires, respectively the set of 437-1 and 437-2, the set of 427-3 and 427-4, the set of 427-5 and 427-6 and the set of 427-7 and 427-8 vertically disposed via the insulating material, the impedance of each of these third pair lines 437 being in conformance at $Z_0=100$ Ω. Further, the material from which this mounting board 419 is made must be at least one from among heat cured PPE, heat cured PPO, PTEF, ceramic PTFE, GYP glass polyimide) or BT resin.

Where the relative permittivity $\in_r$ of the mounting board 419 deviates from the above-described range it is not possible to maintain impedance of 100 Ω.

FIG. 49 provides a cross-sectional view depicting the combination and engagement of each of the parts LAN cable 411, plug 415 and jack 417 shown in FIG. 46 each disposed on mounting board 419 in the direction shown by the respective arrows.

The process for installation of the LAN cable connector 410 related to the present invention will now be described with reference to FIG. 49.

First, sheath 421 is removed such that cable 441 protrudes out approximately 2 mm to 5 mm from the end of the LAN cable 411, and the cable 441 of the LAN cable 411 and the plug pair line 423 disposed in the plug 415 are connected so as to be overlaid in a longitudinal direction in relation to the jack 417.

Next, the plug 415 is inserted in a longitudinal direction in the plug fitting part 431 of the jack 417 so as to be engaged therein, and the plug pair line 423 and jack pair line 435 disposed in the jack 417 are connected so as to be overlaid in a longitudinal direction in relation to the jack 417.

Thereafter, the jack 417 is inserted in a longitudinal direction in the mounting board 419 so as to be engaged therein, and the jack pair line 435 and mounting board pair line 437 disposed in the mounting board 419 are connected so as to be overlaid in a longitudinal direction in relation to the jack 417.

The result of this arrangement, as shown in FIG. 49, is that the cable 441 of the LAN cable 411 and the plug pair line 423 disposed in the plug 415, the plug pair line 423 and the jack pair line 435 disposed in the jack 417 as well as the jack pair line 435 and the mounting board pair line 437 disposed in the mounting board 419 are connected in succession.

(Characteristics of LAN Cable Connector)

Figure 50A:
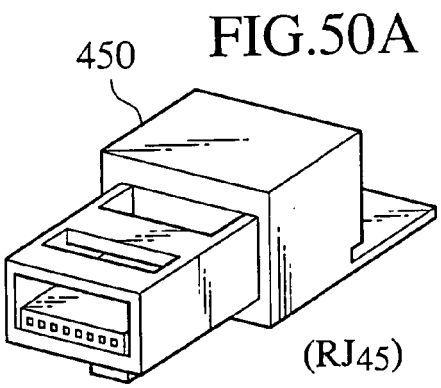
FIG. 50A provides a perspective view of the outside of the RJ 45 that is a conventional LAN cable connector 450.
Figure 50B:
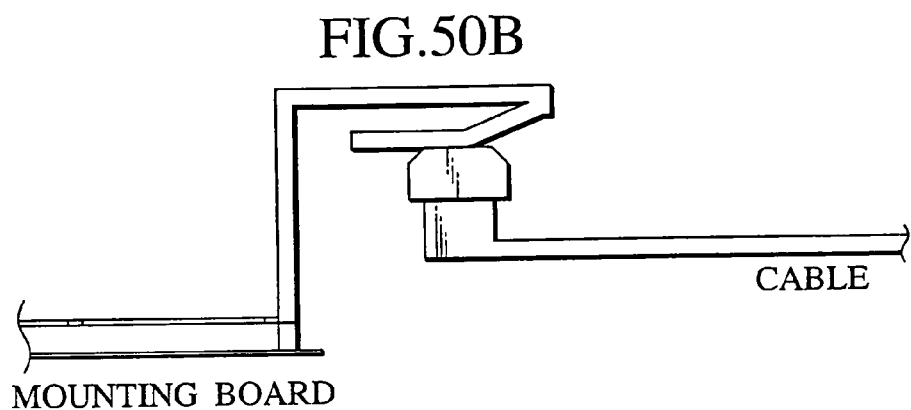
FIG. 50B shows one line running from a cable inside LAN cable connector 450 to the mounting board.
Figure 50C:
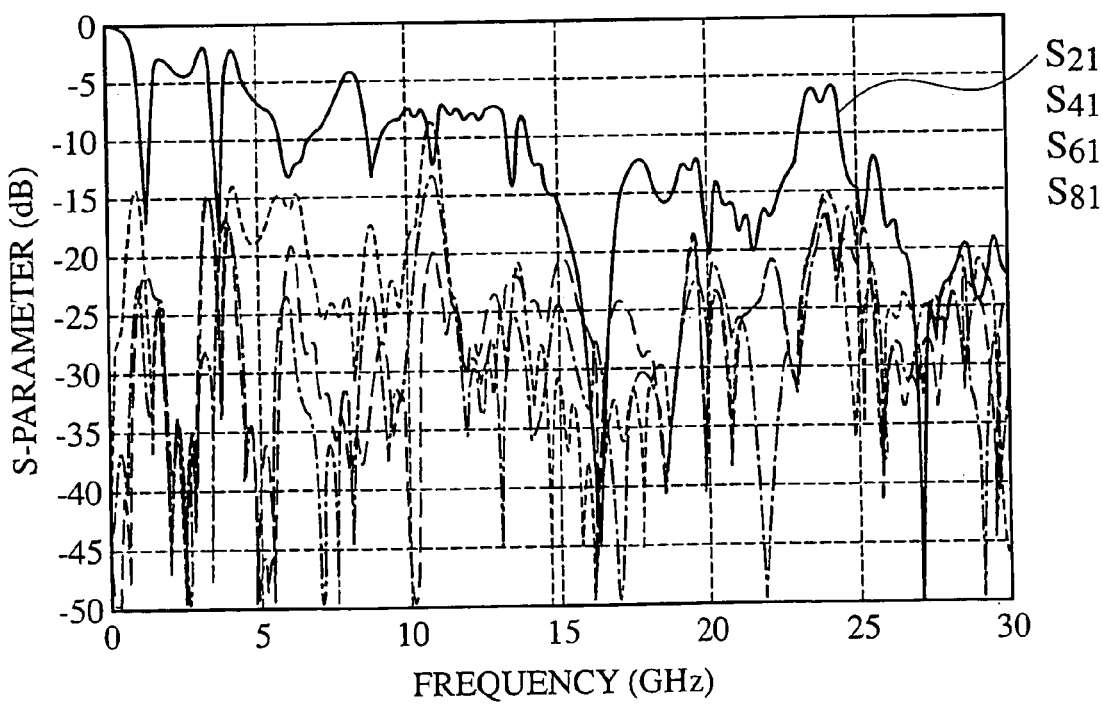
FIG. 50C shows the results of a simulation of the S-parameters for the LAN cable shown in FIG. 50A.
Figure 51A:
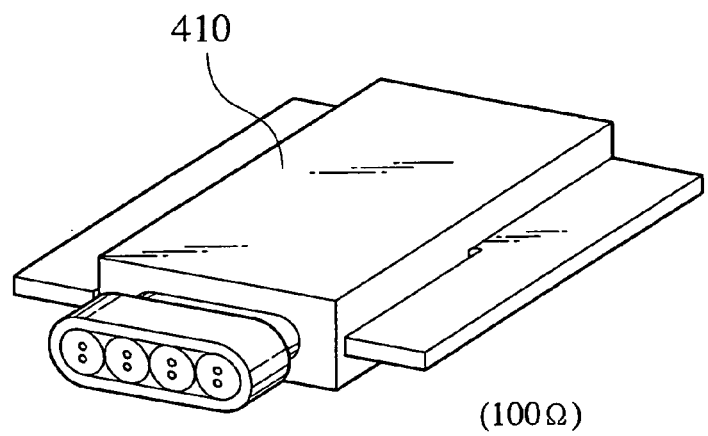
FIG. 51A provides a perspective view of the outside of the LAN cable connector 410 according to the present invention and FIG. 51B shows results of a simulation for S-parameters for the LAN cable connector shown in FIG. 51A.
Figure 51B:
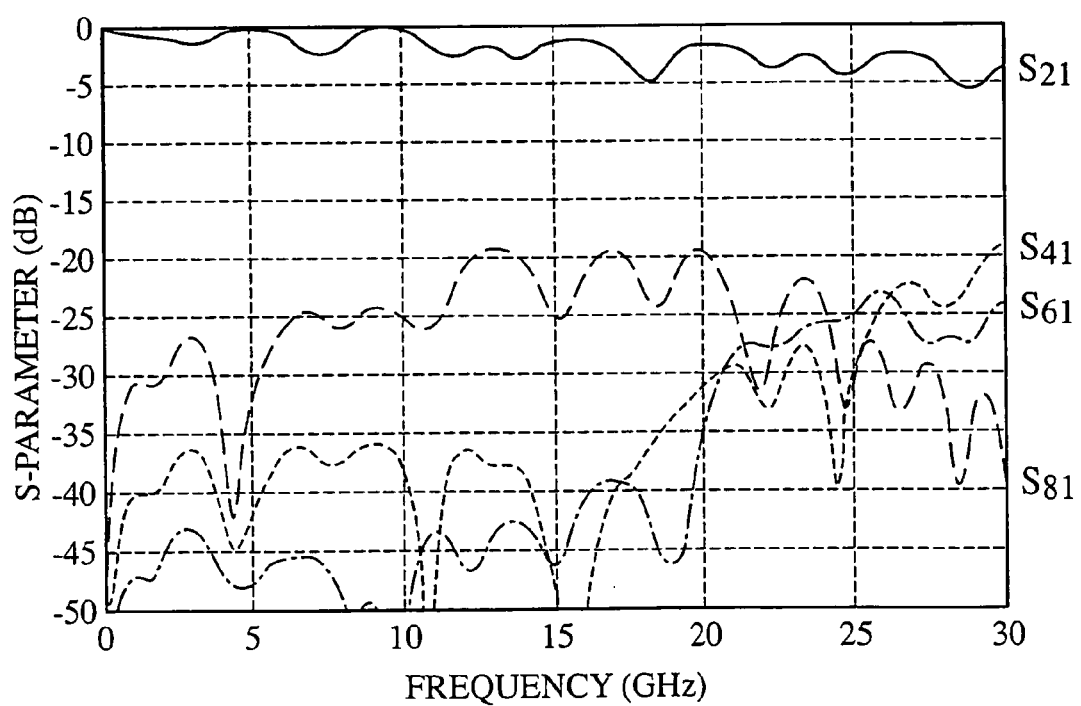
Figure 52A:
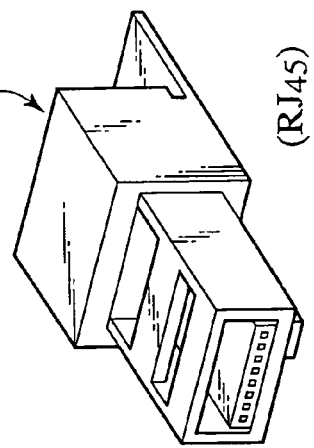
FIG. 52A provides a perspective view of the outside of the RJ 45 that is a conventional LAN cable connector 450.
Figure 52B:
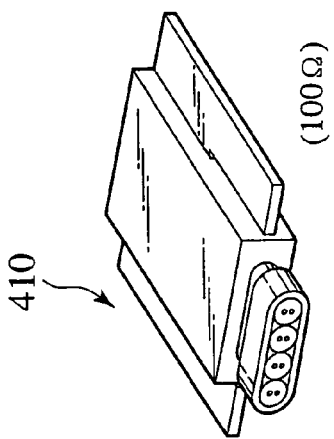
FIG. 52B shows a perspective view of the outside of LAN cable connector 410 according to the present invention.
Figure 52C:
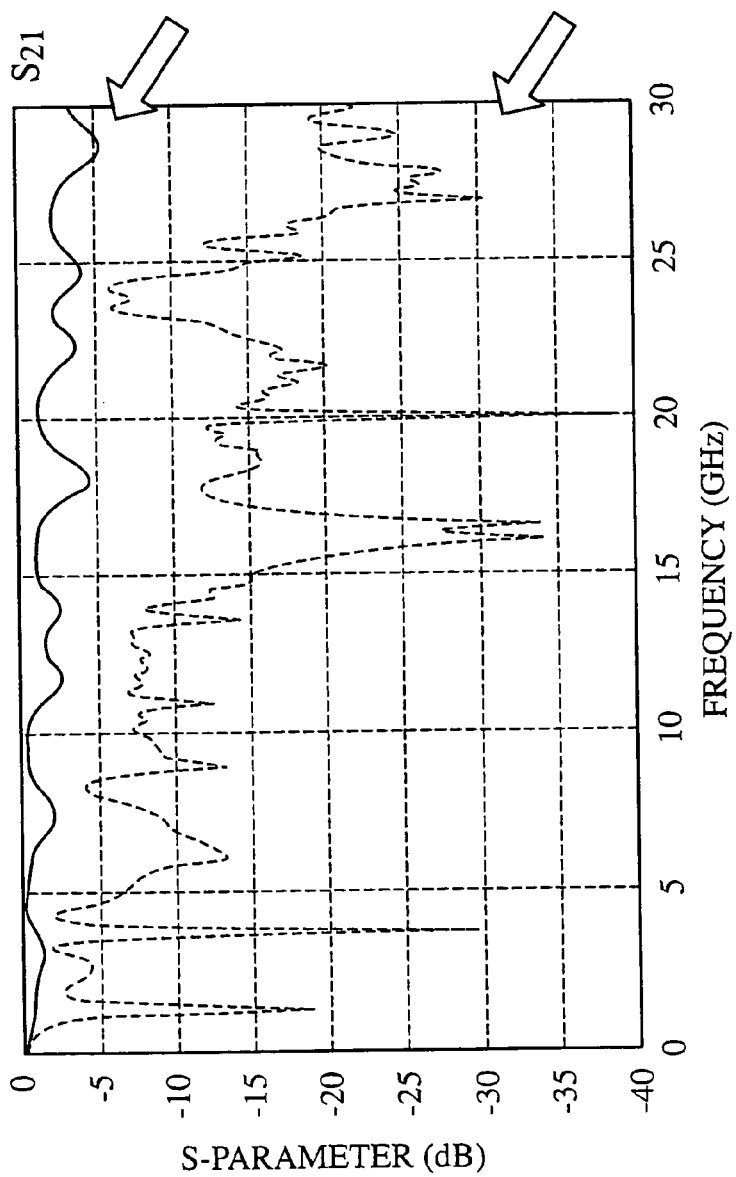
FIG. 52C shows results of a simulation for the S-parameters for the conventional LAN cable connector 450 and the LAN cable connector 410 according to the present invention.

FIG. 50A provides a perspective view of the outside of RJ 45 that is a conventional LAN cable connector 450. FIG. 50B shows one line running from a cable inside LAN cable connector 450 to the mounting board. FIG. 50C shows the results of a simulation of the S-parameters for the LAN cable connector 450. FIG. 51A provides a perspective view of the outside of the LAN cable connector 410 according to the present invention. FIG. 51B shows results of a simulation for S-parameters for the LAN cable connector shown in FIG. 51A. FIG. 52A provides a perspective view of the outside of RJ 45 that is a conventional LAN cable connector 450. FIG. 50B shows a perspective view of the outside of LAN cable connector 410 according to the present invention and FIG. 52C shows results of a simulation for the S parameters of the conventional LAN cable connector 450 and the LAN cable connector 410 according to the present invention.

In the LAN cable connector 450 one line extending from the cable to the mounting board has a bending folded shape in its passage through several stages, such that, as shown in FIG. 50C, it is evident that at the points for 1 MHz, 4 MHz, 16 MHz and 20 MHz for example, the S-parameters (for example $S_{21}$) rapidly decrease and cross talk worsens.

On the other hand, in the case of the LAN cable connector 410 according to the present invention, as the pair line extending from the cable to the mounting board is largely straight as described above, in the range from 0 MHz to 30 MHz, S-parameters (for example $S_{21}$) decrease a maximum of 5 dB such that favorable cross talk conditions exist, as shown in FIG. 51B.

In this way, a first pair line of the plug is connected overlaid in a longitudinal direction with respect to the cable, in a jack, the first pair line of the plug and a first fitting part are connected to a second pair line, being overlaid in a longitudinal direction with respect thereto, a third pair line of the mounting board engages a second fitting part of the jack while also being connected to the second pair line of the jack, overlaid in a longitudinal direction with respect thereto, thereby enabling conformance of intrinsic impedance such that transmission of TEM waves can occur without attenuation occurring, and transmission of a signal having GHz frequency band can be performed.

As described, according to the present invention, cross talk occurs minimally and high frequency wave components can be made to transmit via a directionality coupler or a capacitance coupler, thereby enabling wave reflection to be minimized such that transmission loss becomes only energy loss arising due to the dielectric loss tangent tan δ of the surrounding insulation material of a cable of medium length and energy loss due to direct current resistance, thereby enabling realization of an ideal inter functional circuit block transmission system having minimal transmission loss.

A variety of elements are incorporated into the configuration of the present invention however, if even a single of the above described elements is lacking, transmission of a signal having tens of GHz frequency band cannot occur, therefore, the inter functional circuit block transmission system according to the present invention must adhere to this comprehensive, integrated design.

Further, in the above descriptions a plurality of transmission cables are installed, however, a single cable can also be used or a bus configuration comprising a plurality of cables, for example 64 or 128, disposed in parallel is also suitable. Moreover, as the dielectric loss tangent tan δ of the insulating material is approximately 0.0001, commonly known foam material can be employed for this insulation (an insulating material including foam).

It is clearly evident from the above description that according to the present invention a driver circuit and a receiver circuit are connected using a differential signal transmission pair cable, transmission of differential signals having GHz frequency band is performed as the characteristic impedance of the driver circuit and the receiver circuit is in conformity, ground and a first power supply connected to the driver circuit by a power supply ground transmission pair cable are connected to a ground and second power supply connected to the receiver circuit, the respective levels of characteristic impedance thereof matching, such that with characterisitic impedance of the differential signal transmission pair cable and power supply ground transmission pair cable matching, differential signals having GHz frequency band can be transmitted while maintaining transmission mode of TEM wave.

Further, according to the present invention a driver circuit and receiver circuit are connected using a differential signal transmission pair cable such that differential signals having GHz frequency band can be transmitted, moreover a directionality coupler is provided wherein two pair of parallel electrodes each comprising a long shaped flat plate are disposed over the differential signal transmission pair cable, a differential signal is input to both electrodes at one end of the first parallel electrodes, the differential signal transmission pair cable is connected to both electrodes at one end of the second parallel electrodes, thus bringing the first parallel electrodes and the second parallel electrodes into mutual proximity for transmitting the differential signal, such that the differential signal can be transmitted while direct current is blocked and multiple reflection is prevented.

Moreover, according to the present invention a driver circuit and receiver circuit are connected using a differential signal transmission pair cable such that differential signals having GHz frequency band can be transmitted, moreover a capacitance coupler is provided wherein two pair of parallel electrodes each comprising a long shaped flat plate are disposed over the differential signal transmission pair cable, a pair of differential signals are input into the respective ends of one of the parallel electrodes of the first and second parallel electrodes and the differential signal transmission pair cable is connected to the other ends of the other electrodes of the first and second parallel electrodes, thus, bringing the first parallel electrodes and the second parallel electrodes into mutual proximity for transmitting the differential signal, such that the differential signal can be transmitted while direct current is blocked and multiple reflection is prevented.

Further, as the first and second stacked pair cables related to the present invention comprise transmission cables accommodated in an insulating layer vertically in relation to a better ground layer, apart from the electrode parts of the transistor, all wiring can be considered transmission cable, such that a pulse signal having a frequency of tens of GHz can be transmitted.

Moreover, the connector according to the present invention, connects the first pair line of the plug to the pair of wires forming the differential signal transmission pair cable overlapping those wires in a longitudinal direction with respect to the cable, connects the first pair line of the plug and the first fitting part of the jack to the second pair line, overlapping that second pair line in a longitudinal direction, and causes the third pair line of the mounting board to engage the second fitting part of the jack while also being connected to the second pair line of the jack, overlaid in a longitudinal direction with respect thereto, thereby enabling conformance of characteristic impedance with the differential signal transmission pair cable such that differential signals having GHz frequency band can be transmitted while maintaining transmission mode of TEM wave.

What is claimed is:

1. A differential signal transmission cable structure for transmitting differential signals having a GHz frequency band, comprising:
   a differential signal transmission pair cable connecting a driver circuit and a receiver circuit that transmits the differential signals having a GHz frequency band while matching characteristic impedances of the driver circuit and the receiver circuit; and
   a power supply ground transmission pair cable connecting a first power supply and ground connected to the driver circuit and a second power supply and ground connected to the receiver circuit that matches characteristic impedances of the first power supply and ground and the second power supply and ground;
   wherein, as matching characteristic impedances of the power supply ground transmission cable and the differential signal transmission cable, TEM waves of the differential signals having a GHz frequency band are maintained when the differential signal transmission cable transmits the transmission signals having a GHz frequency band.

2. A differential signal transmission cable structure according to claim 1, further comprising:
a relay circuit having a driver circuit and a receiver circuit for inputting and outputting differential signals having a GHz frequency band, disposed on the differential signal transmission pair cable,
wherein the relay circuit, disposed on the power supply ground transmission pair cable, inputs and outputs components of variation from power supply and ground arising due to fluctuations of the differential signals having a GHz frequency band.

3. A differential signal transmission cable structure according to claim 1, wherein the differential signal transmission pair cable comprises:
a pair of wires that have core wires of conducting material that are covered with a first insulating material; and
a covering that covers the pair of wires comprising a second insulating material having a relative permittivity of 1 to 1.3 times greater than the relative permittivity of the first insulating material.

4. A differential signal transmission cable structure according to claim 3, wherein the differential signal transmission pair cable comprises four pair cables, and the four pair cables are arranged flatly such that each of the center lines joining the centers of the pair of wires comprising each pair cable are parallel with respect to each other.

5. A differential signal transmission cable structure according to claim 3, wherein the differential signal transmission pair cable comprises four pair cables, and the four pair cables are arranged such that each two adjoining center lines joining the centers of the pair of wires comprising each pair cable intersect at an angle π/2 (rad).

6. A differential signal transmission cable structure for transmitting differential signals having a GHz frequency band, comprising:
a differential signal transmission pair cable connecting a driver circuit and a receiver circuit; and
a directionality coupler for transmitting differential signals having a GHz frequency band;
wherein said coupler comprises:
first parallel electrodes disposed at an end of the driver circuit;
long shaped flat plates and second parallel electrodes disposed at an end of the differential signal transmission pair cable; and
long shaped flat plates arranged in proximity to the first parallel electrodes.

7. A differential signal transmission cable structure for transmitting differential signals having a GHz frequency band, comprising:
a differential signal transmission pair cable connecting a driver circuit and a receiver circuit, and
a capacitance coupler for transmitting differential signals having a GHz frequency band;
wherein said coupler comprises:
first parallel electrodes disposed at an end of the driver circuit;
long shaped flat plates and second parallel electrodes disposed at an end of the differential signal transmission pair cable; and
long shaped flat plates arranged in proximity to the first parallel electrodes.

8. A differential signal transmission cable structure according to claim 6, wherein, when differential signals output from said driver circuit are input respectively into one end of a resistance $R_F$ and a condenser $C_F$ that are connected in parallel, the other end of the resistance $R_F$ and the condenser $C_F$ are input to a twisted pair cable, the other ends of the twisted pair cable are connected to a terminating resistance $R_T$ and both ends of the terminating resistance $R_T$ are connected to receiver terminals of a receiver circuit; and
total stray capacitance $C_{ST}$ arising in the region surrounding said terminating resistance $R_T$, satisfies $R_T/(R_F+R_T)=\alpha C_F/(C_{ST}+C_F)$, where $\alpha=0.7$ to 1.3.

9. A differential signal transmission cable structure according to claim 7, wherein, when differential signals output from said driver circuit are input respectively into one end of a resistance $R_F$ and a condenser $C_F$ that are connected in parallel, the other end of the resistance $R_F$ and the condenser $C_F$ are input to a twisted pair cable, the other ends of the twisted pair cable are connected to a terminating resistance $R_T$ and both ends of the terminating resistance $R_T$ are connected to receiver terminals of a receiver circuit; and
total stray capacitance $C_{ST}$ arising in the region surrounding said terminating resistance $R_T$, satisfies $R_T/(R_F+R_T)=\alpha C_F/(C_{ST}+C_F)$, where $\alpha=0.7$ to 1.3.

10. A differential signal transmission cable structure according to claim 6, wherein the directionality coupler has a quartz layer accommodating the first parallel electrodes and an air layer accommodating the second parallel electrodes.

11. A differential signal transmission cable structure according to claim 6, wherein the directionality coupler has a first insulating layer of quartz accommodating the first parallel electrodes and a second insulating layer of aluminum accommodating the second parallel electrodes.

12. A differential signal transmission cable structure according to claim 7, wherein the capacitance coupler is comprised of chip capacitors.

13. A differential signal transmission cable structure according to claim 1, wherein the differential signal transmission pair cable is a pair coplanar cable comprising two pair cables having two wires arranged parallel with a first interval, the two pair cables being arranged such that these four wires follow above the same straight line and the center two wires among the four wires are arranged with a second interval.

14. A differential signal transmission cable structure according to claim 1, wherein the differential signal transmission pair cable is a stacked pair cable comprising two pair cables having two wires arranged parallel with a first interval, the two pair cables being arranged such that the center lines joining the centers of the two wires forming each the pair cable are parallel with respect to each other, and the two pair cables are arranged with a second interval.

15. A differential signal transmission cable structure according to claim 1, wherein the differential signal transmission pair cable is a guard coplanar cable comprising two cables having a single wire and two other wires arranged parallel such that said single wire is disposed therebetween, said two other wires being connected in common, the two cables being arranged such that said six wires follow along the same straight line, the two center wires among said six wires being arranged with a prescribed interval.

16. A differential signal transmission cable structure according to claim 1, wherein the differential signal transmission pair cable is a guard stacked pair cable comprising two cables having a single wire and two other wires arranged parallel such that the single wire is disposed therebetween, said two cables being arranged such that the center lines joining the centers of the wires forming the cables are parallel with respect to each other, the pair cables being arranged with a prescribed interval.

17. A differential signal transmission cable structure for transmitting differential signals having GHz frequency band, comprising:
- a first stacked pair cable connected to a pair of gate terminals of a pair of transistor elements comprising a differential circuit,
- a coplanar cable connected to a pair of drain terminals of the pair of transistor elements, for inputting power supplied via resistance, and
- a second stacked pair cable connected to the pair of drain terminals of said pair of transistor elements, for outputting external differential signals.

18. A differential signal transmission cable structure according to claim 17, wherein the first stacked pair cable or the second pair cable comprises a transmission cable disposed within insulating layers vertically for a flat ground layer.

19. A differential signal transmission cable structure comprising:
- a differential signal transmission pair cable connecting a driver circuit and a receiver circuit; and
- a power supply ground transmission pair cable connecting a first power supply and ground connected to the driver circuit and a second power supply and ground connected to the receiver circuit that matches characteristic impedances of the first power supply and ground and the second power supply and ground;
- wherein TEM waves of the differential signals having a GHz frequency band are maintained when the differential signal transmission cable transmits the transmission signals having a GHz frequency band.

20. A differential signal transmission cable structure comprising:
- a differential signal transmission pair cable connecting a driver circuit and a receiver circuit; and
- a directionality coupler for transmitting differential signals having a GHz frequency band;
- wherein said coupler further comprises:
  - first parallel electrodes disposed at an end of the driver circuit;
  - long shaped flat plates and second parallel electrodes disposed at an end of the differential signal transmission pair cable; and
  - long shaped flat plates arranged in proximity to the first parallel electrodes.

* * * * *